United States Patent
Wright et al.

(10) Patent No.: US 6,215,709 B1
(45) Date of Patent: Apr. 10, 2001

(54) SYNCHRONOUS DYNAMIC RANDOM ACCESS MEMORY DEVICE

(75) Inventors: Jeffrey P. Wright, Boise, ID (US); Hua Zheng, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/572,710

(22) Filed: May 16, 2000

Related U.S. Application Data

(62) Division of application No. 09/066,035, filed on Apr. 24, 1998.
(60) Provisional application No. 60/045,102, filed on Apr. 25, 1997.

(51) Int. Cl.[7] .................................................. G11C 7/00
(52) U.S. Cl. ............... 365/189.11; 365/194; 365/189.09; 365/226
(58) Field of Search ............................. 365/189.11, 194, 365/189.09, 226

(56) References Cited

U.S. PATENT DOCUMENTS

| | | | |
|---|---|---|---|
| 4,369,511 | 1/1983 | Kimura et al. | 371/21 |
| 4,389,715 | 6/1983 | Eaton, Jr. et al. | 365/200 |

(List continued on next page.)

FOREIGN PATENT DOCUMENTS

| | | |
|---|---|---|
| 0 577 106 A2 | 1/1994 | (EP) . |
| 0 578 876 A1 | 1/1994 | (EP) . |

OTHER PUBLICATIONS

"FPM DRAMs," *Dram Data Book*, Chapter 2, Micron Technology, Inc., pp. 2–1 to 2–14, 1995.

"EDO DRAM" *Dram Data Book 1996*, Chapter 2, Micron Technology, Inc., pp. 2–1 to 2–16, 1995.

"SGRAMS" *Dram Data Book 1996*, Chapter 4, Micron Technology, Inc., pp.4–1 to 4–42, 1995.

*Primary Examiner*—Son T. Dinh
(74) *Attorney, Agent, or Firm*—Dorsey & Whitney LLP

(57) ABSTRACT

A synchronous semiconductor memory device has improved layout and circuitry so as to provide rapid operation. Data paths between sub-arrays and memory cells and corresponding DQ pads are equalized to provide approximately equal line delays, transmission losses, etc. Input clock circuitry converts a "asynchronous" external clock signal and external clock enable signal to an internal "synchronous" clock signal. Input command signals are not stored in input registers, but instead are latched so as to provide such input signals rapidly downstream. Multiple redundant compare circuitry is provided to improve delays inherent in selecting between external or internal addresses. Input/output pull up circuitry is enabled during both read and write operations, but shortened during write operations. Two or more voltage pump circuits are employed that permit sharing of power therebetween to compensate for increased power demands to row lines, data output lines, etc.

11 Claims, 48 Drawing Sheets

U.S. PATENT DOCUMENTS

| | | | |
|---|---|---|---|
| 4,471,472 | 9/1984 | Young | 365/200 |
| 4,573,146 | 2/1986 | Graham et al. | 365/200 |
| 4,601,019 | 7/1986 | Shah et al. | 365/200 |
| 4,734,880 | 3/1988 | Collins | 364/900 |
| 4,748,644 | 5/1988 | Silver et al. | 375/120 |
| 4,837,747 | 6/1989 | Dosaka et al. | 371/10 |
| 4,841,167 | 6/1989 | Saegusa | 307/269 |
| 4,958,345 | 9/1990 | Fujisaki | 371/21.3 |
| 5,075,892 | 12/1991 | Choy | 382/61 |
| 5,086,387 | 2/1992 | Arroyo et al. | 395/556 |
| 5,136,180 | 8/1992 | Caviasca et al. | 327/115 |
| 5,257,229 | 10/1993 | McClure et al. | 365/200 |
| 5,270,974 | 12/1993 | Reddy | 365/200 |
| 5,287,319 | 2/1994 | Fukumoto | 365/222 |
| 5,299,164 | 3/1994 | Takeuchi et al. | 365/201 |
| 5,301,155 | 4/1994 | Wada et al. | 365/201 |
| 5,303,192 | 4/1994 | Baba | 365/200 |
| 5,307,316 | 4/1994 | Takemae | 365/200 |
| 5,319,681 | 6/1994 | Meyer | 375/119 |
| 5,343,439 | 8/1994 | Hoshino | 365/200 |
| 5,353,253 | 10/1994 | Nakajima | 365/200 |
| 5,355,340 | 10/1994 | Coker et al. | 365/200 |
| 5,377,146 | 12/1994 | Reddy et al. | 365/200 |
| 5,381,370 | 1/1995 | Lacey et al. | 365/200 |
| 5,396,124 | 3/1995 | Sawada et al. | 326/13 |
| 5,430,679 | 7/1995 | Hiltebeitel et al. | 365/200 |
| 5,446,693 | 8/1995 | Okamoto | 365/200 |
| 5,457,696 | 10/1995 | Mori | 371/21.3 |
| 5,483,496 | 1/1996 | Murakawa | 365/233 |
| 5,521,879 | 5/1996 | Takasugi | 365/233 |
| 5,528,539 | 6/1996 | Ong et al. | 365/200 |
| 5,537,665 | 7/1996 | Patel et al. | 395/182.03 |
| 5,539,702 | 7/1996 | Ahn | 365/210 |
| 5,600,606 | 2/1997 | Rao | 365/233 |
| 5,648,934 | 7/1997 | O'Toole | 365/200 |
| 5,687,387 | 11/1997 | Endejan et al. | 395/822 |
| 5,701,441 | 12/1997 | Trimberger | 395/500 |
| 5,703,813 | 12/1997 | Manning et al. | 365/230.08 |
| 5,828,607 * | 10/1998 | Bushey et al. | 365/189.11 |
| 5,946,265 | 8/1999 | Cowles | 365/230.08 |
| 5,959,901 * | 9/1999 | Kawahara | 365/189.11 |
| 5,970,001 | 10/1999 | Noda et al. | 365/200 |
| 5,970,020 | 10/1999 | Ong | 365/230.08 |
| 6,128,231 * | 10/2000 | Chung | 365/226 |

* cited by examiner

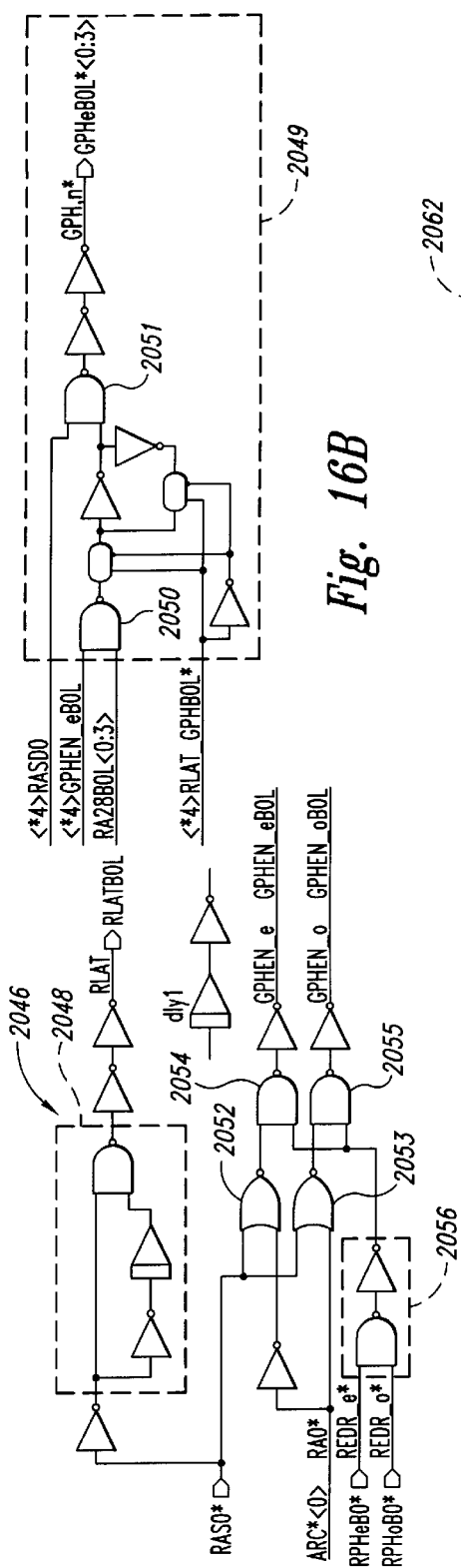
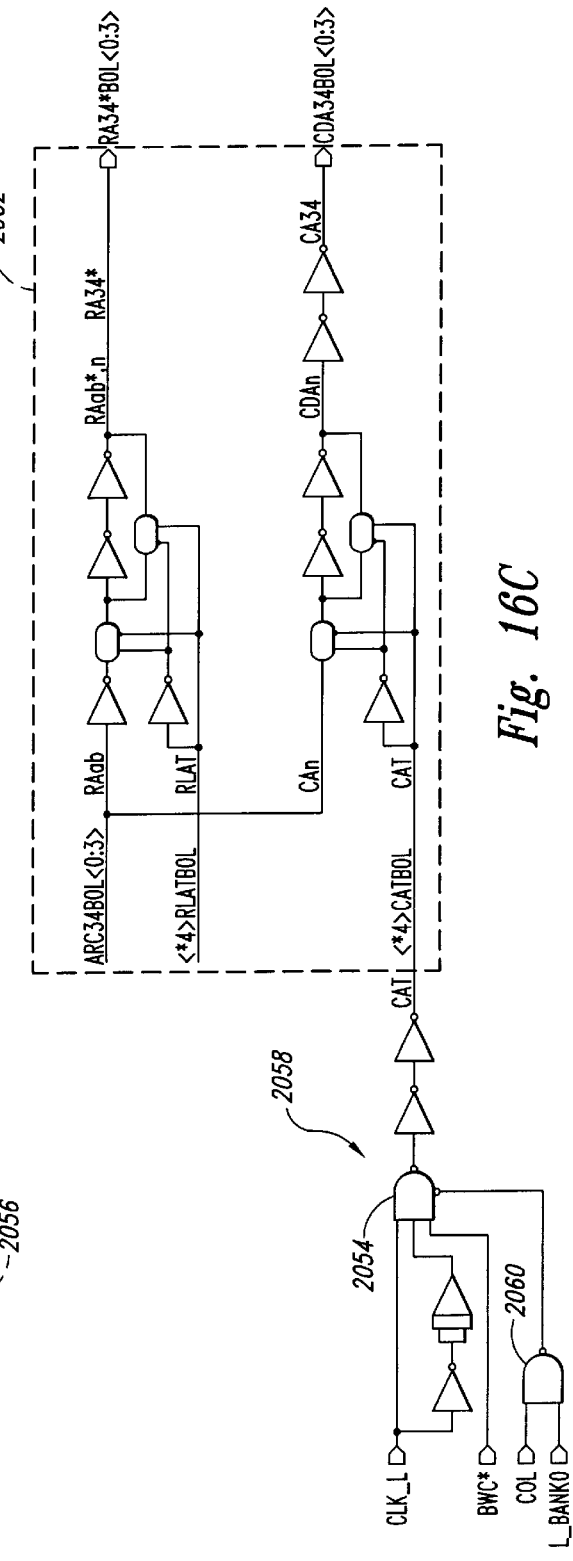
Fig. 16B
Fig. 16C

SYNCHRONOUS DYNAMIC RANDOM ACCESS MEMORY DEVICE

CROSS-REFERENCE TO RELATED APPLICATION

This application claims the benefit of U.S. Provisional Application Ser. No. 60/045,102, filed Apr. 25, 1997.

This application is a divisional of pending U.S. patent application Ser. No. 09/066,035, filed Apr. 24, 1998.

TECHNICAL FIELD

This invention relates generally to synchronously operated memory devices.

BACKGROUND OF THE INVENTION

Computer designers are always searching for faster memory devices that will allow them to design faster computers. A significant limitation on a computer's operating speed is the time required to transfer data between a processor and a memory circuit under a read or write data transfer. Memory circuits, such as dynamic random access memories ("DRAMs"), usually include a large number of memory cells arranged in one or more arrays, each having rows and columns. The memory cells provide locations at which the processor can store and retrieve data. The more quickly the processor can access the delta within the memory cells, the more quickly it can perform a calculation or execute a program using the data.

FIG. 1 shows, in part, a typical computer architecture. A central processing unit ("CPU") or processor 50 is connected to a bus system 52, which in turn is connected to a system or memory controller 54. The processor 50 can also be connected, through the bus system 52, to a datapath integrated circuit ("IC") 56. The memory controller 54 and the datapath IC 56 serve as interface circuitry between the processor 50 and a memory device 60. Although the datapath IC 56 and the memory device 60 are shown as separate integrated datapath IC 56 and the memory device 60 are shown as separate integrated circuits, it will be understood that the circuitry of the datapath IC can be integrated into the memory device. The processor issues a command C and an address A which are received and translated by the memory controller 54, which in turn applies command signals and an address to the memory device 60. Corresponding to the processor-issued commands C and addresses A, data D is transferred between the processor 50 and the memory device 60 via the datapath IC 56.

FIG. 2 illustrates a type of memory device 60 currently used, namely a synchronous dynamic random access memory ("SDRAM"), or its close relative, a synchronous graphics random access memory ("SGRAM") circuit 100. A main difference between the SDRAM and the SGRAM is the division of the memory therein. For example, the SGRAM has a double word width, i.e., it can access 32 bits in parallel for each address. The memory device 200 includes as its central memory element two memory array banks 101A, 101B, which operate under the control of a control logic circuit 102. Each of the memory arrays 101A, B includes a plurality of memory cells (not shown) arranged in rows and columns. For purposes of discussion, the memory device 200 has an 8-bit word width meaning that for each specified memory address (combined bank, row and column address) there is a one-to-one correspondence with 8 memory cells in one of the arrays 101A, B. The processor 50 (see FIG. 1) also preferably operates on data elements of 8 bits each.

A system clock (not shown) provides a clock signal CLK to the control circuit 102 of the memory device 200, as well as to the processor 50 and controller 54 (FIG. 1) accessing the memory device. However, the signal CLK must be precisely registered with other input signals, such as control signals described below, that are applied to the memory device 200 so that those input signals will be available to the memory device when the memory device 200 attempts to operate on those input signals. However, it is sometimes difficult to ensure that the CLK signal is precisely registered to the other input signals, particularly as clock frequencies increase at higher operating speeds. Moreover, the signal CLK may be corrupted by noise or transient signals that can adversely affect the operation of the memory device 200, and, in some cases, the duration of the CLK signal may be too short for the proper operation of the memory device 200. Precise registration of the CLK signal with other signals, as well as noise and other transients, are some of the problems that adversely affect the operation of conventional memory devices 60 and limit their operating speeds.

Command signals input to the control circuit 102 are decoded by command decode circuitry 104. These signals are well known in the art, and include signals such as row address strobe ($\overline{RAS}$), column address strobe ($\overline{CAS}$) and write enable ($\overline{WE}$). (The line or bar over, or an "*" following, the acronym for a signal generally indicates that the active state for the particular signal is a logical low value.)

Distinct combinations of the various command signals constitute distinct commands. For example, the combination of $\overline{RAS}$ low, $\overline{CAS}$ high and $\overline{WE}$ low can represent a PRECHARGE command. Examples of other well known commands include ACTIVE, READ, WRITE and NOP. Responding to the applied command, the control circuit 102 sends control signals on control lines 103A–H to other parts of the memory device 200, controlling the timing and access to the memory cells in arrays 101A, 101B.

In operation, an address is input to an address register 106, indicating the memory location to be accessed. The address specifies one of the memory banks 10A, B and a row and column address within the specified bank. The address register 106 provides the address information to the control circuit 102, and to a row-address multiplexer 107 and a column-address latch and decode circuit 110. The row-address multiplexer 107 multiplexes the row address information and provides it to one row-address latch and decode circuit 108A or 108B corresponding to the one of the memory banks 101 A, B to be accessed, respectively. Each of the row latch and decode circuits 108A, 108B takes a row address provided by the row-address multiplexer 107 and activates a selected row of memory cells (not shown) in the memory array 101A, 101B by selecting one of several row access lines 112A, 112B, all respectively. The column latch and decode circuit 110 takes a column address provided by the address register 106 and selects one of several column access lines 114A, 114B, each of which is coupled to one of the memory arrays 101A, 101B by an I/O interface circuit 116A, 116B, all respectively. Each of the I/O interface circuits 116A, 116B selects the memory cell(s) corresponding to the column location in an activated row. The I/O interface circuits 116 include sense amplifiers which determine and amplify the logic state of the selected memory cells, and I/O gating of data to and from a data I/O register 118. The data register 118 is connected to a data bus which is used to input and output data to and from the memory device 200 over DQ lines.

Data transfer cycles typically involve several steps and each step) takes time. For example, a read access requires the control circuit 102 of the memory device 200 to decode certain commands and a memory address. The control circuit 102 must then provide control signals to the circuitry accessing the memory array banks 101A, 101B in order to activate the selected row in the selected memory bank, allow time for sense amplifiers to develop signals from the selected column in the memory bank, transfer data from these sense amplifiers to the data register 118 where the data is then made available on the data bus, and terminate the cycle by precharging the row for subsequent access. Steps that are particularly time consuming include the activation step and the precharge step which can result in a substantial read latency (the time between registration in the memory device of a read command and the availability of the accessed data on the data bus).

Other steps during data transfer cycles also require significant amounts of time. For example, a memory device having a sequential or "burst" mode for generating serial addresses requires a finite amount of time for initiating the burst mode, and thereafter sequentially generating the subsequent addresses. U.S. Pat. No. 5,452,261 describes a possible solution to this delay by employing a serial or burst address generator that first receives an externally generated start address, and thereafter generates subsequent addresses as clock signals arrive to the generator. The address generator is preset to the second address in the sequence following the start address and simultaneously the start address is connected by an external address enable switch to an output terminal of the address generator, thereby bypassing the address sequencer.

As mentioned above, input command signals input to the memory device 200 are initially buffered in the control circuit 102, and then decoded into internal control signals. The buffering of the input command signals necessarily delays the decoding and ultimate application of the internal command signals to their appropriate circuitry. If two or more input command signals must be decoded and applied to control certain downstream circuits, the circuits must wait until all of the signals have been decoded and received by the downstream circuits before they can be appropriately controlled. While these delays in waiting for receipt of the appropriate signals have been acceptable in prior devices, as the speed of memory devices increases, they will soon be unable to quickly and effectively operate the device with such delays.

U.S. Pat. No. 5,493,530 provides a possible solution to this problem by describing a synchronous memory device with input registers associated with the memory array input lines, where logic gates are associated with the registers. The logic gates are located upstream of the device and the registers. Hence, the logic gates not only provide a needed logic function, but also provide necessary delays to meet the specified hold time delay in synchronous circuits.

The command and address signals supplied to the memory device 200 are initially buffered by being input to registers in the control circuit 102. The registers output high or active signals only after being clocked. If significant downstream circuitry exists following the register, but before the circuitry that is controlled by the active signal, the active signal is delayed by all of the downstream circuitry after the signal is output from the register. Such delays can affect the performance of high speed memory devices.

In most synchronous memory devices such as the memory device 200, signals input to the device have a specified period in which to be read in before the clock transitions, and a period in which to be recognized after the clock transitions, typically known as the set-up and hold times, respectively. At times, a signal applied to the device, such as an address, may not arrive at the address register 106 until just a few nanoseconds before the clock transitions, i.e., before the set-up time. As a result, this address is not recognized and registered by the device and thus is lost. As a result, the set-up and hold times must be increased, or the speed of the clock decreased, to insure that such signals are appropriately registered by the device. Such solutions, however, necessarily decrease the speed of the device, which is obviously undesirable.

Another limitation of conventional SDRAM and SGRAM devices results from their physical layouts. During the design of memory devices such as the memory device 200, one memory array bank is initially designed, and thereafter, the second array bank is simply created as a mirror image of the first array bank. Therefore, the SGRAM device is considerably easier to design since only one array bank needs to be designed. However, arrangements of all memory cells, data I/O paths, row and column decoders, etc. are duplicated, even though some of such circuitry is redundant. This circuitry not only increases the complexity of the SGRAM, but requires additional area on the die. As circuit density of semiconductor memory devices increases, this additional area leads to wasted area that could otherwise be used for additional circuitry.

The memory array banks 101A, 101B of the memory device 200 are typically centrally located on the die. Data or DQ pads, which are coupled to the memory array banks, are then positioned at the periphery of the two array banks, along the two edges that extend perpendicularly to the ends of the rows for each array bank. Multiple I/O lines extend between columns of memory cells and one of the data lines that ultimately are coupled to the appropriate DQ0–DQ31 pad. These multiple I/O lines require additional area on the die, even though, at any given time, only one of the I/O lines is ever coupled to the one data line. Since each sub-array of memory cells requires multiple I/O lines, the cost in die area can be significant.

An additional detriment to the layout of typical memory devices is, the time required to route data from a column to a DQ pad. It takes a finite amount of time for the data to travel to and from the pads on the memory device to the respective columns of memory cells, particularly if the pads are located far from a given memory cell. Moreover, if one DQ pad is located close to its respective sub-array, while another pad is located much further from its corresponding sub-array, the different data paths necessarily lead to different propagation delays. As the speed of memory devices increases, these propagation delays can be significant, possibly leading to errors.

The column address latch and decode circuit 110 of the prior art memory device 200 include a redundant column compare circuit. As is conventional with memory devices such as DRAM's, the memory arrays 101 of the memory device 200 includes extra columns of memory cells (known as redundant columns) that can be used to replace defective columns of memory cells. A redundant column is selected for use when an unsuccessful attempt is made to write data to or read data from a defective column. For this reason, before data can be written to or read from the memory array at a specific address, a comparison must be made between that address and a record of addresses for defective columns. If the column being addressed is found to be defective, then the redundant column is used in place of the addressed column.

The use of redundant columns results in significant improvement in the yield of the semiconductor fabrication processes because it would otherwise be necessary to discard the memory device 200 if any of its columns were defective. Similar improvements in the yield of the semiconductor fabrication processes also result from providing redundant rows to replace defective rows. These redundant rows are selected in basically the same manner that redundant columns are selected, as explained above. Although the use of redundant rows and columns can significantly improve memory device yields, it can also significantly slow the operating speed of memory devices. The primary problem is the need to compare addresses to the addresses of defective rows and columns before a row and column can be addressed. The time it takes to accomplish this comparison correspondingly increases the time required to complete a write or read operation, even if there is no need to use a redundant row or column.

The delay caused by checking column redundancy is exacerbated by the availability of addresses from more than one source. In particular, addresses in some memory devices, such as SGRAMs, can be internally generated. Of course, the addresses can also be generated externally, such as in a controller 54, in a conventional manner. In such cases, it has been necessary to first determine whether a write or a read operation will be to either an internally generated or externally generated address. Once, that determination has been made, the memory device can determine whether the selected address corresponds to a defective row or column, and, if so, select a redundant row or column. Only then can the memory device write to or read from the memory array at the intersection of the selected row and column. These operations can significantly delay the operating speed of memory devices.

Another factor in slowing the operating speed of conventional memory devices stems from performing certain operations in the same manner for both write and read operations, even though more time is required for a read operation. Specifically, during a write or a read operation, prior art memory devices pull-up I/O lines prior to applying data to the I/O lines from either digit lines of the memory array or to a data write driver of the data path circuitry. In these prior art memory devices, the I/O lines are pulled-up for the same duration in a read operation, in which data is transferred to the I/O lines, and transferred a from the digit lines of the array to a write operation, in which data is transferred from the data write driver to the I/O lines. Yet the required pull-up time can be shorter for a write operation, thus wasting time during a write operation and unnecessarily slowing the operation of the memory device.

Yet another factor that slows memory device performance involves the Vccp pump, which provides a voltage greater than the supply voltage Vcc. The Vccp pump provides a high voltage to charge both the row lines and the data output lines. The Vccp pump necessarily requires a certain amount of time to perform both operations. Therefore, the Vccp pump thus cannot charge and boost both the row lines and the data output lines simultaneously.

Overall, it is desirable to decrease the time required to perform data transfer cycles in memory devices, to thereby meet the demand for faster memory devices in the market place. Therefore, it is desirable to reduce the above-described and other delays that occur during data transfer cycles and generally improve the performance of memory devices.

SUMMARY OF THE INVENTION

The present invention improves upon the above problems in memory devices, and provides additional benefits by restructuring portions of a synchronous memory device to permit faster data transfer cycles. The present invention provides a layout on a die for a memory device, preferably an SGRAM device, where the DQ pads are located proximate to their appropriate banks of memory cells. As a result, data lines from the banks to the DQ pads are shortened, thereby reducing line losses, transmission delays, etc. Additionally, the row decoders for the banks of memory cells are centrally located to similarly shorten lines therebetween and permit easier sharing of the decoders.

The input clock circuitry of the inventive memory device converts an "asynchronous" external clock signal and an "asynchronous" external clock enable signal to an internal "synchronous" clock signal for the SGRAM device. Additionally, the input clock circuitry converts the input clock signal to a standard clock signal having at least a minimum duration usable by the SGRAM circuitry despite the presence of noise or transients in the external clock signal or an external clock signal having a duration that is shorter than the minimum duration. Therefore, regardless of the delay of the clock and clock enable signals input to the SGRAM device or the characteristic of the clock signal input to the SGRAM device, a properly shaped signal of sufficient duration and properly registered to other input signals will be available to control the operation of the SGRAM.

Generally, many input command signals are not stored in an input register by the present invention, but instead are latched. As a result, while the output of a register generally becomes "valid" only when its output goes high, a latch is valid whenever it passes signals or is "transparent." In general, delays inherent in registers are eliminated by employing latches, and therefore, command signals are processed in the SGRAM device more quickly than in prior devices.

Certain external signals, such as the external addresses, are latched based on the external clock signal, which can be up to several nanoseconds before the external clock signal is converted to an internal clock signal. As a result, these certain external signals are rapidly latched and recognized by the SGRAM device, and are not lost during short set-up and hold times, even though they may be applied to the device before their expected set-up and hold time.

In order to optimize the yield of manufacturing the inventive memory device, redundant columns of memory cells are provided to replace defective columns. However, unlike prior art memory devices, the use of redundant columns in the inventive memory device does not significantly slow the performance of the memory device, even though it can process either externally generated or internally generated addresses. The inventive memory device preferably employs redundant column compare circuitry. In prior memory devices, the device must first determine whether an address was applied externally (e.g., to the address pins) or generated internally (e.g., from an internal counter). The present SGRAM memory device preferably employs redundant compare circuitry to eliminate the delay caused by determining if the address was applied externally or generated internally. Instead of checking redundancy prior to processing an address or determining if the memory array will be externally or internally addressed, the inventive memory device decodes, latches, and checks to determine if any columns corresponding to both internally generated and externally generated addresses are defective before a determination is even made which address will be used to access the memory array. If columns corresponding to the internal or external address are found to be defective, a redundant column can be selected and available for use by the time a determination is made whether the memory access will be according to either the external or internal address.

In accordance with another aspect of the invention, an I/O pull-up circuit operates in a different manner depending upon whether an access to the memory array is a write or a read operation. The I/O pull-up circuit selectively applies a bias voltage to a plurality of I/O lines that are selectively coupled to either respective sense amps responsive to a global column signal or to a. respective data write driver responsive to an I/O select signal. Prior to accessing the memory array, the memory device determines whether the access will be a read access or a write access. If the access is to be a read access, the I/O pull-up circuit biases at least some of the I/O lines to a bias voltage for a first period of time. If the access is to be a write access, the I/O pull-up circuit biases at least some of the I/O lines to a bias voltage for a second period of time that is shorter than the first period of time. Biasing the I/O lines for a shorter duration during a write operation optimizes the operating speed of the memory device since time is not wasted biasing the I/O lines during a write operation for a period that is longer than necessary.

Data path circuitry in the SGRAM device employs data sense amps (i.e., DC sense amps) that are synchronized based on the internal clock signal. Similarly, data output circuitry for the SGRAM device can also be synchronized with the internal clock signal. As a result, the sensing of data from the banks of memory cells is synchronized with the internal clock signal, while the data is output asynchronously. Alternatively, the SGRAM device allows the data to be sensed asynchronously, while the data is output synchronously.

The SGRAM device preferably employs two voltage pump circuits to provide a voltage value greater than Vcc (i.e., Vccp). One of the voltage pump circuits provides the Vccp signal to the data output lines, while the other voltage pump circuit provides the Vccp signal to the row lines. As is known, voltage pump circuits require significant area on the die. Prior memory devices employed only a single voltage pump circuit to provide the Vccp signal to both the data output lines and the row lines. However, at high speeds, the single voltage pump circuit could be incapable of quickly providing sufficient voltage to the row lines during precharge, while also providing the elevated voltage to the data output lines. Since the present SGRAM device employs two banks of memory cells, the chip is able to provide the Vccp signal to the data output lines, as one bank outputs data, while providing the Vccp signal to the row lines while data is being read from the other bank. Additionally, the two voltage pump circuits are interconnected so that one could perform both functions, or they could swap their assigned functions.

The present invention solves problems inherent in the prior art of high-speed, synchronous memory devices, and provides additional benefits by restructuring the layout and circuitry of, and providing additional circuitry and benefits to, previous memory devices. As a result, the present invention is capable of operating at speeds previously unattainable by similar memory devices. Other features and advantages of the present invention will become apparent from studying the following description of the presently preferred embodiment, together with the following drawings.

BRIEF DESCRIPTION OF THE DRAWINGS

FIG. 16B is a schematic diagram of global phase enable circuitry for the memory device of FIG. 3.

FIG. 16C is a schematic diagram of column address trap and predecoder latch circuitry for the memory device of FIG. 3.

DETAILED DESCRIPTION OF THE INVENTION

Figure 3:
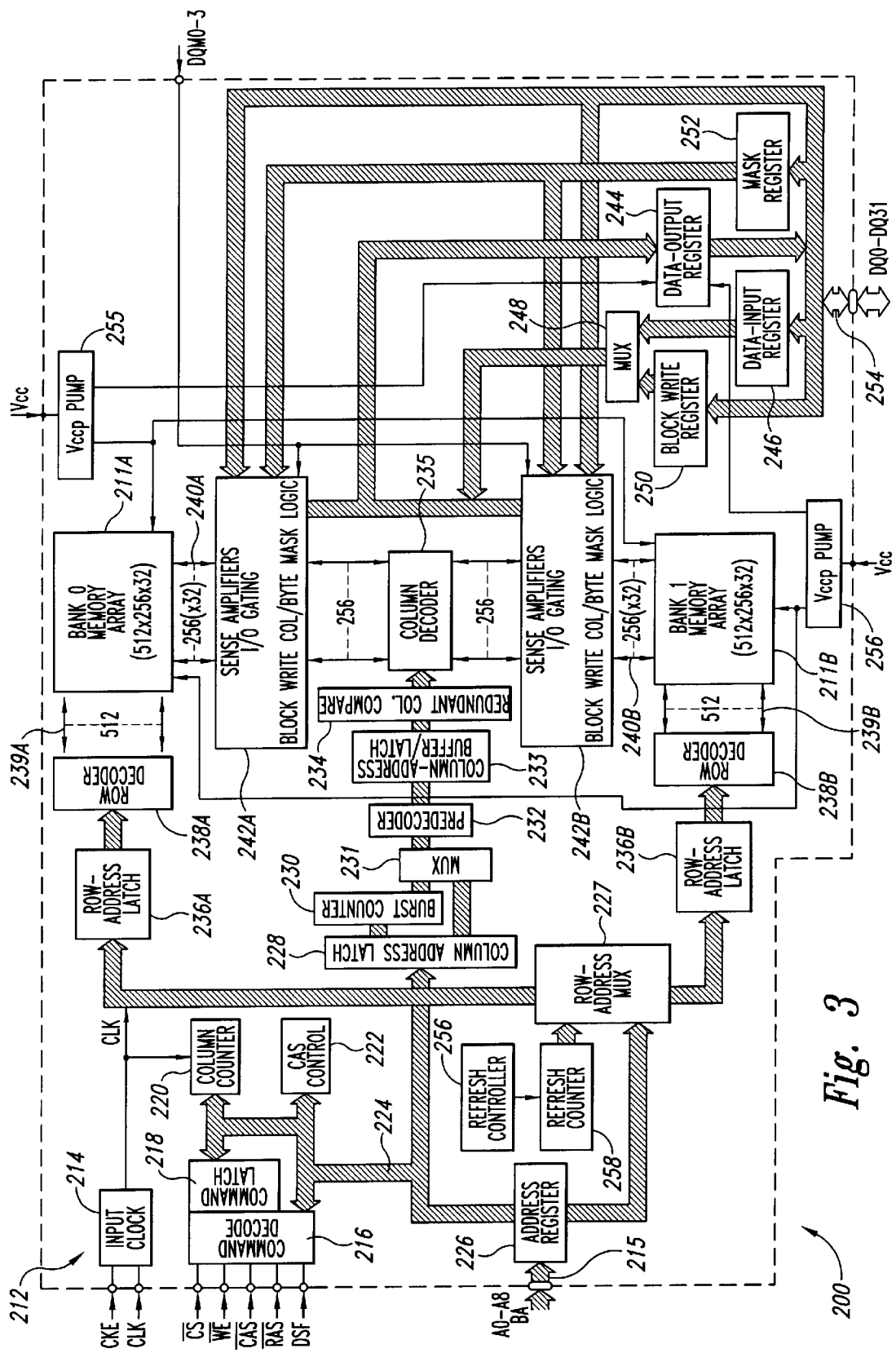
FIG. 3 is a block diagram of a memory device according to the present invention.

Referring to FIG. 3, an exemplary SGRAM memory device 200 of the present invention includes as its central memory two memory array banks 211A, B. As noted above, each of the memory arrays 211A, B includes a plurality of conventional memory locations (not shown) arranged in rows and columns. In one embodiment of the invention, each of the arrays 211 includes 512 rows and 256 columns. A location in the memory array 211 is selected by a row address and a column address. Each location in memory includes a plurality of memory cells, each of which stores a bit of data. In the embodiment described herein, each memory location includes 32 memory cells. Thus, each location in the memory arrays stores 32 bits of data. However, it will be understood that arrays 211 containing different numbers of rows and column, and arrays storing different numbers of bits of data at each memory location, may also be used. A control logic circuit 212 controls the data transfer steps associated with a read or write access to the memory cells in the array banks 211A, 211B.

The control circuit 212 includes an input clock circuit 214, command decode circuitry 216, command latch circuitry 218, column counter circuitry 220 and CAS control circuitry 222. A system clock (not shown) provides an input clock signal CLK to a first input of the input clock 214, while a clock enable signal CKE is provided to a second input. As explained more fully below, in response thereto, the input clock 214 produces an internal clock signal CLK for the memory device 200.

Command signals are provided to the control circuit 212, decoded by the command decoder 216, and latched by the command latch 218. As is known, the signals provided to the command decoder include signals such as $\overline{CS}$ (chip select), $\overline{WE}$ (write enable), $\overline{RAS}$ (row address strobe) and CAS (column address strobe). Distinct combinations of these signals are provided by the processor, and they are registered and decoded as commands by the memory device 200. However, it is convenient to simply refer to the decoded commands (e.g., READ, WRITE, etc.) as being issued by the processor.

The column counter 220, as explained below, allows for burst and other high-speed data access cycles in the preferred embodiment of the present invention. The CAS controller 222, as similarly explained below, controls the access to one or more selected columns in the memory banks 211A, 211B. The column counter 220 and CAS controller 222 are intercoupled to the command decoder 216 and command latch 218 along a plurality of lines or "bus" 224.

The control circuit 212 sends control signals on control lines (not shown in FIG. 3) to other parts of the memory device 200, corresponding to the processor-issued command. These control signals control the timing and access to the memory cells in banks 211A, 211B. The memory device 200 is also provided with an address of the memory location to be accessed on a 10-bit wide-address bus 215, including a bank address specified by address bit BA and a row and column address specified by address bits A0–A8. The address is input to an address register 226 which provides the address information to the control circuit 212, a row-address multiplexer 227, and a column-address latch circuit 228. A latched column address is then supplied to both a burst counter circuit 230 and a 2:1 multiplexer 231. The second input to the multiplexer 231 i's coupled to the column address latch 228. A multiplexed column address is then supplied sequentially to a predecoder circuit 232, a column address buffer/latch circuit 233, a redundant column compare circuit 234, and a column decoder 235.

In response to one or more control signals provided by the control circuit 212, the row-address multiplexer 227 multiplexes row address information and provides it to one of two row-address latch circuits 236A, 236B. Latched row addresses are then provided from the row-address latch circuits 236A, 236B to row decode circuits 238A, 238B, which in turn are coupled to and access the memory banks 211A, 211B. In response to one or more control signals provided by the control circuit 212, each of the row decode circuits 238A, 238B takes a row address provided by the row-address multiplexer 227 and activates a selected row of memory cells (not shown) in the memory array 211A, 211B by selecting one of several row access lines 239A, 239B, respectively. In response to one or more control signals provided by the control circuit 212, the column decode circuit 235 takes a column address provided by either the address register 226 or. the burst counter 230 and selects one of several column access lines 240A, 240B, each of which is coupled to one of the memory banks 211A, 2111B by one of two I/O interface circuits 242A, 242B, all respectively. In response to one or more control signals provided by the control circuit 212, each of the I/O interface circuits 242A, 242B selects the 32 memory cells corresponding to the column location in an activated row.

The I/O interface circuits 242A, 242B include conventional N- and P-sense amplifiers which determine and amplify the logic state of the selected memory cells. The I/O interface circuits 242A, 242B also include logic for certain read/write commands such as block write and bit masking. The I/O interface circuits 242A, 242B furthermore include I/O circuits that gate data to a data output register 244 and from a data input register 246 and multiplexer 248, responsive to one or more control signals provided by the control circuit 212. For block writing of multiple bits to a plurality of columns, a block write register 250 provides data through the multiplexer 248 to the I/O interface circuits 242A, 242B. To write bits to one or more individually selected columns, a mask register 252 provides an appropriate bit mask to the I/O interface circuits 242A, 242B. The mask register 252, block write register 250, and data input and output registers 246, 244 are connected to a 32-bit wide data bus 254, which transfers output data Q0–Q31 to a processor and input data D0–D31 from, a processor over DQ lines DQ0–DQ31, all responsive to one or more control signals provided by the control circuit 212.

The memory device 200 includes a refresh control circuit 256 and refresh counter 258 which, responsive to one or more control signals provided by the control circuit 212, initiate regular and periodic activation of each of the rows of the memory cells in the arrays 211A, 211B for purposes of data refresh, as is well known in the art. In response to one or more control signals provided by the control circuit 212, a respective one of the I/O interface circuits 242A, 242B senses data stored in the memory cells of the refresh-activated row and rewrites values corresponding to the stored data in each of the memory cells.

First and second voltage boosting or pump circuits 256, 258 are coupled to and receive a positive voltage supply Vcc, and pump up this voltage to a higher voltage Vccp. Each of the voltage pump circuits 256, 258 is coupled to, and can provide the elevated voltage Vccp to, the row lines in the memory banks 211A, 211B, and the data output lines in the data output register 244. One of the voltage pump circuits 256 or 258 selectively coupled to or "assigned" to providing the elevated voltage Vccp to the row lines in the memory banks 211A, 211B, while the other voltage pump circuit provides the elevated voltage to the data output lines in the data output register 244. As explained below, the first and second voltage pump circuits 256, 258 are interconnected so that either one could perform both functions, or they can swap their assigned functions.

While not shown, the memory device 200 also includes additional circuitry of conventional construction. For example, the memory device 200 includes a DVC2 generator that generates a voltage signal DVC2 that is approximately one-half of Vcc. Therefore, if Vcc is 3 volts, DVC2 is 1.5 volts. The DVC2 signal is applied, for example, to the common cell plate for the storage capacitors in the arrays 211A, 211B. The memory device 200 includes a Vbb generator that generates a negative voltage signal Vbb, below ground, for the device. The Vbb that is applied, for example, to N-channel transistors, which are coupled to ground, to ensure they remain off. The memory device 200 includes test mode circuitry for allowing the device to be tested both in its packaged form, and at a probe level when in die form. The memory device 200 can include a conventional power up device for initially powering up the device for operation.

SGRAM Device Layout

Figure 4A:
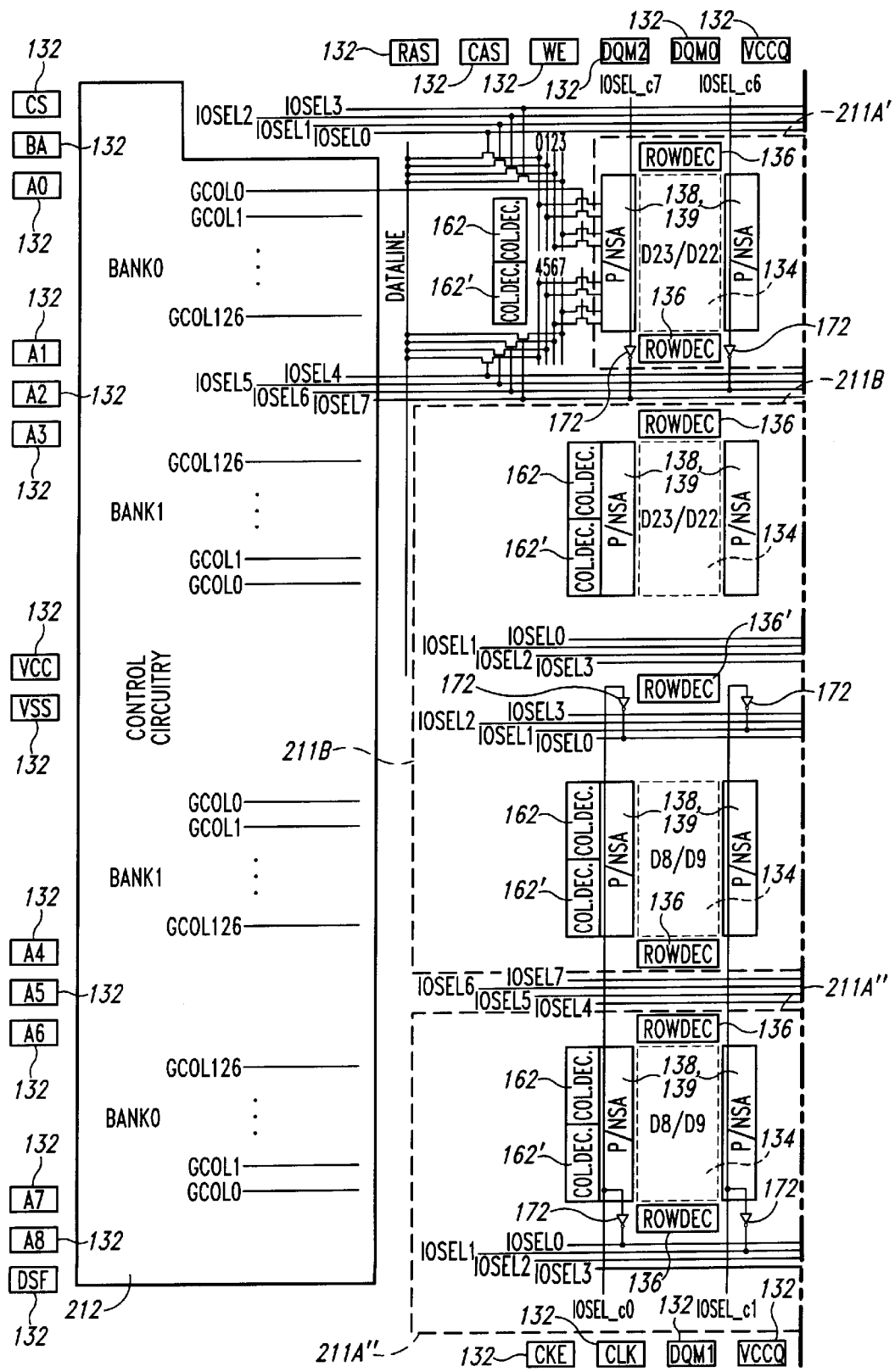
FIGS. 4A, 4B and 4C together form a schematic diagram of a preferred layout on a die for the memory device of FIG. 3.
Figure 4B:
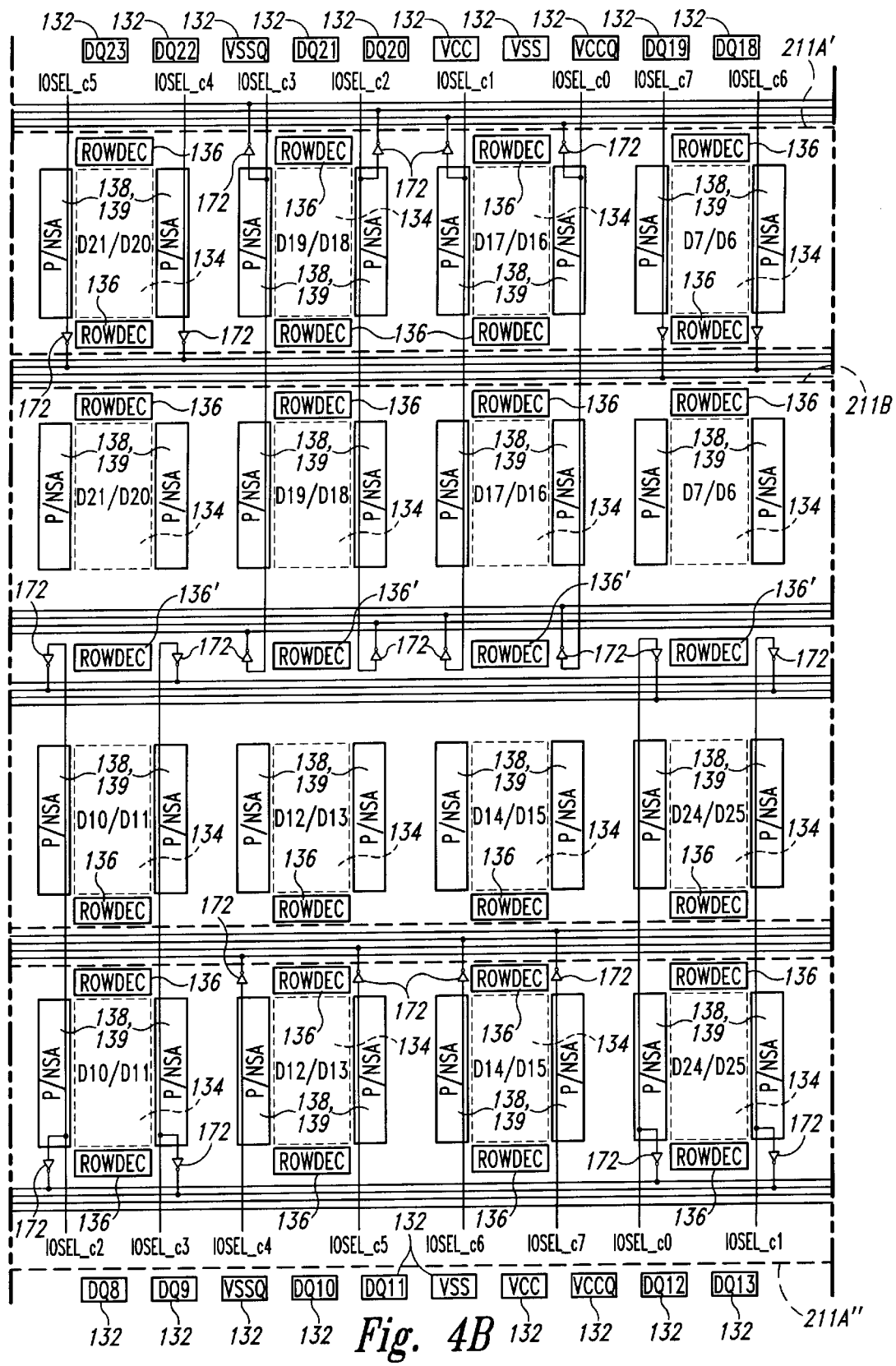
Figure 4C:
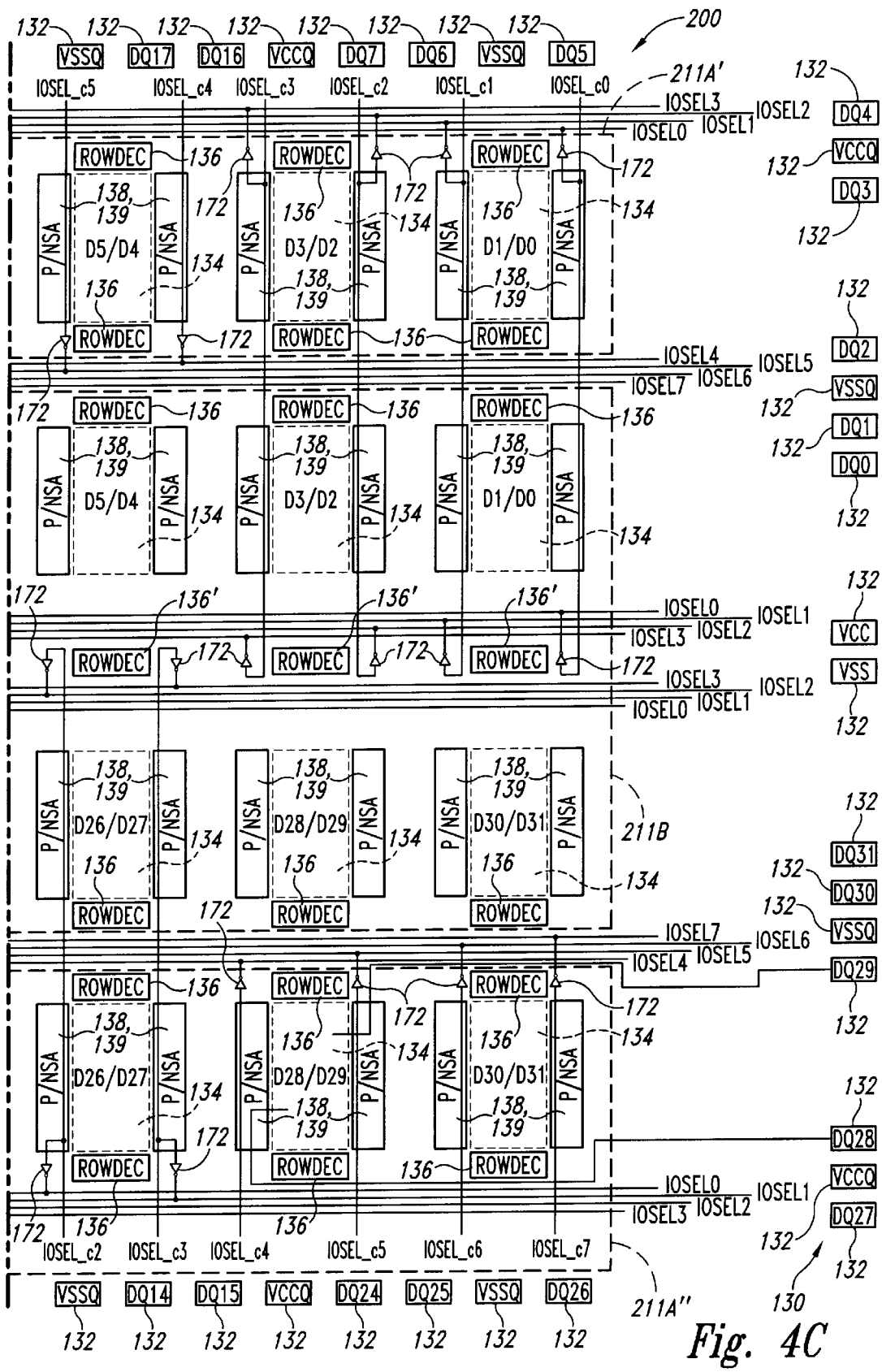

Referring to FIGS. 4A, 4B and 4C (collectively, FIG. 4), an exemplary layout of the memory device 200 is shown on a semiconductor,, substrate or die 130. The memory cell array banks 211A, 211B are preferably laid out on the die 126, where the array bank 211A is split into two left and right sections 211A', 211A" positioned on opposite sides of the array bank 211B. Each array bank 211A, 211B includes 16 sub-arrays of memory cells 134, each sub-array corresponding to two data or DQ paths and thus two DQ pads 132'. Therefore, each array bank 211A, 211B supplies data to each of the 32 DQ pads 132 along the 32 DQ paths DQ0–DQ31. Each pad 132 and sub-array 134 is identified in FIG. 4 by its corresponding DQ assignment DQ0–DQ31 and D0–D31, respectively.

The DQ pads 132 are located proximate to their appropriate sub-arrays of memory cells 134. For example the DQ pads DQ28 and DQ29 are positioned proximate to the sub-array D28/D29 so that data paths 135 from both of the array banks 211A, 211B are relatively short. Indeed, the combined array banks 211A, 211B can be considered one memory array divided vertically through the middle of FIGS. 4A,B,C to provide left and right halves. The left array section 211A' and the left portion of the array bank 211B both include the sub-arrays corresponding to DQ paths DQ0–DQ7 and DQ16–DQ23, while the closest DQ pads 132 are the corresponding DQ pads DQ0–DQ7 and DQ6–DQ23. The right array bank half 211A" and the right portion of the array bank 211B correspond to DQ paths DQ8–DQ15 and DQ24–DQ31 and their corresponding DQ pads are similarly positioned proximate thereto. Consequently, the left half of the memory device 200 essentially corresponds to one-half of the 32 total DQ paths, while the right half corresponds to the other half. The data or DQ paths 135 are shown only schematically in FIG. 4B, but are shown in greater detail with respect to FIGS. 4D and 4E (described below).

The die 130 can be square and the various components in FIG. 4 are not shown to scale, but instead, portions are enlarged or reduced for purposes of clarity. Therefore, while not particularly evident from FIG. 4, the data or DQ paths 135 from the sub-arrays 134 to the corresponding DQ pads 132 are preferably approximately equal. The DQ paths are of approximately equal length because the memory device 200 is laid out with the array bank 211A split into left and right halves 211A', 211A", while the second array bank 211B is centrally positioned. Prior art devices typically positioned one array bank close to half of the DQ pads, while distant from the other half of the DQ pads, and vise versa for the other array bank. As a result of such equal length DQ paths, each DQ path has approximately the same propagation delay, line loss, etc. Consequently, the performance of each DQ path is approximately the same, whereas prior art devices typically had DQ paths of different lengths and thus different performances. The performance of these devices was thus limited to the lowest performance DQ path.

While centrally positioning the array bank 211B and splitting the array bank 211A provides equalized data paths 135, this layout also provides reduced die area. Each sub-array 134 in the array bank 211A has two row decoders 136 and two sets of N-channel sense amplifiers (NSA) 138. Therefore, for the 16 sub-arrays 134 in the array bank 211A, 32 row decoders 136 are required. However, the centrally located array bank 211B employs only 24 row decoders 136', since the eight row decoders extending through the middle of the array bank can be shared by the corresponding sub-arrays 134. These row decoders 136' can be shared because only a single row line on opposite sides of the row decoders is energized at any one time. Consequently, the memory device 200 achieves increased die area savings over prior SGRAM devices by reducing the number of row decoders.

Figure 4D:
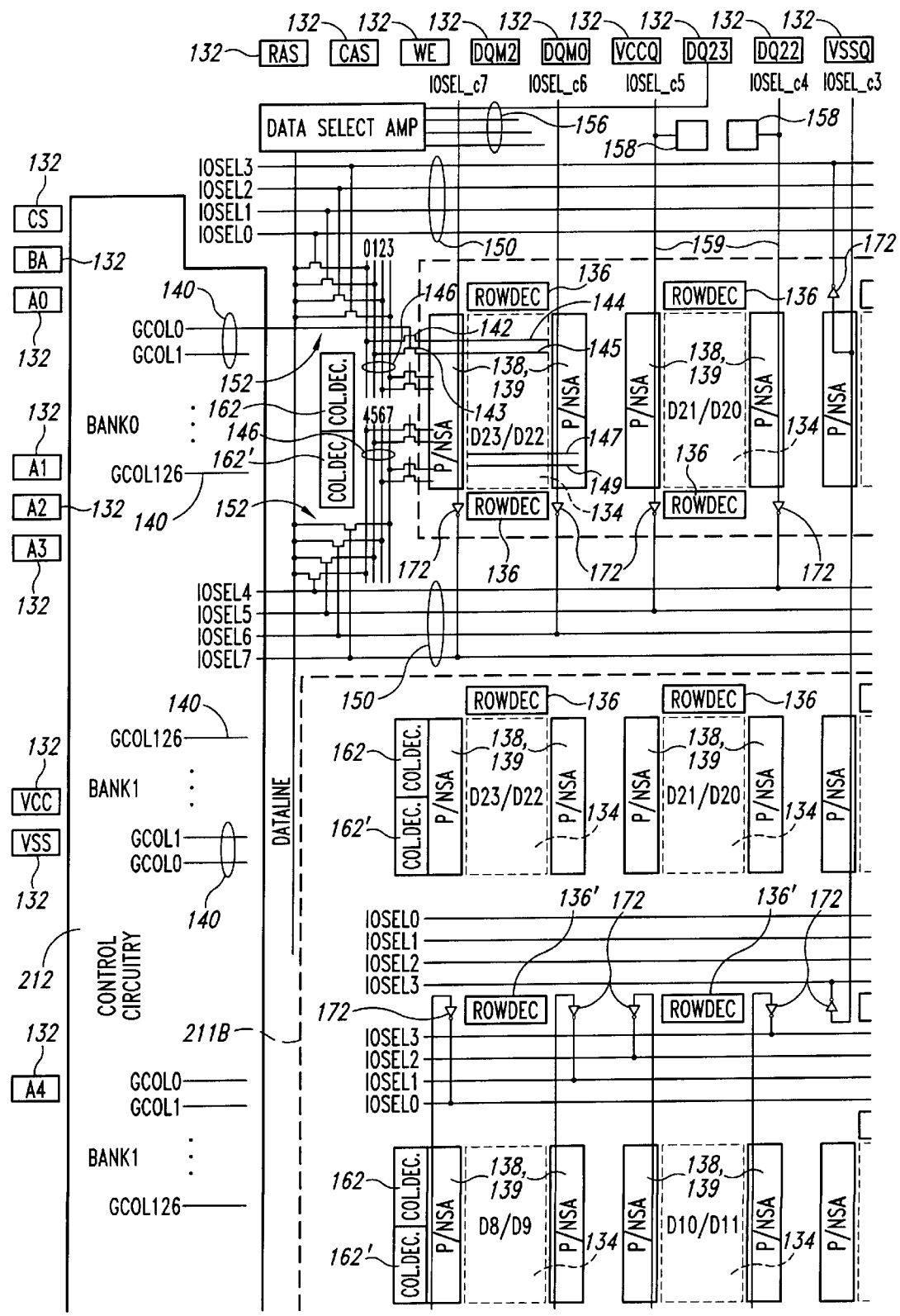
FIG. 4D is an enlarged view of a portion of FIG. 4A, showing several data input/output paths.

Referring to FIG. 4D, to further realize improved die area, the memory device 200 employs a reduced number of lines between the columns of memory cells and the corresponding DQ pads 132. For example, considering only two columns of memory cells 144, 145, a global column select signal. GCOL0 (described below) is provided over two of 129 column select lines 140 to close gate transistors 142, 143 and access the columns 144, 145, in the sub-array 134 corresponding to DQ23, all respectively. While not shown, each column in the sub-arrays 134 is coupled to one of the 129 column select lines by means of similar gating transistors. For example, column lines 147, 149 in the sub-array 134 corresponding to DQ22 are output to the other (right-hand) P/N sense amp circuitry 138, 139. Data is then routed from the columns 144, 145 through two of four I/O lines 146 to only one data line 148. While two groups of four I/O lines 146 are shown in FIG. 4D (numbered 0–3 and 4–7), two of the lines are colinear, but discontinuous and not electrically connected, having a break therebetween. Therefore, lines 0 and 4 of the I/O lines 146 are colinear, but not electrically connected, while lines 1 and 5, 2 and 6, and 3 and 7 are similarly formed. Consequently, space for only four I/O lines 146 are required for each sub-array.

While not shown in FIG. 4C, the I/O lines 146, and gate transistors 142, 143 can be positioned within each of the P/N sense amp areas 138, 139, rather than adjacent to this area. Therefore, while the I/O lines 146 are shown to the left of the corresponding P/N sense amp area 138, 139 in FIG. 4C, such lines can be positioned within the P/N sense amp area. The column decoders 162, 162' are then positioned in this area adjacent to the P/N sense amps.

Input/output select signals IOSEL_c0 and IOSEL_c1 (described below) are provided over lines 150 (shown as lines IOSEL0–IOSEL7) to close gate transistors 152 and route one selected I/O line 146 to the one data line 148. IO select circuits 158 (described below with respect to FIG. 21C) each provide one of the IO select signals IOSEL_C0–C7 (only two of such circuits being shown in FIG. 4D). A data select amplifier 154 is coupled between the one data line 148 and eight pad lines 156 (through output circuitry, not shown in FIG. 4D) to selectively couple the one data line to the appropriate pad line and thereby route the data to the appropriate pad 132. During a block mode read operation (described more fully herein), eight columns are simultaneously activated for each sub-array DQ0–DQ32, and therefore four global column select signals GCOL0–GCOL128 are provided over four of the 128 the global column lines 140 (each line accessing two columns). Consequently, the two groups of four I/O lines 146 output eight bits during each block read. The IOSEL_c0–IOSEL_c7 signals are sequentially applied to the pass gates 152 to sequentially gate the eight bits onto the single data line 148.

To similarly conserve die area, the IO select lines 150 are divided into two groups, IOSEL0–3, and IOSEL4–7. The first group of IO select lines 150, IOSEL0–3, are positioned on one side of the sub-arrays 134, while the other group, IOSEL4–7, are positioned on the other side, as shown in FIGS. 4A and 4B. I/O select lines 150 for the DQ pads DQ16–DQ23, are colinear with, but not electrically connected with similar I/O select lines 50 for the DQ pads DQ0–DQ7, as shown in FIG. 4. (FIG. 4B more accurately shows the colinearity, but discontinuous, nature of the I/O select lines for the four groups of DQ pads, i.e., DQ0–DQ7, DQ8–DQ15, DQ16–DQ23 and DQ24–DQ31.)

To similarly conserve die area, the IOSEL_C0–C7 signals are routed from the various IO select circuits 158 on individual, spatially separated, lines 159 that run through the P/N sense amps 138, 139. For example, as shown in FIG. 4C, one of the lines 159, corresponding to IOSEL_C5 signal, runs through one of the P/N sense amp areas 138, 139, to couple to the IO select line IOSEL5.

Importantly, prior art designs require one data line for each DQ path. Therefore, under such prior designs, the memory device 200 would require 16 data lines 148 for each of eight sets of sub-arrays 134, since each sub-array corresponds to two DQ paths. However, the memory device 200 instead employs the four I/O lines 146 for each sub-array 134, and one data line for each group of eight. While not shown in FIG. 4D, the memory device 200 preferably employs pairs of digit or bit lines for each column, alternating for even and odd columns, and the differential N and P-sense amplifiers 138, 139, as is known in the art. Therefore, two data lines 148 and eight I/O lines 146 are required for each column. However, most prior art memory devices similarly employ pairs of bit lines for each column, and therefore, require sixteen data lines. Consequently, the memory device 200 realizes a savings of four lines per DQ path.

Figure 4E:
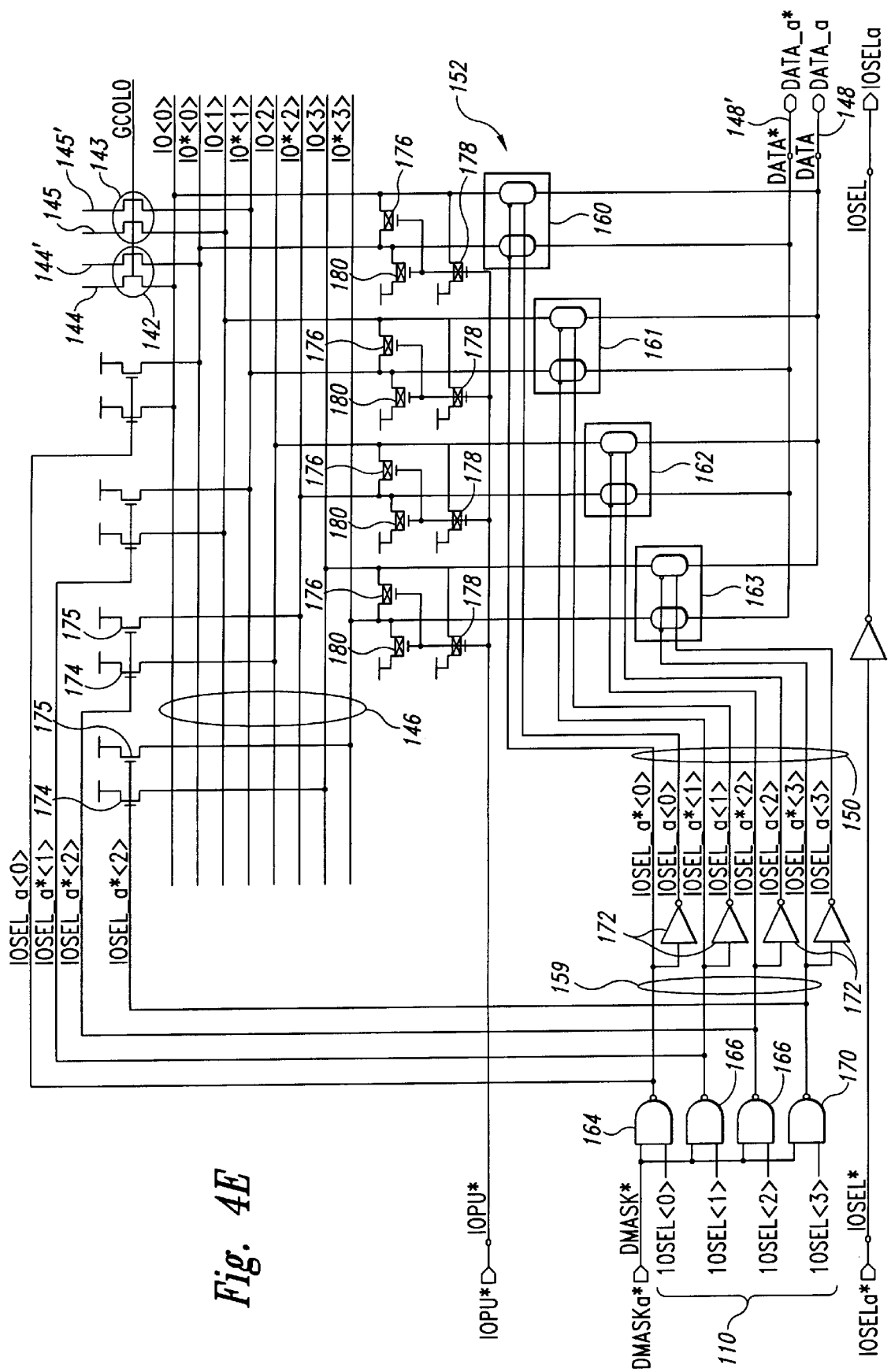
FIG. 4E is a schematic diagram of the data input/output paths.

Referring to FIG. 4E, the column lines 144, 145 are shown as having bit and complement column lines 144, 144', and 145, 145'. Each of the four column lines 144, 144', 145, 145' are coupled to the I/O lines 146. Specifically, column lines 144, 144' are coupled to I/O lines shown as IO<0>, and IO*<0>, while column lines 145, 145' are coupled to lines IO<1>, and IO*<1>. The pass gates 152 preferably consist of pass gates 160–163 that couple the I/O lines 100–103 to the data lines 148, 148' (the complement of the data line 148). The pass gates 160–163 each consist of a pair of N- and P-channel pass gates. For example, one of the pass gates in the multiplexer 160 couples the I/O line IO<0> to the data line 148, while the other pass gate couples the IO line IO*<0> to the data line 148'.

The I/O select signals IOSEL0–IOSEL3 from the I/O select circuitry 158 (FIG. 4D) are provided to NAND gates 164, 166, 168, 170, respectively. A normally high data mask signal DMASK signal enables each of the NAND gates 164–170, so that when an IOSEL signal is high, its respective NAND gate outputs a low signal. The low signal output from each of the NAND gates 164–170 is inverted by one of four inverters 172, to switch on or selectively conduct pass gates 160–163, respectively. For example, if IOSEL<0> is high, but IOSEL<1>–IOSEL<3> are low, then only the NAND gate 164 outputs a low signal, that is inverted by the inverter 172 so that both the low and high signals are applied to the pass gate 160. In response thereto, the pass gate 160 couples the bit lines 144, 144' on I/O lines IO<0>, IO*<0> to the data lines 148, 148', respectively.

As explained more fully herein, the I/O lines 146 are pulled up following activation, and equalized prior to activation. A pair of pull up transistors 174, 175 are coupled to each of the I/O lines IO<0>—IO*<3>. Each pair of pull up transistors 174, 175 correspond to one pair of complementary IO lines (IOa and IO*a where a is a whole number). When one of the NAND gates 164–170 outputs a high value (when IOSEL or DMASK has a low value), then the transistor pair 174, 175 pull up the selected I/O line 146 to a high value. For example, prior to a read operation, the I/O lines 146 are taken to a high value (Vcc) by means of a high value from the NAND gates 164–170 applied to the pull up transistors 174, 175. During a block write command, a given group of eight DQ pads (DQ0–DQ7, DQ8–DQ15, DQ16–DQ23 or DQ24–DQ31) could be masked by applying a low DMASK signal to the NAND gates 164–170. In response thereto, the NAND gates 164–170 output a high value to the transistor pairs 174, 175 to pull up all of the IO lines IO<0>–IO*<7>. Additionally, such a high value turns off all of the pass gates, such as pass gates 160–163 for the selected set of DQs.

To equalize the I/O lines 146, a low IO pull up signal IOPU* is applied to equalization transistors 176, and pull up transistors 178, 180. The equalization transistors 176 are coupled between complementary pairs of IC lines, such as IO<0> and IO<0>. The pull up transistors 178, 180 are coupled between Vcc and one of the IO lines 164. As explained below, each pair of I/O lines (e.g., IO<0>, IO*<0>) is preferably initially set to the same high value by means of the low IOPU* signal applied to the equalization transistor 176, and pull up transistors 178, 180. Thereafter, when the global column signal, such as GCOL0, opens the selected column to the IO lines (bit lines 144, 144'), a small differential is placed across the two IO lines to allow the data sense amplifier (discussed herein) to recognize this difference.

While the data input/output paths 135 are generally described above (FIGS. 4D and 4E) with respect to DQ paths DQ16–DQ23, each of the groups of eight DQ paths, in each of the array banks 211A, 211B contain identical circuitry. For example, the sub-arrays corresponding to DQ paths DQ0–DQ7 for the array bank 211A likewise has similarly positioned I/O lines 146, I/O select lines 150, etc., as well as the sub-arrays DQ0–DQ7 for the array bank 211B.

Input Clock Circuitry

Figure 5:
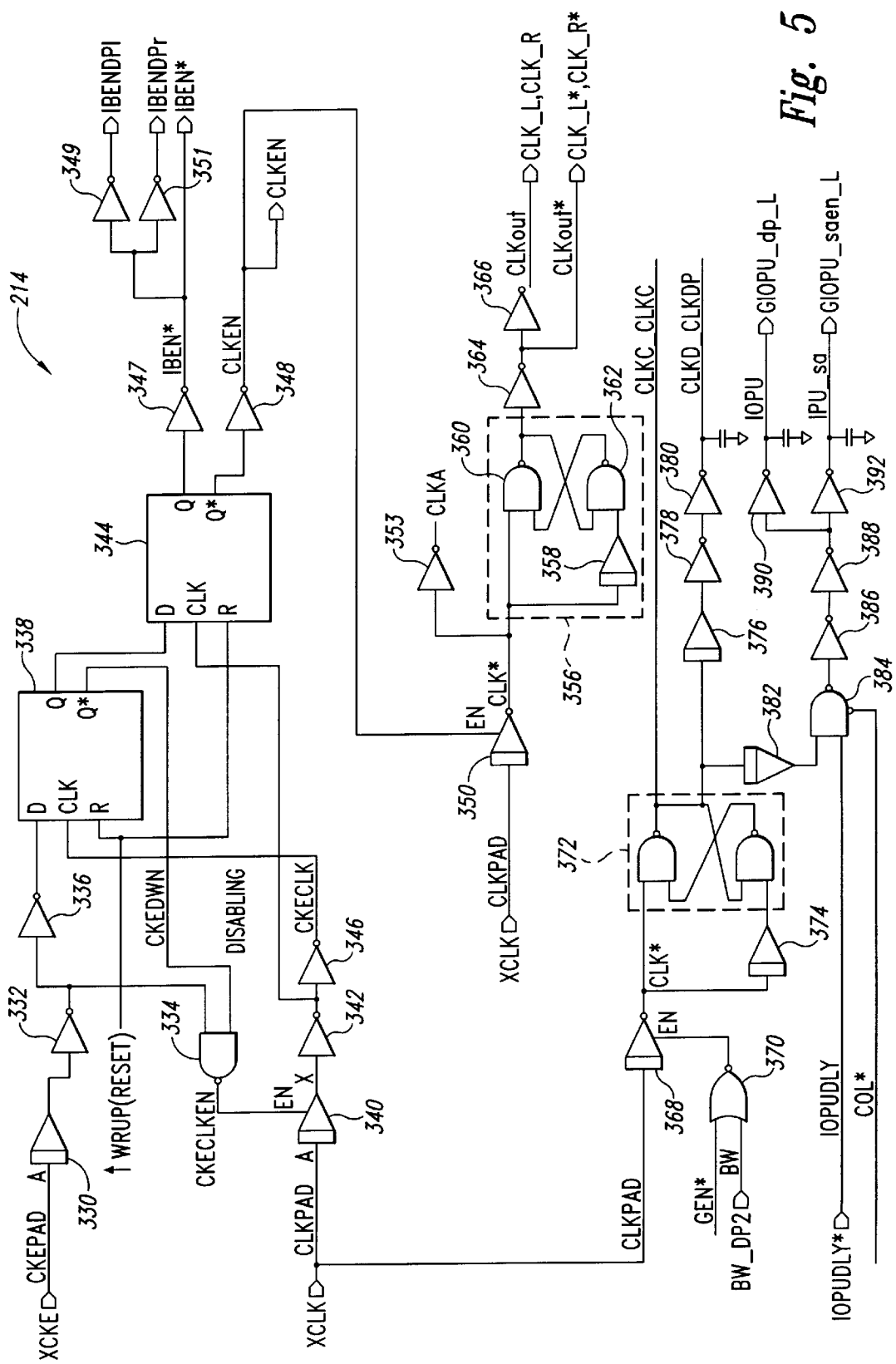
FIG. 5 is a partial schematic, partial block diagram of input clock circuitry of the memory device of FIG. 3.

The circuitry in FIG. 5, as well as most of the figures herein, are either schematic or partial schematic, partial block diagrams that depict an exemplary embodiment of the present invention. The drawings generally use conventional symbology and nomenclature, and thus, similar symbols and nomenclature have similar or identical functions. Certain circuit elements represented by possibly less familiar symbols or nomenclature are discussed herein in more detail. Without sacrificing clarity, but for brevity, and to orient one skilled in the art to the symbols and nomenclature employed herein, most circuits and signals in the figures herein will be discussed in detail. From the detail discussions of certain portions in circuit elements in selected figures, one skilled in the art can readily understand similar components in the remaining figures to understand and practice the present invention. In general, where a given circuit is not described in detail herein, its components and operation are conventional and well-known to those skilled in the art, or readily understandable based on the detailed description of the remaining portions of the memory device 200. The input clock circuit 214 is shown in more detail in FIG. 5.

An external clock enable XCKE signal, and an external clock XCLK signal, are provided by a processor (not shown) or other device to which the memory device 200 is coupled. The external clock enable XCKE signal is applied through a buffer 330 and an inverter 332 to a first input of a NAND gate 334 and to the D input of a flip-flop 338 through an inverter 336. As a result, when XCKE goes high, the output of the NAND gate 334 goes high to enable a buffer 340 receiving the external clock XCLK signal. If XCLK is high when the buffer 340 is enabled, that high is inverted twice by a pair of inverters 342, 346 to clock the high applied to the D input from the XCKE signal to the Q output of the flip-flop 338. If CLK is low when the buffer 340 is enabled, the high applied to the D input is clocked to the Q output of the flip-flop 338 when XCLK subsequently goes high. Thus, when XCKE goes high, the Q output of the flip-flop 338 goes high and the Q* output of the flip-flop 338 goes low on the leading edge of XCLK.

The high at the Q output of the flip-flop 338 is applied to the D input of a second flip-flop 344. The clock input C of the flip flop receives the inverted XCLK signal through the inverter 342. As a result, on the trailing edge of XCLK following a low-to-high transition of XCKE, the Q output of the flip-flop 344 goes high and the Q* output of the flip-flop 344 goes low. An inverter 348 connected to the Q* output of the flip-flop 344 then outputs an active high internal clock enable signal CLKEN.

The high Q output of the flip-flop 344 is applied through an, inverter 347 to output an active low input buffer enable signal IBEN* used[ internally as described below. Active high IBENDP1 and IBENDPr signals are output from respective inverters 349, 351, respectively. While not shown, the input clock circuit 214 can include a clock frequency detector circuit, such as that shown and described in the inventors' copending U.S. patent application Ser. No. 08/764,488, filed Dec. 12, 1996, entitled "CLOCK FREQUENCY DETECTOR FOR A SYNCHRONOUS MEMORY DEVICE."

When the external clock enable signal XCKE transitions to an inactive low, the low is applied to the D input of the flip-flop 338 through the inverters 332, 336. This transition of XCKE also causes the output of the inverter 332 to transition from low-to-high. However, the output of the NAND gate 334 remains high because the other input of the NAND gate receives a low from the Q* of the flip-flop 338. Thus, XCLK continues to be coupled through the buffer 340 after XCKE becomes inactive. The following leading edge of XCLK clocks the low at the D input of the flip-flop 338 to the Q output of the flip-flop 338 and a high to the Q* output of the flip-flop 338. The high at the Q* of the flip-flop 338 causes the output of the NAND gate 334 to go low, thereby disabling the buffer 340. The output of the buffer 340 then transitions low thereby generating a low-to-high transition at the output of inverter 342 which clocks the low at the Q output of the flip-flop 338 to the Q output of the flip-flop 344. At the same time, the Q* output of the flip-flop 344 goes high, thereby disabling the buffer 350 through the inverter 348. The output of the buffer 350 then goes low. Thus, the internal clock enable signal CLKEN at the output of the inverter 348 is active from the first trailing edge of XCLK following XCKE becoming active to just after the first leading edge of XCLK following XCKE becoming inactive.

The internal clock enable signal CLKEN enables an inverting buffer 350 that receives the external clock signal XCLK. Since the internal clock. enable signal CLKEN goes active on the trailing edge of XCLK following XCKE becoming active as explained above, the external clock XCLK passes through the buffer 350 on the first leading edge of XCLK after XCKE goes high. Thereafter, all of the external clock signals XCLK are coupled through the buffer 350 until the internal clock enable signal CLKEN goes inactive. A short time after the internal clock enable signal CLKEN goes inactive, the output of the buffer 350 goes low and remains low until after the external clock enable signal XCKE once again becomes active. The output of the buffer 350 is coupled through an inverter 353 to generate a CLKA signal used by an address input latch, as described in detail below.

The output of the buffer 350 is also applied to a pulse stretching circuit 356 formed by a conventional delay circuit 358 and two NAND gates 360, 302 configured as a flip-flop. The purpose of the pulse stretching circuit 356 is to ensure that a clock signal is generated at the output of the pulse stretching circuit 356 that has at least the duration of the delay time of the delay circuit 358. As a result, the switch point of the buffer 350 can be set to a relatively low voltage even though doing so can cause transients to be generated at the output of the buffer 350. The pulse stretching circuit 356, by allowing the switch point of the buffer 350 to be set to a relatively low voltage, thus minimizes the propagation delay of the XCLK signal.

In the operation of the pulse stretching circuit 356, the output of the buffer 350 goes from high to low on the leading edge of XCLK since the external clock XCLK is inverted by the buffer 350. When the output of the buffer 350 goes low, the flip-flop formed by the NAND gates 360, 362 is set, thereby causing the output of the NAND gate 360 to go high. After the delay of the delay circuit 358 has expired, the output of the delay circuit 358 follows the high-to-low transition at the output of the buffer 350, thereby resetting the flip-flop formed by the NAND gates 360, 362. At that time, the output of the NAND gate 360 goes low. If the output of the inverter 350 went high prior to the expiration of the delay time of the delay circuit 358, the low at the output of the NAND gate 362 would maintain the output of the NAND gate 360 high until the expiration of the delay time of the delay circuit 358. The pulse stretching circuit 356 thus ensures that an internal clock signal has a sufficient duration to be used by other circuitry in the memory device 200, as described below.

The output of the pulse stretching circuit 356 is coupled through a, pair of inverters 364, 366 to generate two internal clock signals, namely CLK_L and CLK_R, which are used as described below. The inverse of those signals, namely CLK_L* and CLK_R*, are generated at the output of the inverter 364.

A buffer 368 also receives the XCLK signal. A NOR gate 370 receives a global enable GEN* signal, and a block write BW_DP2 signal, such that if both of the input signals to the NOR gate are low, the NOR gate outputs a high signal to enable the input buffer 368. The buffer 368 outputs an inverted clock CLK* signal to a flip-flop 372, that in response thereto, outputs a high CLKC signal. A delay element 374 (preferably having a 5 nanosecond delay) also receives the CLK* signal, and outputs a delayed reset signal to the flip-flop 372 so that the CLKC signal is a similarly stretched clock signal such as CLK_L.

A 1 nanosecond delay element 376 receives the CLKC signal, and couples it through a pair of inverters 378, 380 to provide a clock data signal CLKDP. Another 1 nanosecond delay element 382 delays the CLKC signal, and provides it to a first input of a NAND gate 384, which also receives at its second input an IO pull up delay signal IOPUDLY*. When both CLKC and IOPUDLY* are high, the NAND gate 384 outputs a low signal which is coupled through a pair of inverters 386, 388, and a second, parallel pair of inverters 390, 392, to generate global IO pull up data and global IO pull up sense amp enable signals GIOPU_DP and GIOPU_SAEN, respectively. A column signal COL* (from CAS circuitry 600, FIG. 9) is applied to an enable input of the NAND gate 384, which when low, enables the NAND gate. However, when the COL* signal is high, the NAND gate 384 outputs a continuous low value regardless of its inputs, so that GIOPU_DP and GIOPU_SAEN are always high.

Command Decode and Latch Circuitry

Figure 6A:
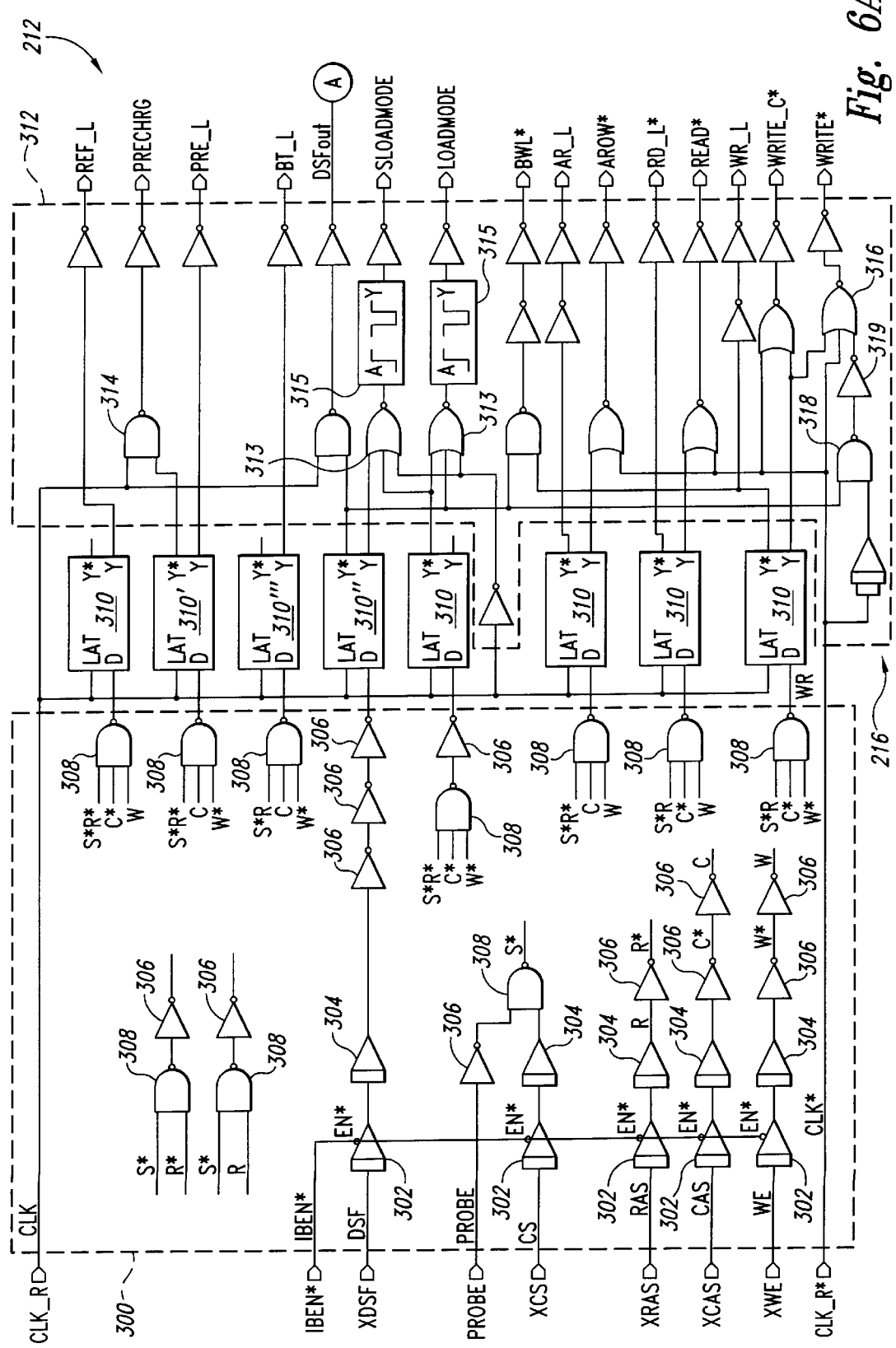
FIG. 6A is an input command latch and decode circuit for the memory device of FIG. 3.

Referring to FIG. 6A, portions of the command decode circuitry 216 and command latch circuitry 218 are shown in greater detail. Command decode input circuitry 300 receives the signals CS, WE, RAS, CAS, and a data special function signal DSF (which controls block write, and other special data functions). The control signals CS, WE, RAS, CAS, etc., are shown in FIG. 6A having an initial "X" in the acronym; the initial "X" refers to an external pin or terminal for the memory device 200 with which it is coupled to external circuitry such as a processor (not shown).

The CS, RAS, CAS, and WE signals are input to input buffers 302 in the command input circuitry 300, which are enabled by the input buffer enable signal IBEN* from the input clock 214 (FIG. 5) when the clock CLK is enabled. The CS, RAS, CAS, WE signals are then delayed by delay elements 304 and inverted by inverters 306 to provide select S*, row R*, column C* and write W* signals to multiple NAND gates 308, which in turn provide at least a partial decoding of the initial command signals CS, RAS, CAS, and WE, as is evident from FIG. 6A. One or more of the inverters 306 are employed to provide appropriate delays between the various command signals, CS, RAS, CAS, WE, etc., so that all of the signals are provided through the command input circuitry at the same time. Thus, if two command signals are applied to the pads of the memory device 200 simultaneously, then they are initially decoded and output by the input command circuitry simultaneously.

The command latch circuitry 218 includes eight latch circuits 310 which each receive at their data inputs D an output from one of the NAND gates 308 in the command input circuitry 300. The latches 310 are enabled by the clock signal CLK_R from the input clock 214 (FIG. 5) that is input to their latch enable inputs LAT. Command output circuitry 312 receives the outputs from the latches 310, and performs additional decoding of the CS, RAS, CAS, WE, and other control signals, as is evident from FIG. 6A, to provide most of the control signals required in the memory device 200. For example, the inverting outputs of latches 310', 310" provide signals to NAND gates 314 in the command output circuitry 312, which in turn produces precharge and data special function signals PRECHRG and DSF, respectively. The clock signal CLK_R from the input clock circuit 214 (FIG. 5) enables or gates the PRECHRG and DSF signals through the NAND gates 314 when the clock signal CLK_R goes high. Similarly, the command decode and latch circuitry 216, 218 produces a block write load signal BWL, address row signal AROW*, read signal READ*, write signal WRITE*, and write complete signal WRITE_C*.

A NOR gate 316 produces the WRITE* signal only when the CLK_R*, WR after being latched by the latch 310 and a delayed and latched external DSF signal XDSF are low. A NAND gate 318 receives the XDSF signal output from one of the latches 310 and the CLK signal that has been delayed one nanosecond. As a result, the NAND gate 318 outputs an active high value to an inverter 319 one nanosecond after the CLK signal transitions to a high value, while XDSF is high. Therefore, during a block write command (initiated by the XDSF signal), the WRITE* signal is delayed one nanosecond after receiving the XSDF signal.

A pair of NOR gates 313 each receive the inverted CLK signal, an intermediate command signal (being the NAND of the C*, W* and S*R* signals), and either the non-inverted or inverted XDSF signal to produce output, signals provided to one of two one-shot circuits 315. The one-shot circuits 315 in turn produce 4 nanosecond pulses as special load mode and load mode signals SLOADMODE, LOADMODE, respectively. While the command decoder 216 is, shown in FIG. 6A as having command input circuitry 300 and command outputs circuitry 312 positioned on opposite sides of the command latch circuitry 218, the command decoder 216 can be a single block of command circuitry positioned either before or after the command latch circuitry.

Importantly, some of the signals output from the latches 310 are not decoded by the command output circuitry 312, but instead are provided further downstream. As a result, such signals are rapidly provided downstream to control certain downstream circuitry almost immediately after the appropriate control signals CS, RAS, CAS, and WE are supplied to the memory device 200), without any significant delays caused by gates, registers, etc. For example, a latch 310''' outputs a burst terminate signal BT_L to the burst counter 230 (FIG. 3), thereby bypassing any delays caused by the command output circuitry 300, column address latch 228, etc. Consequently, the memory device 200 can rapidly and accurately terminate a burst read of multiple columns in the memory arrays 211A, 211B without delays in the control circuit 212.

Other signals output by the command latch circuitry 218, without being delayed by the command output circuitry 312, include a refresh latched signal REF_L, precharge latched signal PRE_L, an activate row latched signal AR_L, a read latched signal RD_L* and a write latched signal RW_L. In general, unless otherwise noted, acronyms for control signals in the memory device 200 having a "_L" refer to signals provided directly out of the command latch circuitry 218. Such signals are clocked in or "validated" downstream from the command latch circuitry 218 by the clock signal CLK_R, typically by providing the latched signal to one input of a NAND gate, while the clock signal is provided to the second input. As a result, whenever the clock signal CLK_R is high, the latched signal is output as a high value if it is low, or output as a low value if it is high. For example, as explained below with respect to FIG. 9, the downstream CAS control circuitry 600 validates the WR_L signal, rather than the command decode circuitry 216.

Moreover, the control circuit 212 employs the latches 310 in the command latch circuitry 218, as opposed to registers which are employed in known memory devices. The latches 310 further speed the throughput of the input command signals, i.e., CS, RAS, CAS, and WE signals, through the control circuit 212 and to the appropriate downstream circuitry controlled by the signals. As is known, registers generally generate a valid output only when an input has been clocked to their outputs. This can result in a delay of up to one clock cycle. The latches 310, however, generate a valid output as they receive an input and are thus "transparent." On the next leading edge of CLK, the input is latched so that the valid output signal remains after the input signal is no longer present. In general, delays inherent in using command registers are eliminated by employing the latches 310, and therefore, the input command signals are processed by the control circuit 212 more quickly than in prior memory devices using command registers.

Figure 6B:
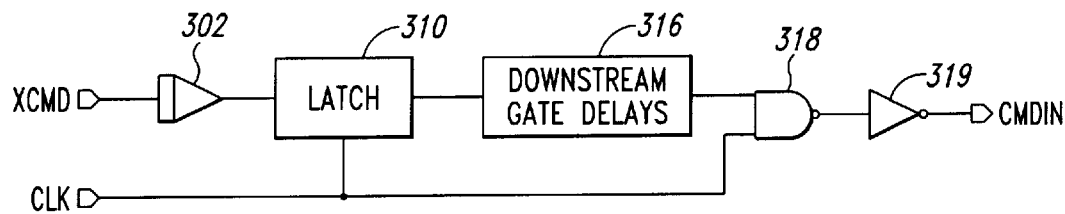
FIG. 6B is a partial schematic, partial block diagram of a signal input path for the memory device of FIG. 3.
Figure 6C:
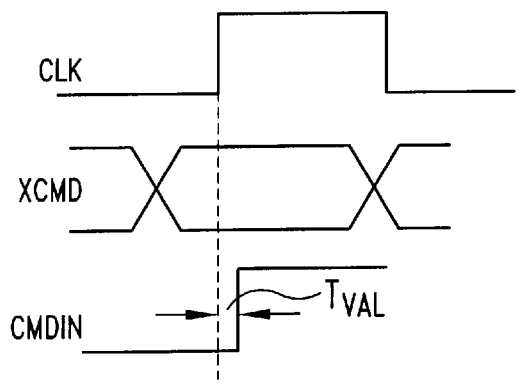
FIG. 6C is a timing diagram of clock, input and output signal waveforms for the signal input path of FIG. 7A.

Referring to the block diagram of FIG. 6B, and the corresponding timing diagrams of FIG. 6C, an external control signal XCMD (or address, data, or internal command signal) passes through one of the input buffers 302 (and possibly other gates) to be present at the input of the latch 310, before the clock signal CLK signal goes high. If the present invention employed clocked registers instead of the latches 310, the XCMD signal would be delayed and not be provided to a downstream gate to be validated until after the CLK signal went high, as shown in FIG. 6C. Any gates downstream of the register would further add to the delay.

Since the present invention employs the latches 310, the XCMD signal is provided at the output of the latch when the CLK signal is low, and is latched therein when the CLK signal is high, as explained below. Therefore, the XCMD signal is provided to, and passes through, downstream circuitry 316 when the CLK signal is low, so that the XCMD signal is waiting at the input of a downstream gate, such as a NAND gate 318, to be validated when the CLK signal goes high. Any gate delays caused by the downstream circuitry 316 when incurred while the CLK signal is low. When the CLK signal goes high, the XCMD signal is output from the NAND gate 318, inverted by an inverter 319, and output as an internal command signal CMDIN to be used for controlling certain further downstream circuitry. As a result of the latch 310, any delay in validating the XCMD signal and outputting the resulting CMDIN signal, i.e., a delay $T_{VAL}$, is a function of only the gate delays in the NAND gate 318 and the inverter 319. All prior delays caused by the downstream circuitry 316 were incurred while the clock signal CLK was low.

Figure 6D:
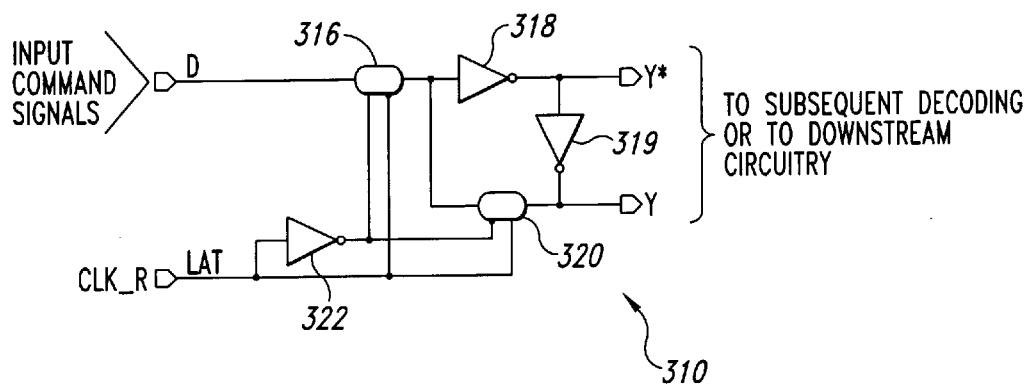
FIG. 6D is a schematic diagram of an exemplary latch for use with the input command latch circuitry of FIG. 6A.

Referring to FIG. 6D, an exemplary latch 310 is shown. The data input to the latch 310 passes through a multiplexer or pass gate 316 to a pair of serially coupled inverters 318, 319. The output of the second inverter 319 passes through a second pass gate 320 and is then fed back to the input of the first inverter 318. The clock signal CLK is inverted by an inverter 322 and both the inverted and non-inverted clock signal control the pass gates 316, 320. In operation, when the clock signal CLK is low, the pass gate 320 is open, while the pass gate 316 is closed to allow the data to be input to the inverters 318, 319. However, when the clock signal goes high, the pass gate 320 closes, while the pass gate 316 opens. As a result, the data signal loops through the inverters 218, 219, and the pass gate 320 until the clock signal falls to a low value again, the data being available at inverted and non-inverted output terminals Y* and Y, respectively.

The latch 310 is exemplary of various latches employed by the memory device 200. Therefore, for brevity, such latches are not described in detail herein. Instead, the above description of the latch 310 applies equally to the operation of all such latches.

Special Command Control Circuitry

Figure 7A:
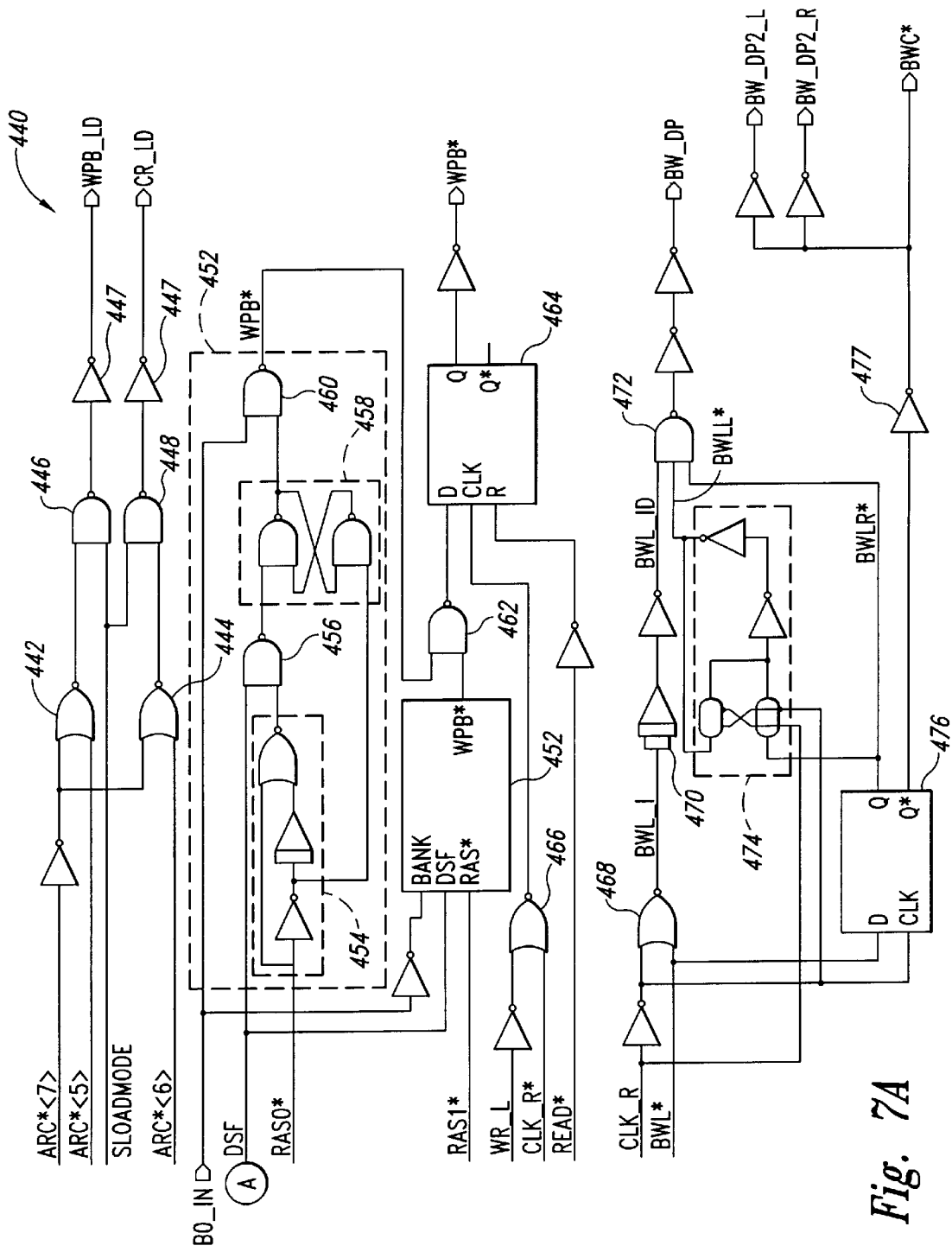
FIG. 7A is a partial schematic, partial block diagram of special command control circuitry for the memory device of FIG. 3.
Figure 11A:
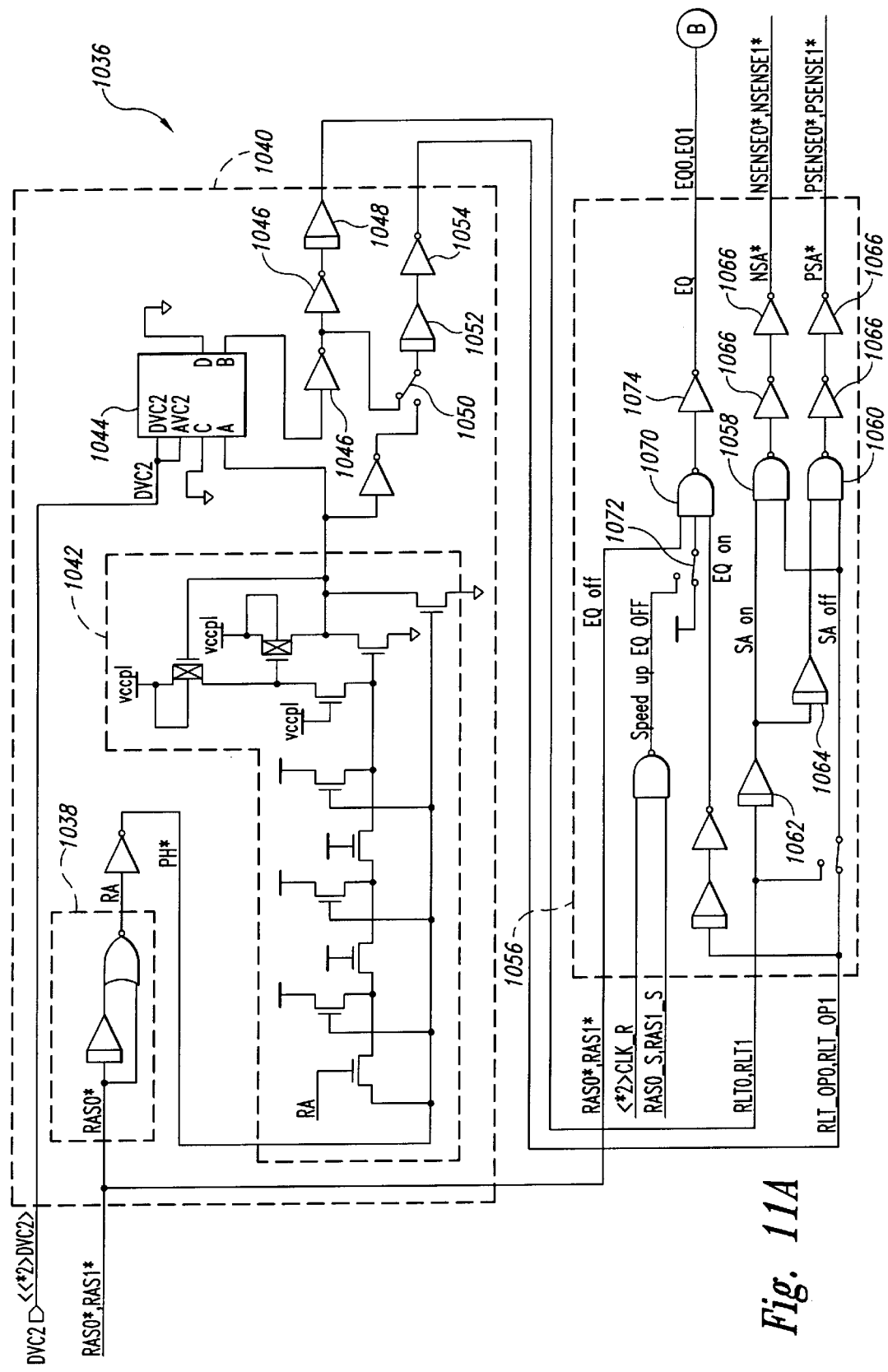
FIG. 11A is a partial schematic, partial block diagram of row (RAS) input circuitry for the memory device of FIG. 3.

Referring to FIG. 7A, a special command control circuit 440 receives an address row or column signal ARC* for address bits A5–A7 of the address A0–A8, which are produced by the row input circuitry 1036 described in detail herein with respect to FIG. 11A. A NOR gate 442 receives the ARC*5 signal and an inverted ARC*7 signal through an inverter 443, which when both are low, produces a high input to a NAND gate 446, that in turn produces an active high output signal when the SLOADMODE signal at its other input is high. One of two inverters 447 inverts the output signal to produce a write per bit load signal WPB_LD.

As noted above, the SLOADMODE signal is essentially generated by the XDSF and a certain combination of internal command signals to allow special mode commands to be input to the memory device 200 over the external address pins XA0–XA8 and XBA. Therefore, when the SLOADMODE signal is high, a low value on the XA7 pin, which produces the ARC*7 signal, indicates standard operating mode, while a low value on the XA5 pin, which produces the ARC*5 signal, indicates to a mask register or latch (described below) that a current bit mask is to remain unchanged. If ARC*7 is high, the memory device 200 is operating in a test mode, while when ARC*5 is high, new data is to be loaded into the mask register. In general, the ARC*7–9 bits indicate the special operating mode, the ARC*6 indicates the status of a control register, the ARC*5 indicates the status of the mask register, while ARC*4–0 are currently reserved.

A NOR gate 444 receives a low ARC*6 signal and the inverted low ARC*7 signal to produce a high input to a NAND gate 448, which in turn produces an active high output signal when the SLOADMODE signal at its other input is high. One of two inverters 447 inverts the output signal to produce a block write or control register load signal CR_LD. A low ARC*6 signal indicates to a control register or latch (described below) that a current value is to remain unchanged, while when it is high, new data is to be loaded thereto. The WPB_LD and CR_LD signals are supplied to datapath circuitry, described below.

Figure 7B:
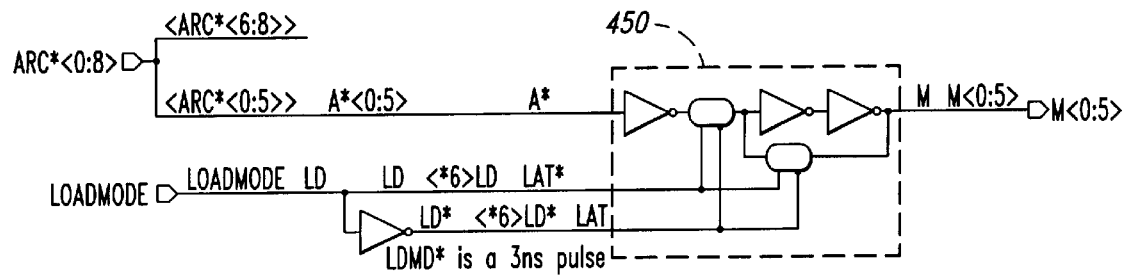
FIG. 7B is a schematic diagram of a mode register circuit for the memory device of FIG. 3.

Referring to FIG. 7B, each of eight mode latches 850 receive one of the bits of the ARC* 0–8 signal when the LOADMODE signal is high, while the bits are latched therein when the LOADMODE signal is low. The LOADMODE signal is essentially generated by the XDSF and a certain combination of internal command signals, shown in FIG. 6A, to allow mode commands to be input to the memory device 200 over the external address pins XA0–XA8 and XBA. In general, the ARC*7–9 signals indicate the operating mode, the ARC*6–4 signals indicate the read latency mode, the ARC*3 signal indicates the burst type, while the ARC*2–0 signal indicate the burst length. As explained more fully herein, when ARC*7–9 are all low, then the memory device 200 operates under standard operation, while a high value in any bit can indicate test mode. ARC*5 high and ARC*4 low indicates a read latency of 2, while ARC*5 and ARC*4 high indicates a read latency of 3. ARC*3 can indicate a burst type, while ARC*2–ARC*0 indicate burst length as follows:

TABLE 1

| | | | Burst Length | |
|---|---|---|---|---|
| ARC*2 | ARC*1 | ARC*0 | ARC*3 = 0 | ARC*3 = 1 |
| 0 | 0 | 0 | Reserved | Reserved |
| 0 | 0 | 1 | 2 | 2 |
| 0 | 1 | 0 | 4 | 4 |
| 0 | 1 | 1 | 8 | 8 |
| 1 | 0 | 0 | Reserved | Reserved |
| 1 | 0 | 1 | Reserved | Reserved |
| 1 | 1 | 0 | Reserved | Reserved |
| 1 | 1 | 1 | Full Page | Reserved |

To initiate the particular modes, the mode bits stored in the latches 850 are employed by downstream circuitry, as described more fully herein.

A command latch circuit 452 for array bank 211A or Bank 0 receives a RAS0* signal from the row input circuitry 1036 and a Bank 0 input signal B0_IN from the address input circuitry 980 (FIG. 10A), as well as the DSF signal from the command decode and latch circuitry 216, 218 (FIG. 6A), all described below. As generally used herein, the terms "array bank 211A" and "Bank 0," as well as "array bank 211B" and "Bank 1" are used interchangeably.

When RAS0* falls to a low value, a one shot 454 outputs a high value pulse of 3 nsec duration to a NAND gate 456, which in turn produces an active low value output to set a flip-flop 458 when the NAND gate 456 also receives a high XDSF signal. Once set, the flop-flop 458 provides a high input to a NAND gate 460 that outputs an active low internal write per bit signal WPB* when the B0_IN signal is also high. The WPB* signal permits writing of individual bits to certain columns under bit masks, as is known in the art.

Importantly, the B0_IN signal can alternate between high and low values during each column access to produce a corresponding alternating internal WPB* signal, since multiple column accesses can be performed during the relatively long low RAS0* time. The flip-flop 458 can reset when RAS0* rises again to a high value.

A second command latch 452' for Bank 1 operates identically to the command latch 452, except that it receives the RAS1* signal and an inverted B0_IN signal. Therefore, when the B0_IN signal is low, so that the NAND gate 460 in the command latch 452 for Bank 0 does not output an active internal WPB*, the inverted B0_IN signal can cause the NAND gate in the command latch 452' for Bank 1 to output an active internal WPB* signal. A NAND gate 462, essentially operating as an OR gate, outputs an active high value to a data input of a flip-flop 464 whenever either of the internal WPB* signals from the command latches 452 or 452' are low. The internal WPB* signal is clocked through the flip-flop 464 as a WPB* when both the CLK_R* and the inverted WR_L* signals, input to a NOR gate 866, are low. The flip-flops 458 in the first and second command latches 452, 452', are resettable only by receiving an inverted RAS1* signal. As a result, when RAS1* is low, write per bit functions for individual columns can be enabled by the WPB* signal.

The command latches 452, 452' for Banks 0 and 1 can allow bits to be written in alternating banks under control of the WPB* signal if both of the flip-flops 458 are set by the DSF signal, and the RAS0* and RAS1* signals, respectively. Then, as B0_IN alternates between high and low values, the command latches 452, 452' each output internal WPB* signals, and the flip-flop 464 in turn outputs the WPB* signal to the data path circuitry during each transition of the B0_IN signal. Alternatively, only one of the two Banks 0 or 1 could be enabled for write per bit functions under the WPB* signal, depending upon whether the command latch 452 or 452' outputs the internal WPB* signal, respectively. For example, when RAS0* is low, and a high DSF signal is received, the command latch 452 can output an active low WPB* signal, but thereafter, when RAS1* is low, the DSF signal could also be low, so that the command latch 452' does not output an active low internal WPB* signal. Therefore, the flip-flop 464 will output an active WPB* signal only for Bank 0. Such alternating write per bit functions for Banks 0 and 1 occur during separate RAS times, as controlled by the RAS Bank 0 and RAS Bank 1 signals RAS0* and RAS1*. A read signal READ* will reset the flip-flop 464 and ensure that a WPB* signal is not output therefrom during a read operation.

Figure 7C:
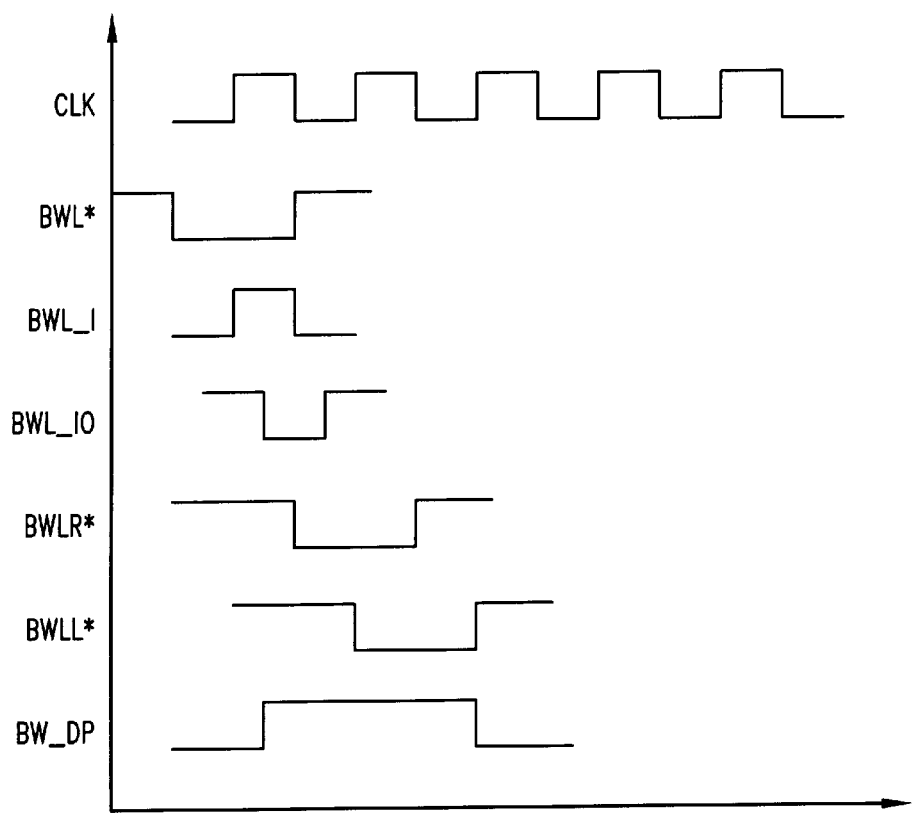
FIG. 7C is a timing diagram of signals produced by the special command control circuitry of FIG. 7A.

A NOR gate 468 receives the inverted CLK signal and the block write latch signal BWL which, when CLK is high and BWL* is low, produces a high internal BWL_I signal that is delayed 2 nsec by a delay gate 470 and inverted to produce a BWL_ID. A three input NAND gate 472 receives at one of its inputs the BWL_ID signal. The timing diagram of FIG. 7C shows the CLK, BWL*, BWL_I and BWL_ID signals. The inverted CLK signal and the block write latch signal BWL are also input to the data and clock inputs of a flip-flop 476. Since the inverted CLK signal is input to the flip-flop 476, the inverted output therefrom provides a block write complete signal BWC* on the trailing edge of the CLK signal, the BWC* signal being inverted by an inverter 477 to produce a low value pulse, one clock cycle long, when the BWL* signal is low. The non-inverting output provides a low BWLR* signal to a second input of the NAND gate 472 when the BWL* signal is low, and at the trailing edge of the CLK signal, as shown in FIG. 7C.

The non-inverting output also provides the BWLR* signal to a latch 474 when the BWL* signal is high and the CLK signal is high, while the BWL* signal is latched therein when the CLK signal is low. The non-inverting output of the latch 474 provides a BWLL* signal into the third input of the NAND gate 472 at the next rising edge of the CLK signal after the BWL_I signal was initially provided, as shown in FIG. 7C. As a result, the NAND gate 472 provides a high block write data path output signal BW_DP when the BWL*_ID signal from the delay gate 470 first goes low, the BW_DP signal stays high when the BWLR* signal from the flip-flop 476 goes low, and continues to stay high until the BWLL* signal from the latch 474 goes high, at which time BW_DP goes low, as shown in FIG. 7C.

The BW_DP signal initiates a block write operation in the data path circuitry, as described herein with respect to FIGS. 20–21. The two nsec delay in the BWL_ID signal from the CLK signal, and thus the initial 2 nsec delay in the BW_DP, ensures that the block write operation is not entered into too quickly after previously performing a normal write operation. As explained below with respect to the CAS control circuitry 600 (FIG. 9A), the BWC* signal inhibits or masks a second clock pulse during a block write command, since such a block write command requires at least two clock cycles.

Bank Command Circuitry

Figure 8A:
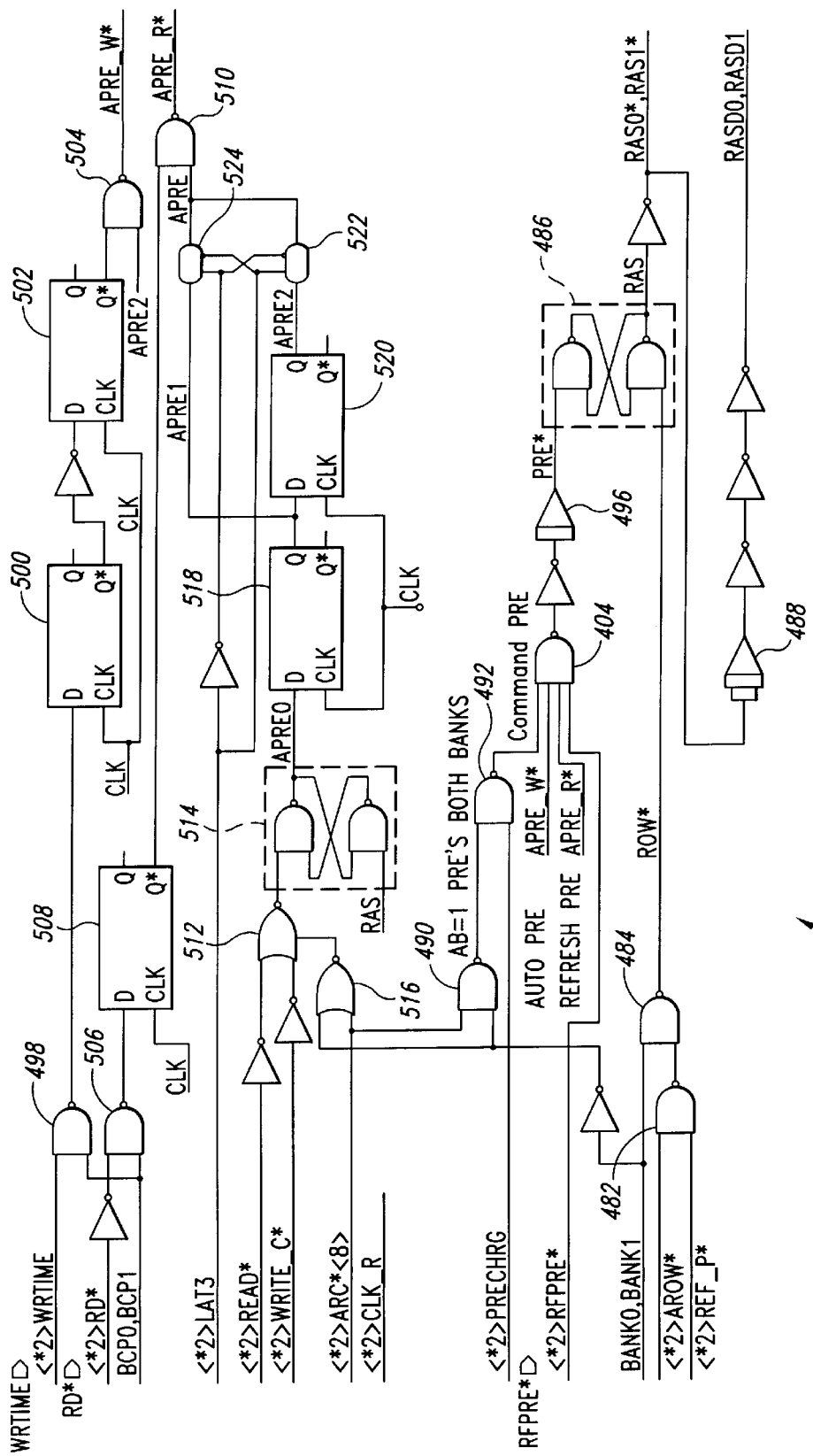
FIG. 8A is a partial schematic, partial block diagram of command bank circuitry for the memory device of FIG. 3.

Referring to FIG. 8A, one of two command bank circuits 480 is shown that receives the WRTIME signal from the CAS control circuitry 600 described below. While the command bank circuit 480 is generally described herein for array Bank 0, the same description applies equally to the other command bank circuit for the array Bank 1. The command bank circuitry 440 produces autoprecharge signals based on read and write commands, which initiate autoprecharge of row lines at the end of such read/write commands.

The AROW* signal (from the command latch and decode circuitry 212, 216 of FIG. 6A) and the REF_P* signal (from the row input circuitry of FIG. 11A, described below) are input to a NAND gate 482, which provides a high output when either of the AROW* or REF_P* signals have a low value. A second NAND gate 484 receives the high value from the NAND gate 482, and a high value for the BANK0 signal provided by the address input circuitry 1036 of FIG. 10A. In response thereto, the NAND gate 484 outputs a low ROW* signal to a flip-flop 486, that in turn provides a high signal, inverted by an inverter, to produce a row address select signal RAS0*. The RAS0* signal is delayed by a delay element 488, and inverted and amplified by three inverters, to produce a delayed RAS signal for Bank 0 RASD0.

The flip-flop 486 provides a high (inactive) RAS0* signal when the NAND gate 484 outputs a high value to the flip-flop 486, and the flip-flop receives at its second input a low value. The flip-flop 484 produces a high value; when either the BANK0 signal has a low value, and/or the AROW* and REF_P* signals have a high value.

The other signal input to the flip-flop 486, which permits its reset, is provided by a series of gates that indicate a precharge or refresh status for the memory device 200. A first NAND gate 490 receives the ARC*8 signal for the eighth bit in the external address A0–A8, and the inverted BANK0 signal, to provide a high output when either of the ARC*8 or inverted BANK0 signals are low. A second NAND gate 492 provides a low output only when the NAND gate 490 outputs a high value, and the precharge signal PRECHARG (from the command latch and decode circuitry 216, 218 of FIG. 6A) has a high value. A four input NAND gate 494, operating essentially as an OR gate, outputs a high value when any one of its four inputs are low, i.e., the output of the NAND gate 492, an auto precharge signal APRE_W*, a refresh precharge signal APRE_R* or a refresh precharge signal RFPRE*. The high value from the four input NAND gate 494 is inverted to a low value, delayed by a 4 nanosecond delay element 496, and input as a resetting low value to the flip-flop 486.

The RAS0* signal is provided to a series of flip-flops and gates that generate the auto precharge signals for read and write operations, APRE_W* and APRE_R*, after a burst read or write. A NAND gate 498 receives a burst complete signal for Bank 0 BCP0 (from the burst counter 1400 of FIG. 13) and a write time signal WRTIME (from the CAS control circuitry 600 of FIG. 9A). A flip-flop 500 receives a low value at its data input from the NAND gate 498 only when the BCP0 and WRTIME signals are both high. A data input of a second flip-flop 502 is coupled, through an inverter, to the inverted output of the flip-flop 500. Both of the flip-flops 500, 502 each receive at their clock inputs the CLK signal, and thus, shift the data at their inputs to their outputs whenever the CLK signal goes high. Therefore, when a low value is supplied to the flip-flop 500, and the clock signal CLK goes high, a high value is output from the inverted output, which is then inverted to a low signal and input to the data input of the second flip-flop 502, which in turn, on the second clock high pulse, outputs a high value at its inverted Q* output. A NAND gate 504 receives the high value from the inverted output at one terminal, and receives an automatic precharge latency to signal APRE2 at its other input. Only when the APRE2 signal and the Q* output of the second flip-flop 502 are both high does the NAND gate 504 output a low value for the automatic precharge write signal APRE_W* that initiates auto precharge of the current row line.

Figure 9A:
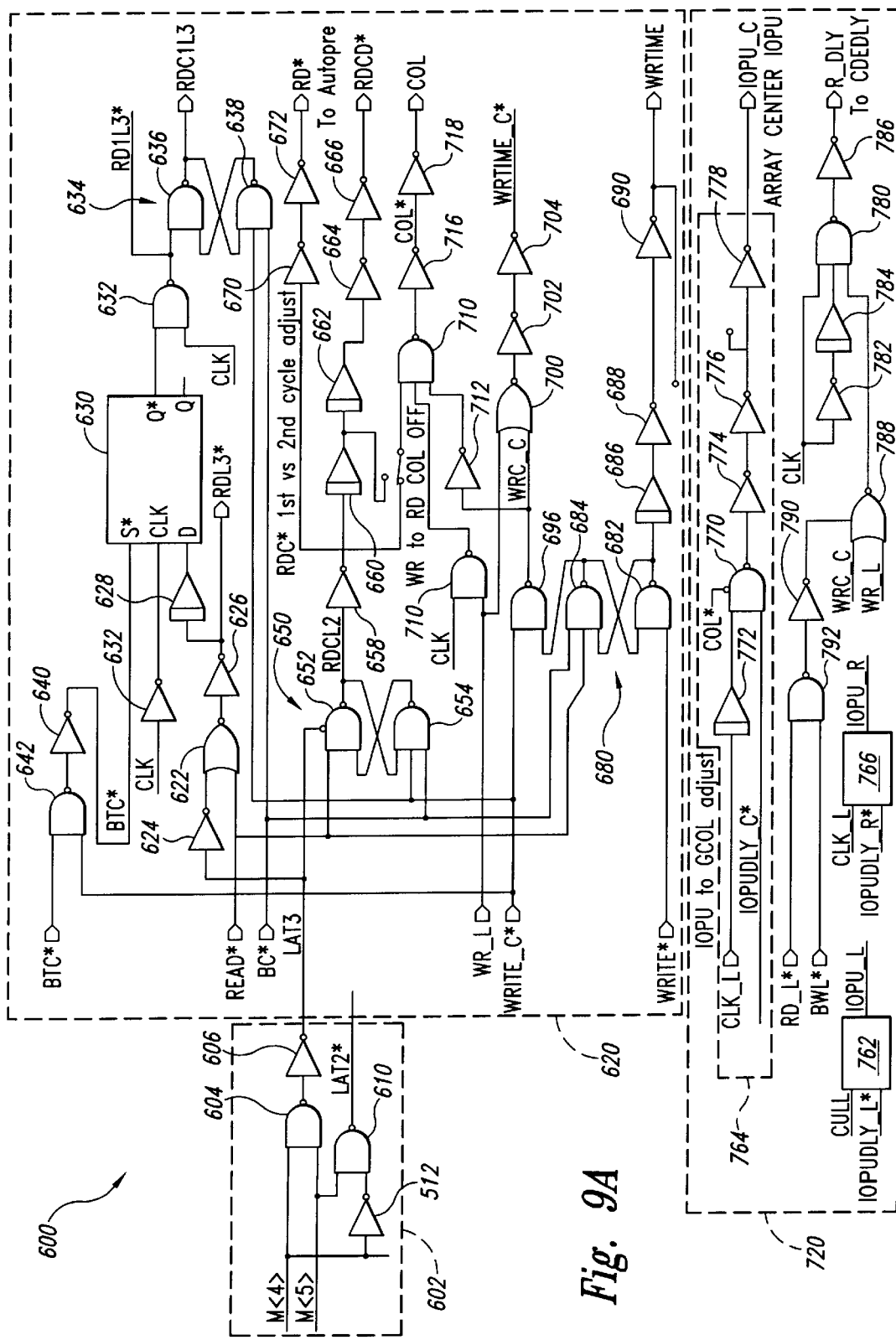
FIGS. 9A, 9C and 9D together form a partial schematic, partial block diagram of CAS control circuitry for the memory device of FIG. 3.

A NAND gate 506 receives the BCP0 signal, and the inverted RD* signal (from the CAS control circuitry 600 of FIG. 9A). The NAND gate 506 only outputs a low value to a data input of a flip-flop 508 when the BCP0 signal is high and the RD* signal is low. When the CLK signal provided to the clock input of the flip-flop 508 goes high, the low value input to the data input terminal causes a high value to be output from the inverted output, which is coupled to a NAND gate 510. The NAND gate 510 outputs a low value for the auto precharge read signal APRE_R* to initiate auto precharge only when it receives a high value from the flip-flop 508, and a high value for either an auto precharge latency 1 or auto precharge latency 2 signal, APRE1 or APRE2, respectively.

The APRE1 and APRE2 signals are produced by a series of NOR gates 512, 516, an input register or flip-flop 514 and first and second registers or flip-flops 518, 520. The NOR gate 512, essentially operating as an OR gate, receives the inverted READ* and WRITE_C* signals to provide a low output to the input flip-flop 514 whenever these signals have a low value (i.e., whenever a read or write operation occurs in the memory device 200). The output of the NOR gate 516 enables the NOR gate 512 whenever both the ARC*8 and inverted BANK0 signals input to the NOR gate 516 have a low value. The first flip-flop 518 receives at its data input a high value for an APRE0 signal from the flip-flop 514 when the NOR gate 512 outputs a low value, and clocks this high APRE0 signal through to its non-inverting output as the APRE1 signal when the CLK signal applied to its clock input transitions to a high value. The input flip-flop 514 is reset when a low RAS signal is applied to its second input, which indicates the beginning of a read or write operation.

The second flip-flop 520 receives the APRE1 signal at its data input, and clocks it therethrough to its non-inverting output as the APRE2 whenever the CLK signal applied to its clock input again transitions. Therefore, the APRE1 signal is output from the first flip-flop 518 after a first clock transition, while the APRE2 signal is output from the second flip-flop 520 after a second clock transition. A pair of multiplexers 522, 524 receives the APRE2 and APRE1 signals and passes these signals therethrough to the NAND gate 518 responsive to a latency 3 signal LAT3 being high and low, all respectively. The LAT3 signal is generated by the CAS control circuitry 600 of FIG. 9A, described below depending on whether the memory device 200 is operating with a read latency of 2 or 3 clock cycles.

Figure 8B:
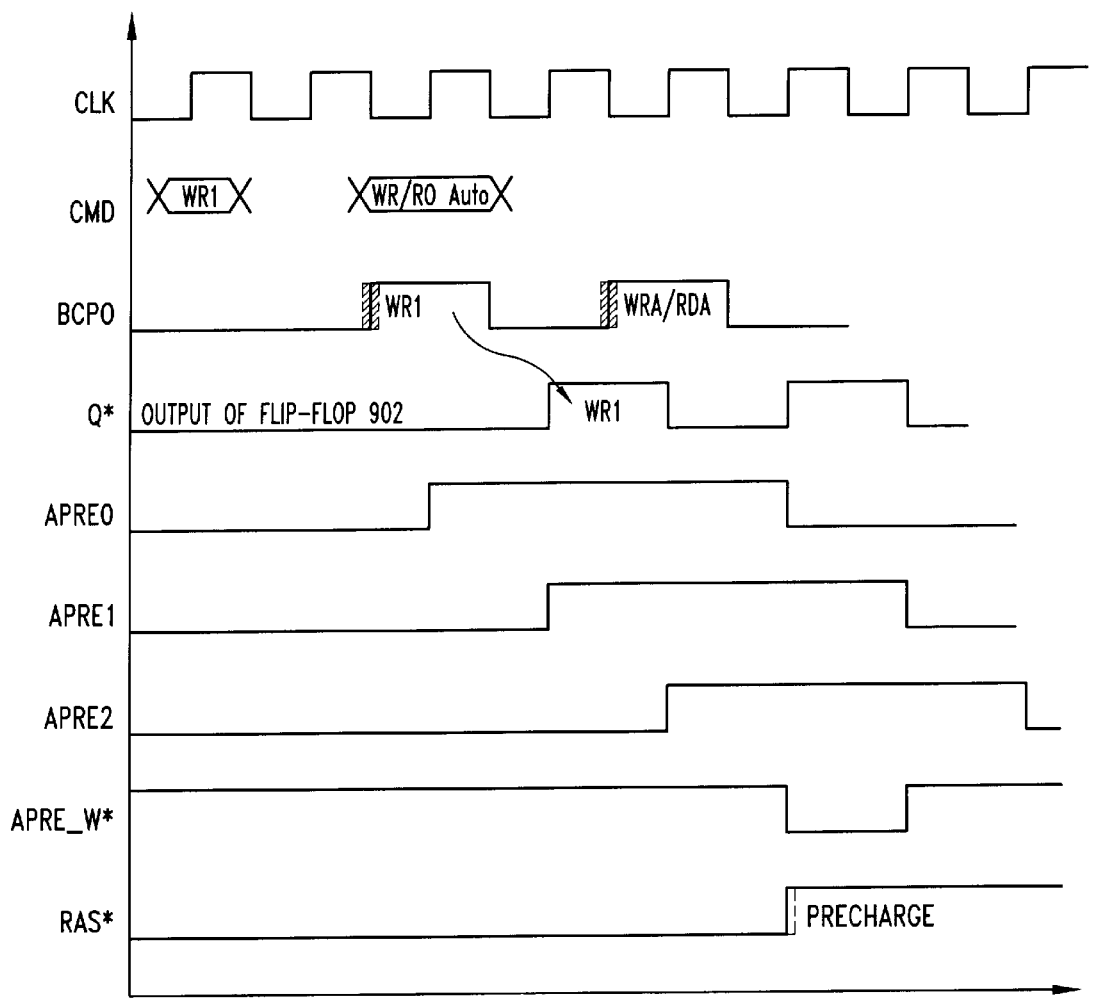
FIG. 8B is a timing diagram of signals produced by the command bank circuitry of FIG. 8A.

Referring to FIG. 8B, a series of timing diagrams show how the command bank circuitry 440 properly provides the auto precharge signals APRE_W* and APRE_R* to correctly auto precharge row lines. The timing diagrams of FIG. 8B show an exemplary read or write operation with auto precharge that follows a write operation, so as to generate an automatic precharge write signal APRE_W* from the NAND gate 504. As is known, automatic precharge occurs at the end of a burst read or write, where the row lines are precharged to put voltage back onto a drained storage capacitor, before turning off that row and moving to another row. Importantly, automatic precharge cannot occur when data is being written to the row.

For example, as shown in FIG. 8B, an initial write command, $WR_1$, can be initially received, and thereafter a read or write command with automatic precharge, WRRD Auto. The WR signals correspond to write command signals such as the WRTIME signal input to the NAND gate 498 and WRITE_C* signal applied to the NOR gate 512, while the RD signal corresponds to read command signals such as the RD* signal applied to the NAND gate 506 and the READ* signal applied to the NOR gate 512.

The burst complete signal BCP is a signal that anticipates the end of the burst operation, and the first pulse in the BCP signal of FIG. 8B corresponds to the initial $WR_1$ write command, while the second pulse corresponds to the WR/R0 Auto signal. As shown in FIG. 8B, the burst complete signal occurs one clock cycle after receiving the command, and becomes active at the falling edges of the clock pulses. One-half of a clock cycle after the BCP0 pulse falls, the flip-flop 502 outputs a high value from its Q* output.

Considering now the input flip-flop 514, and first and second flip-flops 518, 520, the APRE0 signal from the input flip-flop 514 goes high whenever the input flip-flop receives the read or write command signals READ* or WRITE_C*. One clock cycle thereafter, the first flip-flop 518 outputs the APRE1 signal, while a second clock cycle thereafter, the second flip-flop 520 outputs the APRE2 signal. The NAND gate 504 outputs the active low APRE_W* signal when both the Q* output from the flip-flop 502 and the APRE2 signals are high. In response to the low APRE_W* signal, the NAND gate 494 outputs a high value that is inverted, delayed by the delay element 456, and input to the flip-flop 446 to provide a high RAS* signal to initiate automatic precharge. Importantly, the APRE_W* signal is initiated by the APRE2 signal, rather than the APRE1 signal, because the APRE1 signal, combined with the previous Q* output of the flip-flop 502 for the previous write command WRY, could initiate precharge before the WR/R0 AUTO command had been performed by the memory device 200, as can be shown by FIG. 6E.

Overall, the flip-flops 500, 502, 508, 514, 518, 520 appropriately align the APRE signals with the read or write command signals so that automatic precharge is properly timed. For example, with a read latency of 2, the LAT3 signal has a low value, which closes the multiplexer 524, and opens the multiplexer 522, so that the NAND gate 510 receives the APRE1 signal. It is preferably illegal to interrupt the second (autoprecharge) command. However, if such an operation were to occur, since the flip-flops operate based on the CLK signal, the command bank circuitry 440 continues to clock through the second command, and then receives the burst complete signal BCP which will ensure that the flip-flops 500, 508 output an appropriate autoprecharge command.

CAS Control Circuitry

The CAS Control Circuitry 600 illustrated in FIGS. 9A–9D generates control signals for accessing columns of the memory array as well as control signals for use by other circuitry. The circuitry 600 includes a mode decoder 602 which decodes bits M4 and M5 from a mode register (described below) to determine the read latency mode of the memory device 200. As understood by one skilled in the art, although data is output each clock cycle, there is a delay, known as the "latency", between addressing a memory location and reading data from that memory location. The memory device 200 can operate with either a latency of 2 (meaning that data can be read 2 clock cycles after the memory device has been addressed) or a latency of 3. The read latency is determined by bits 4 and 5 of a mode word that is input to the memory device to control various operating parameters.

The mode decoder 602 includes a NAND gate 604 that detects whether $M_4$ and $M_5$ are both high, i.e., $M_5, M_4 = 11$, or decimal 3. The NAND gate 604 then causes an inverter 606 to output an active high LAT3 signal. An active low LAT2* signal is generated by applying the M5 bit to a NAND gate 610 which receives the complement of the $M_4$ bit through an inverter 612. The NAND gate 610 thus decodes $M_5 M_4 = 10$, or decimal 2. Thus, when LAT3 is high, the memory device will operate with a read latency of 3 clock pulses, and when LAT2* is low the memory device will operate with a read latency of 2 clock pulses.

The CAS control circuitry 600 includes a column latch circuit 620 that generates a number of latched control signals. The column latch circuit 620 generates a number of read command latency signals RDC1L3, RD1L3* that control the timing of a read operation according to the latency operating mode. Basically these signals cause a read to occur one clock cycle later when operating in a latency 3 mode as compared to operating in a latency 2 mode. A NOR gate 622 receives an active low READ* signal and the complement of the LAT3 signal applied through an inverter 624. Thus, the NOR gate 622 will output a high whenever a read with a latency 3 occurs. The high from the NOR gate 622 is applied to an inverter 626 which applies a low to a delay circuit 628. Thus, a short time after READ* goes low with LAT3 high, a low is applied to the D input of a flip-flop 630. The flip-flop 630 has a clock input that receives the inverse of the CLK signal through an inverter 632. On the falling edge of CLK, the low-to-high transition at the output of the inverter 632 clocks the low from the D input to generate a high at the Q* output of the flip-flop 630 which enables a NAND gate 632. On the subsequent leading edge of CLK, the NAND gate 632 outputs a low, thereby setting a flip-flop 634 formed by a pair of NAND gates 636, 638 and outputting an active low RD1L3* pulse coincident with the CLK pulse and one CLK pulse after READ* goes low. The NAND gate 636 then continuously outputs a high read command latency 3 RDC1L3 signal until the flip-flop 634 is reset.

The flip-flop 634 is reset when either an active low write command WRITE_C* signal or an active low burst complete BC* signal from the burst counter 230 (FIG. 1) shown in detail in FIG. 13 is applied to the NAND gate 638, as long as the flip-flop 630 has been set so that the NAND gate 632 applies a high to the NAND gate 636. The flip-flop 630 is set whenever an inverter 640 applies a low to the S* input of the flip-flop 630. The inverter 640 outputs a low to set the flip-flop 630 whenever a NAND gate 642 outputs a high, which in turn, occurs whenever the NAND gate 642 receives either an active low burst terminate command BTC* signal from the burst counter 230 or a low write command WRITE_C* from the command decoder 212 (FIG. 6A). Thus, the NAND gate 642 operates essentially as an OR gate to set the flip-flop 630 and allow the flip-flop 634 to be reset whenever either burst transfer complete BTC* signal or a write WRITE_C* signal goes low. As mentioned above, the flip-flop 634 is reset by either when BC* or WRITE_C* goes low. Thus, the flip-flop 634 is reset to terminate the active high read command latency 3 RDC1L3 signal whenever either the write command WRIT_C* signal goes active low at the start of a write memory access or the burst terminate command BTC* signal is active low and the burst complete BC* signal is active low at the end of a burst mode transfer.

The column latch 620 circuit also generates a set of read commands for a latency 2 read operation. A flip-flop 650 is formed by a pair of NAND gates 652, 654, one of which 652 receives the active low READ* signal. The NAND gate 652 also has an active low enable input that receives the active high LAT3 signal. Thus, when READ* is low and LAT3 is not high, i.e., a read with a latency of 2, the flip-flop 650 is set to output an active high read command latency 2 RDCL2 signal. The flip-flop 650 is reset to terminate the RDCL2 signal whenever the flip-flop 654 receives a low WRITE_C* signal or a low BC* signal, as explained above. Thus, the active high read command latency 2RDCL2 signal terminates whenever either the write command WRITE_C* signal or the burst complete BC* signal goes active low. Therefore, the read command latency 2RDCL2 signal is terminated under the same conditions as the read command latency 3 RDC1L3 signal except that it does not require that the burst terminate command BTC* be asserted low with the low burst complete BC* signal.

The RDCL2 signal at the output of the NAND gate 652 is used to generate a number of other read signals. Specifically, the RDCL2 signal is applied through an inverter 632 to a pair of delay circuits 660, 662 and further inverted twice by two inverters 664, 666 to generate an active low read command RDCD*. The read command RDCD* is simply a delayed version of RDECL2. The output of the inverter 658 is also inverted twice by two inverters 670, 672 to generate an active low read RD* signal which is the complement of RDCL2.

The column latch 620 circuit also generates a set of write commands. A flip-flop 680 formed by a pair of NAND gates 682, 684 is set whenever an active low write signal WRITE* goes low. The high at the output of the NAND gate 682 is applied to a delay circuit 686 and then inverted twice by two inverters 688, 690 to generate an active high write time WRTIME signal. As explained above, the WRTIME signal is used by the Bank Command Circuitry shown in FIG. 8A. The flip-flop 680 is reset to terminate the WRTIME signal by either an active low read READ* signal or an active low burst complete BC* signal applied to the NAND gate 684.

Figure 9B:
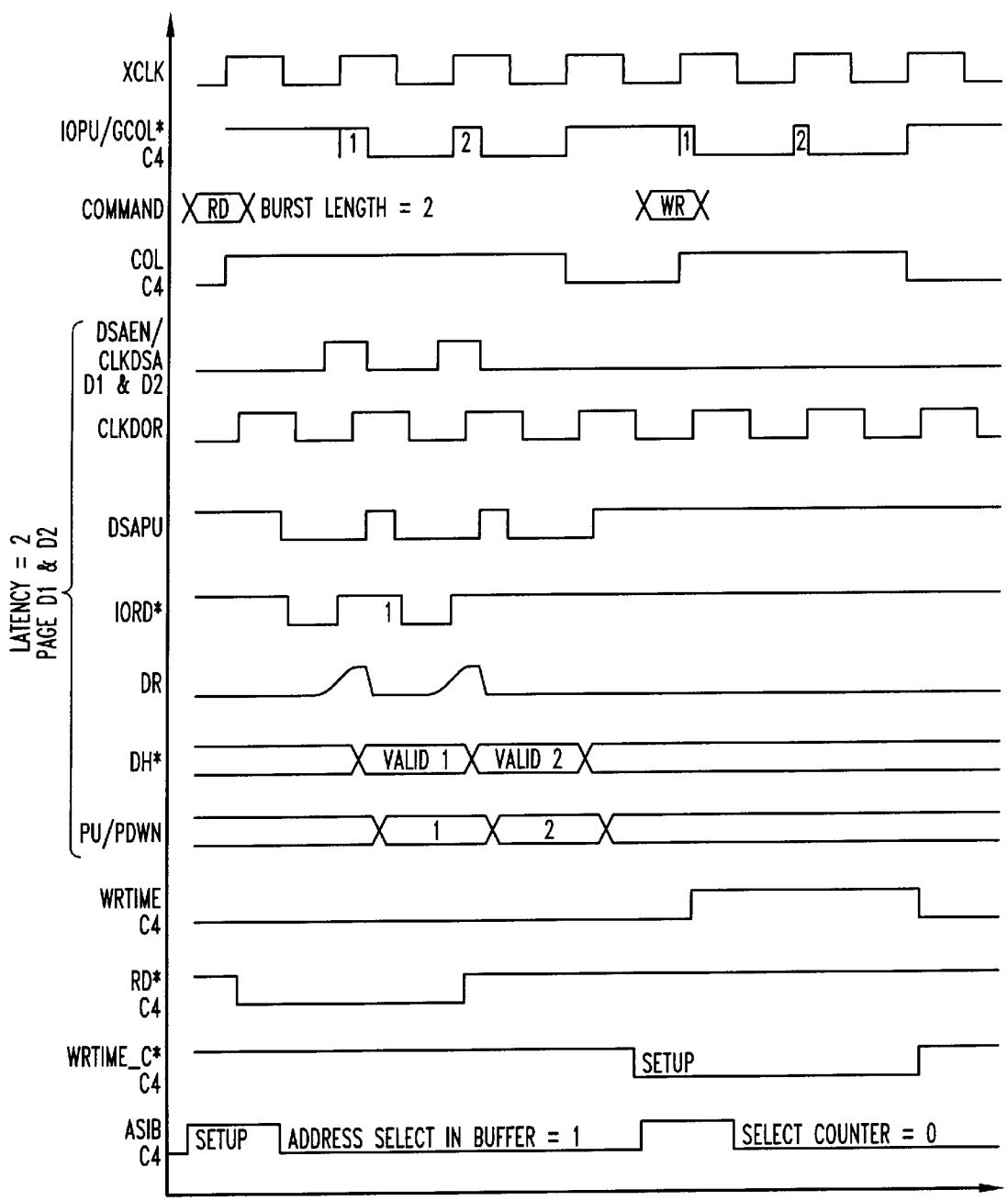
FIG. 9B is a timing diagram of signal waveforms produced by the CAS control circuitry of FIGS. 9A, 9C and 9D, and data path and data block circuitry of FIGS. 20–21.

FIG. 9B shows various waveforms produced by the memory device 200. Specifically, FIG. 9B shows the WRTIME signal, as well as IOPU, GCOL*, COL, RD*, WRTIME_C* and ASIB signals produced by the CAS control circuitry of FIGS. 9A, 9C and 9D, as explained herein. FIG. 9B also shows signals DSAEN, CLKDSA, CLKDOR, DSAPU, IORD*, DR, DH*, PU and PDWN, as described below with respect to the address path and data block circuitry of FIGS. 20–21.

The output of the NAND gate 684, which is low when WRTIME is high, is applied to a NAND gate 696 that also receives the active low write command WRITE_C* signal. When WRITE_C* goes low, the NAND gate 696 outputs a high WRC_C signal, and is then subsequently maintained high by the low at the output of the NAND gate 684 when the flip flop 680 is set. Thus, the WRC_C may be generated before the flip-flop 680 is set. The high at the output of the NAND gate 696 causes the output of a NOR gate 600 to output a low which, after being twice inverted by inverters 602, 604, results in an active low WRTIME_C* signal. In addition to being used by the Bank Command Circuitry as explained above, the WRTIME_C* signal is used to bias I/O lines in the array between transfers a data to and from the memory array, as explained below. The active low WRTIME_C* signal is terminated when WR_L and WRC_C go low. WRC_C goes low when WRITE_C* goes high and either the READ* signal or the BC* signal goes active low, thereby resetting the flip-flop 680 to terminate the WRTIME signal.

The WRC_C signal at the output of the NAND gate 696 is also applied to one input of a NOR gate 610 through an inverter 612. The other input of the NAND gate 610 is connected to the output of a NAND gate which goes low on the leading edge of CLK when WR_L is high. A third input to the NAND gate 610 receives the RDC* signal from the output of the inverter 658. Recall that the RDC* signal goes active low when READ* goes active low and LAT3 is not high, i.e., a read with a latency of 2. The RDC* signal low terminates whenever either the write command WRITE_C* signal or the burst complete BC* signal goes active low. The NAND gate 610 essentially performs an OR function in which it detects when either RDC* goes active low, or WRC_C* or WR_L goes active high.

In operation, the output of the NAND gate 610 goes high whenever RDC* goes active low or on the leading edge of the clock occurring after WR_L has gone active high. In the case of WR_L going high, the output of the NAND gate 610 is held low after the falling edge of CLK by WRC_C having gone high by that time after the flip-flop 680 having been set by WRITE* going active low. The high output of the NAND gate 610 is coupled through two inverters 616, 618 to output a high column COL signal. Thus, an active high COL signal is generated whenever either a read or a write occurs, i.e., a low RDC* signal or high WR_L and WRC_C signals. As explained below, the COL signal is used by the Burst Counter Circuitry of FIG. 13A, the Column Counter Circuitry of FIG. 16, and other circuitry for providing signals to access columns of the memory arrays. The active high COL signal terminates when the flip-flop 650 is reset by a low WRITE_C* signal or a low BC* signal, or when the flip-flop 680 is reset by a low READ* signal or a low BC* signal as long as the WRITE_C* signal is no longer low.

Figure 9C:
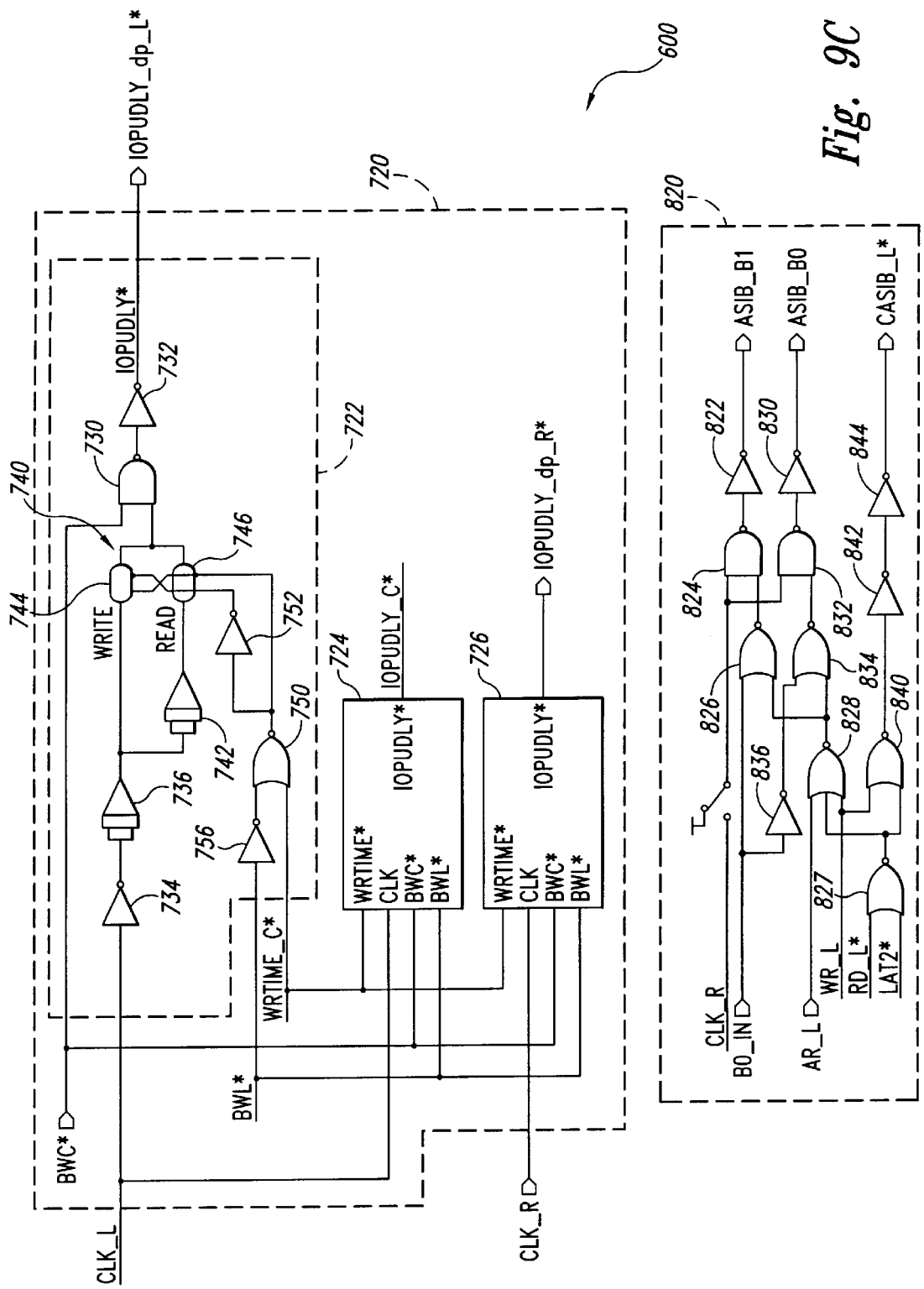

The CAS control circuit 600 also includes an I/O Pull-Up Delay Circuit 720 which is shown in FIG. 9C. As explained in greater detail below, the I/O Pull-Up Delay Circuit 720 applies I/O pull-up signals to bias the I/O lines of the memory array between memory accesses. Unlike prior art memory devices, the duration of the I/O pull-up signals are varied depending on whether the memory access is a read or a write to optimize the operating speed of the memory device. Basically, the I/O pull-up signals are applied to the I/O lines of the memory array for a longer time during a read access since there is longer delay from the start of a read operation to data from the array being applied to the I/O lines. In contrast, in a write access, the data from the data bus is available very shortly after the start of a write operation. The I/O Pull-Up Delay Circuit 720 also prevents an I/O pull-up signal from being generated during the middle of a block write operation, as explained in greater detail below.

The I/O Pull-Up Delay Circuit 720 includes three identical pull-up circuits 722, 724, 726. The pull-up circuit 722, which is described in detail herein, generates an active low I/O pull-up IOPUDLY__dp__L* signal for the I/O lines in the left side of the memory array (array 211A'). The pull-up circuits 724, 726 generate respective active low I/O pull-up signals, IOPUDLY__dp__C* and IOPUDLY__dp__R*, for the I/O lines in the center and right sides of the memory array, respectively (arrays 211B, 211A").

The pull-up circuit 722 includes a NAND gate 730 that is normally enabled by the block write command BWC* being inactive high. The NAND gate 730 generates an active low I/O pull-up IOPUDLY__dp__L* signal at the output of an inverter 732 whenever its other input goes low. Basically, the other input is driven low by the CLK__L signal applied through one of two delay paths, with the delay of each path being longer for a read than a write. More specifically, the CLK__L signal is applied through an inverter 734 to a first delay circuit 736 which applies the inverted and delayed CLK__L signal to one input of a multiplexer 740 directly and to the other input through a second delay circuit 742. The multiplexer is formed by two pass gates 744, 746 which are controlled by the output of a NOR gate 750 applied directly to one control input and through an inverter 752 to the other control input. The outputs from the NAND gate 750 and inverter 752 are applied to the pass gates 744, 746 in opposite order so that the pass gates 744, 746 are alternately enabled. The NOR gate 750 receives the active low WRTIME__C* signal directly and the active low block write latched BWL* signal through an inverter 756.

In operation, in a write memory access, the WRTIME__C* signal is low and the BWL* signal is initially high so that the NOR gate 750 outputs a high to enable the pass gate 744 and disable the pass gate 746. The low IOPUDLY__dp__L* signal is then generated after the leading edge of CLK__L by the delay of the delay circuit 736. In a read memory access, the WRTIME__C* signal is high so that the NOR gate 750 outputs a low to enable the pass gate 746 and disable the pass gate 744. The low IOPUDLY__dp__L* signal is then generated after the leading edge of CLK__L by the sum of the delay of the delay circuit 736 and the delay of the delay circuit 742.

As mentioned above, although a normal write occurs during a single clock cycle, a block write requires two clock cycles. Thus, since the I/O lines of the memory array should not be pulled up during the block write operation, the I/O pull up IOPUDLY* signals must be inhibited on the second CLK__L after the start of a block write operation. During a block write memory access, the block write latch BWL* signal goes low on the trailing edge of CLK__L and extends for one CLK__L cycle, i.e., until the next trailing edge of CLK__L. Thus, on the trailing edge of CLK__L, the output of the NAND gate 730 is forced high to force the IOPUDLY__dp__L* signal low during the next CLK__L pulse until the trailing edge of CLK__L. However, since IOPUDLY__dp__L* is the delayed and inverted CLK__L signal, IOPUDLY__dp__L* does not go high until the selected delay (to delay of delay circuit 736 or the delay of both delay circuits 736, 742) has expired. Thereafter, since BWC* has gone high on the trailing edge of CLK__L, IOPUDLY__dp__L* once again goes low for the selected delay period after the leading edge of CLK__L. Since the block write latch BWL* signal forces the IOPUDLY__dp__L* signal low from the trailing edge of CLK__L to the trailing edge of the next CLK__L, the BWL* signal inhibits IOPUDLY__dp__L* from going low a during the CLK__L signal after BWL* goes active low.

The I/O pull-up IOPUDLY* signals from each of the pull-up circuits 722, 724, 726 is applied to a respective delay circuit 762, 764, 766 shown in FIG. 9A. The delay circuits 762, 764, 766 are identical to each other, so only the delay circuit 764 receiving the center pull-up signal IOPUDLY__dp__C* will be described in detail herein. The delay circuit 764 includes a NAND gate 770 that receives the CLK__L signal through a delay circuit 772. The NAND gate 770 is selectively enabled by an active low COL* signal which, as explained above, is generated whenever either a read or a write occurs, i.e., a low RDC* signal or high WR__L and WRC__C signals.

The delay of the delay circuit 772 is relatively short compared to the delay of the delay circuit 736. Since IOPUDLY__dp__C* is a delayed and inverted version of CLK__L, the falling edge of IOPUDLY__dp__C* follows the rising edge of CLK__L by an "I/O delay" that is substantially the delay of the pull-up circuit 722 less the delay of the delay circuit 772. The time between the rising edge of CLK__L and the falling edge of IOPUDLY__dp__C* is equal to the duration of the I/O delay. During this time, both inputs to the NAND gate 770 are high so that the NAND gate 770 applies a low through a series of three inverters 774, 776, 778 to generate a high I/O pull-up IOPU__C signal for the center section of the memory array. Thus, during a read or a write operation when COL* is low, the delay circuits 722, 724, 726 generate respective, active high I/O pull-up IOPU signals starting shortly after CLK__L and terminating after a delay that is longer for a read than it is for a write.

As explained below, in order to maximize the operating speed of the memory device 200, it is important to minimize the time between pulling up the I/O lines with the pull-up IOPU signals and connecting the I/O lines to the digit lines of the array with a global column command. Since the global column line is synchronized to the clock CLK and the duration of the pull-up IOPU signals is fixed for a read or a write, the time between connecting the I/O lines to the digit lines and connecting the I/O lines to the digit lines can be adjusted by adjusting the clock CLK frequency.

Although the delay circuits 762, 764, 766 are all shown as being part of the CAS Control Circuitry 600, it will be understood that they need not all be located on the same area of the semiconductor die. In fact, it is preferable that the delay circuits 762, 764, 766 be at different locations, i.e., the delay circuit 762 generating the pull-up signal IOPU__L for the left side of the memory array be located at the left side of the die, the delay circuit 764 generating the pull-up signal IOPU__C for the center of the memory array be located at the center of the die, and the pull-up circuit 766 generating the pull-up signal IOPU__R for the right side of the memory array be located at the right side of the die. By distributing the CLK__L signal to the delay circuits 762, 764, 766 located throughout the die close to their respective I/O lines, the critical start of the pull-Up IOPU pulses can be more precisely controlled.

The I/O Pull-Up Delay Circuit 720 shown in FIG. 9A also includes circuitry for generating a read delay R__DLY signal from various other signals. Specifically, a NAND gate 780 receives the CLK signal both directly and through an inverter 782 and delay circuit 784. Thus, these inputs to the NAND gate 780 are both high during the period between the rising edge of CLK a and the delayed and inverted rising edge of CLK. When the NAND gate 780 is enabled, the NAND gate 780 causes an inverter 786 to output an active high RD_DLY pulse starting at the leading edge and having a duration equal to the delay of the delay circuit 784 and the inverter 782.

The NAND gate 780 is enabled to generate the R_DLY pulses at all times except when the output of a NOR gate 788 is low. The NOR gate 788 will output a low to disable the NAND gate 780 whenever it is enabled and either WRC_C or WR_L is active high, i.e., a write operation is in progress. The NOR gate 788 is enabled whenever the output of an inverter 790 is high which occurs whenever the output of a NAND gate 792 is low. The output of the NAND gate 792 will be low whenever both RD_L* and BWL* are inactive high. Thus, K_DLY pulses will be generated at all times except when either WRC_C or WR_L is active during a write and both RD_L* and BWL* are inactive high during a write other than a block write.

Whenever a write command is received by the memory device 200, the WR_L signal is sent almost immediately downstream, from the command latch circuitry 218 (FIG. 6) to ensure that the NAND gate 780 outputs a high, inverted by the inverter 786, to produce a low R_DLY. Thereafter, when CLK goes high and WR_L goes low, the clocked write signal WRC_C from the command latch circuitry 218 (FIG. 6) goes, and stays, high, to thus continue to ensure that the NAND) gate 780 outputs a high, inverted by the inverter 786, to produce a low R_DLY. However, when a read command is received by the memory device 200, the RD_L signal is sent almost immediately downstream, from the command latch circuitry 218, through the NAND gate 792 and inverter 790 to provide a low disable input signal to the NOR gate 788, which substantially immediately provides a high input to the NAND gate 780. Thus, a read command can almost immediately shut off a previous write command from affecting the R_DLY signal. Thereafter, when CLK goes high and RD_L goes low, the clocked read signal READ* from the command latch circuitry 218 that is input to the NAND gate 784 resets this flip-flop and causes the NAND gate 796 to output a low WRC_C to the NOR gate 788 to thus continue to ensure that the NOR gate provides a high input to the NAND gate 780.

The CAS control circuitry 600 also includes a command decoder 800, shown in FIG. 9]), that generates a column command signal CCMD and a load burst counter LDBC signal. The CCMD signal is generated at the output of an inverter 802 whenever a NOR gate 804 driving the inverter 802 detects either a latched write signal W_L or the complement of a READ* signal applied to the NOR gate 804 through an inverter 806. Thus the CCMD signal is generated during both a write and a read operation.

The LDBC signal is generated to load a burst counter (FIG. 13) as described below during a time depending on the latency mode in which the memory device 200 is operating. In the latency 3 mode, the high LAT3 signal causes a NOR gate 810 to output a low regardless of the state of READ* as long as the NOR gate 810 is enabled by the inactive high WRITE_C* signal. The low at the output of the NOR gate 810 is inverted by second NOR gate 812 which is normally enabled during operation by an active low power up PWRUP* signal. The NOR gate 812 thus outputs a high to enable a NAND gate 814. The NAND gate 814 outputs a high LDBC signal coincident with an active low read latency 3 RD1L3* signal applied to NAND gate 814. Thus, in the latency 3 mode, the NAND gate 814 outputs a high LDBC signal coincident with a low RD1L3* signal. As explained above with reference to the column latch circuit 620, the RD1L3* signal goes low one CLK pulse after READ* goes low. Thus, in the latency 3 mode, the NAND gate 814 outputs a high LDBC signal one CLK pulse after READ* goes low.

If the memory device 200 is operating in the latency 2 mode, LAT3 is low, thereby allowing the NOR gate 810 to output a high responsive to an active low READ* signal as long as the NOR gate 810 is enabled by the active low WRITE_C* signal being high. The high at the output of the NOR gate 810 is inverted by the second NOR gate 812 which, as mentioned above, is normally enabled during operation by an active low power up PWRUP* signal. The NOR gate 812 thus outputs a low to a NAND gate 814 to cause the NAND gate to output a high LDBC signal. Thus, in the latency 2 mode, the NAND gate 814 outputs a high LDBC signal coincident with a low READ* signal. In contrast, as explained above, in the latency 3 mode, the NAND gate 814 outputs a high LDBC signal one CLK pulse after READ* goes low.

In the event that WRITE_C* is active low, the NOR gate 810 is disabled so that its output it held high. This high output causes the NOR gate 812 to output a low which, in turn, causes the NAND gate 814 to continuously output a high regardless of the state of the other inputs.

The CAS control circuitry 600 also includes an address select input buffer circuit 820, shown in FIG. 9C, that generates various input buffer selection signals. An active high address select input buffer ASIB_B1 signal is generated at the output of an inverter 822 coincident with CLK_R applied to a NAND gate 824 whenever both inputs to a NOR gate 826 are low. One input to the NOR gate 826 will be low whenever a bank select signal B0_IN is low. The other input to the NOR gate 826 will be low when a NOR gate 828 detects that an activated row latched AR L signal or a write latch signal WR_L is high or when a NOR gate 82T detects that a read latch signal RD_L* signal and a LAT2* signal are both active low, i.e., a read with a latency 2.

In a similar manner, an active high ASIB_B0 signal is generated at the output of an inverter 830 coincident with CLK_R applied to a NAND gate 832 whenever both inputs to a NOR gate 834 are low. The inputs to the NOR gate 834 will be low for the same conditions that cause the inputs to the NOR gate 824 to be low except that, since the B0_IN signal is inverted by an inverter 836, all inputs to the NOR gate 834 will be low when the bank select signal B0_IN is high. Thus, an active high ASIB signal will be generated coincident with the CLK signal if AR_L or WR_L are high or RD_L* and LAT2* are low, i.e., responsive to either an activated row latched, a write or a read with a latency 2. The ASIB signal with be an ASIB_B0 signal for a Bank 0 if the bank select signal B0_IN is high, and an ASIB_B1 signal for a Bank 1 if the bank select signal B0_IN is low.

The address select input buffer circuit 820 also generates a latched active low column address select input buffer CASIB_L* signal whenever either a write occurs or a read with a latency of two occurs. Specifically, the CASIB_L* signal is generated by a NOR gate 840 after being inverted twice by two inverters 842, 844. The NOR gate 840 generates the active low CASIB_L* signal whenever the active high latched write WR_L signal is high or a NOR gate 846 detects that active low read latched RD_L* and LAT* signals are both low, i.e., a read with a latency of two.

Figure 9D:
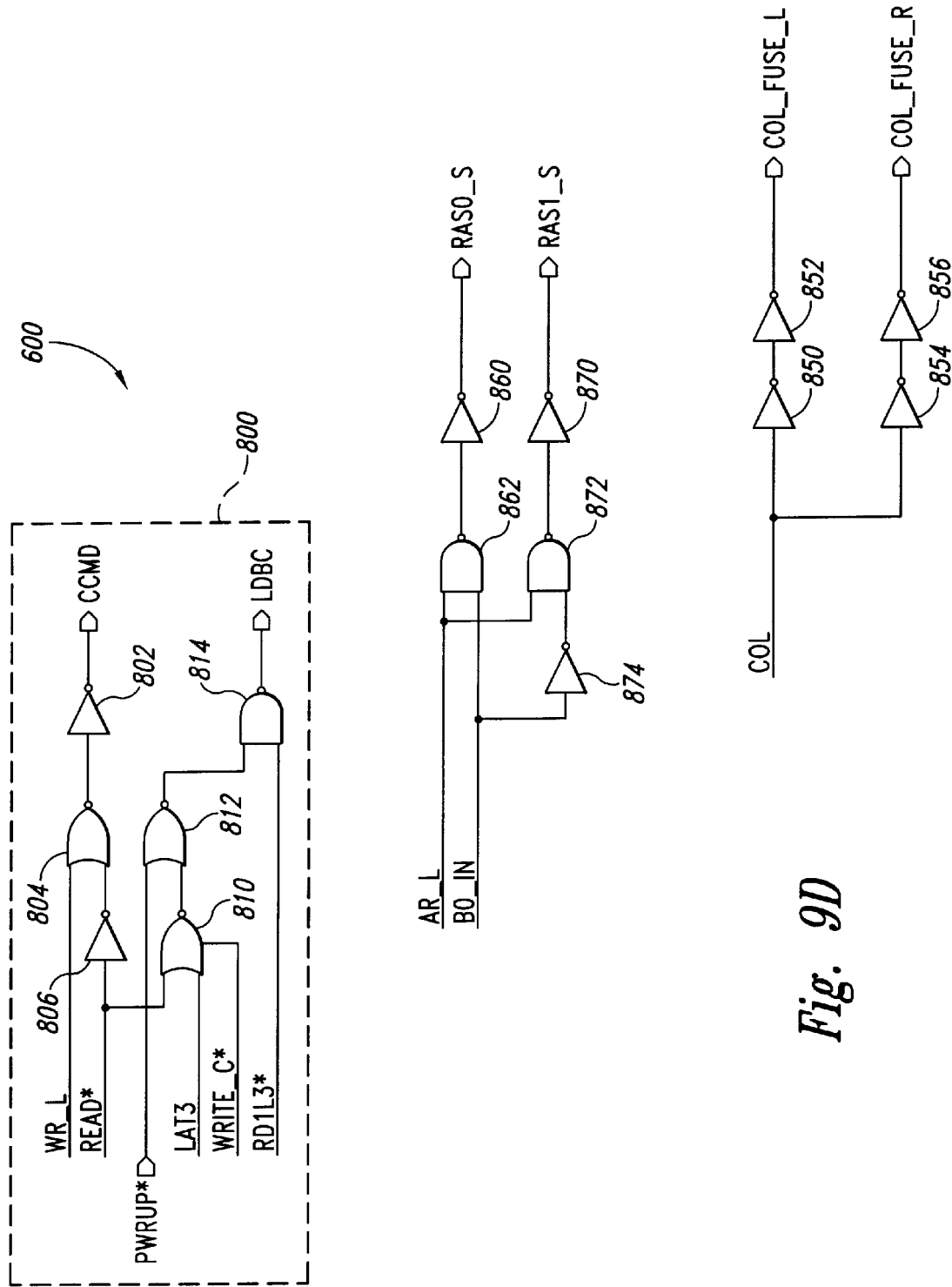

The address select input buffer circuit 820 also generates buffered signals for use in other portions of the memory device 200. With reference to FIG. 9D, the column COL signal is coupled through two inverters 850, 852 to generate a latched column fuse signal COL_FUSE_L for use by the left half or side of the memory array. Similarly, a latched column fuse signal COL_FUSE_L for use by the left side of the memory array is generated by twice inverting the column COL signal using two inverters 854, 856.

Finally, the address select input buffer circuit 820 generates a row address select Bank 0 RAS0_S signal at the output of an inverter 860 when an active high activated row latched AR_L signal from the command decoder 212 (FIG. 6A) is detected by a NAND gate 862 and Bank 0 is selected by B0_IN being high. Similarly, a row address select Bank 1 RAS1_S signal is generated at the output of an inverter 870 when an active high activated row latched AR_L signal is detected by a NAND gate 872 and Bank 0 has been selected by the output of an inverter being high because B0_IN is low.

Address Input Circuitry

Figure 10A:
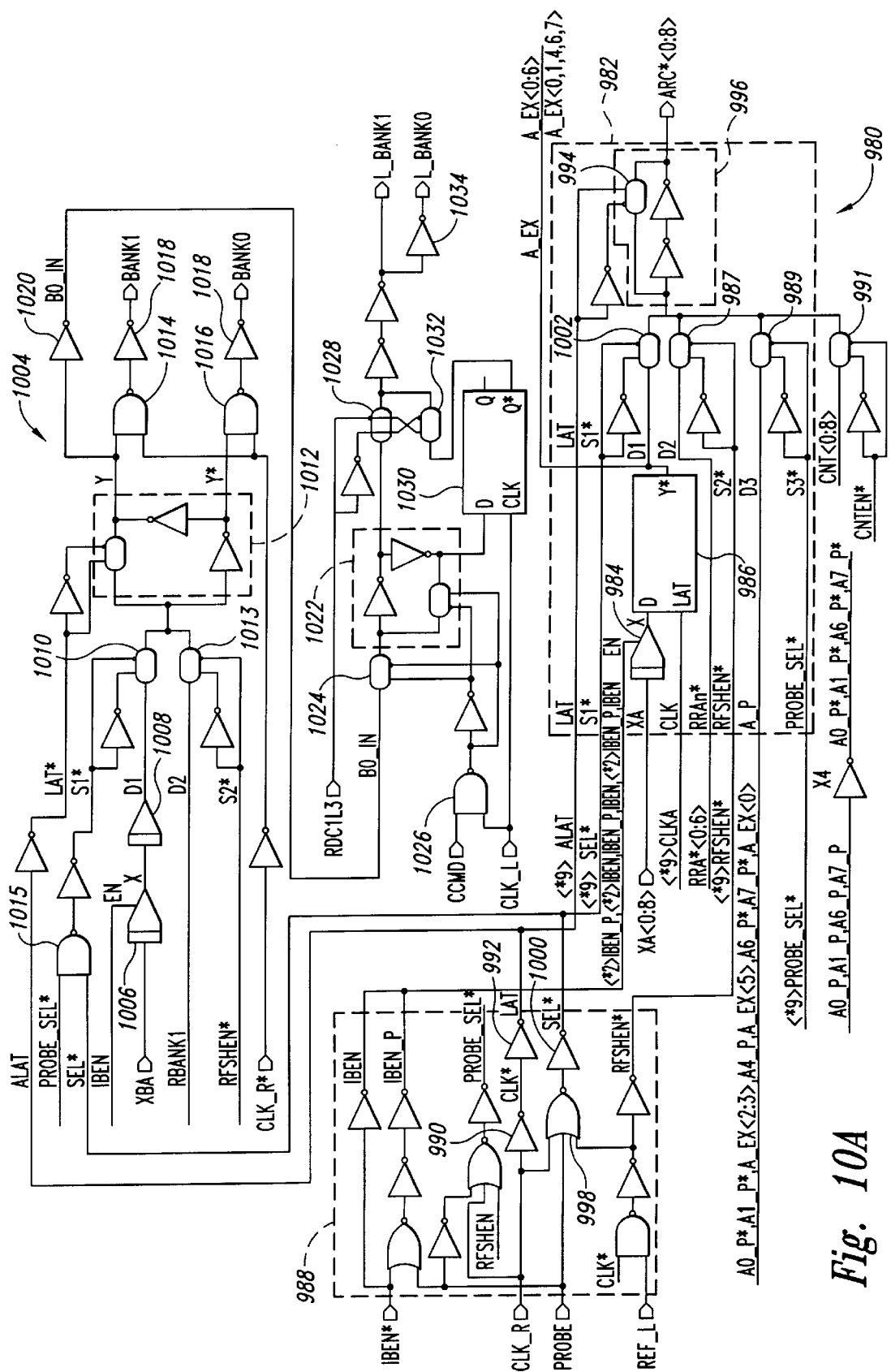
FIG. 10A is a partial schematic, partial block diagram of address input circuitry for the memory device of FIG. 3.

Referring to FIG. 10A, address input circuitry 980, which is part of the address register 226 (FIG. 3), is shown in more detail. Nine address input latch circuits 982, only one of which is shown, each receive one bit from the external address A0_—A8 at an input buffer 984. A latch 986, similar to those described herein, receives one bit of the address A0–A8, and is clocked therethrough by the CLKA signal (FIG. 5). An address control circuit 988 includes a NAND gate 990, having a first terminal held high, and a second terminal that receives the CLK_R signal (FIG. 5). The NAND gate 990, and an inverter 992 coupled thereto, delays and amplifies the CLK_R signal as a latch signal ALAT, which controls a multiplexer 994 in an address latch 996 to latch the address output from the latch 986. Similarly, a NOR gate 998, and an inverter 1000 coupled thereto, delays, amplifies and inverts the CLK_R signal as a select signal SEL*, which controls a pass gate or multiplexer 1002 to selectively route the address output from the latch 986 to the input of the latch 996 when SEL* is low.

The remaining circuitry in the address input latch and address control circuits 982, 988 allow alternative addresses, test vectors, refresh addresses or other data to be input over the address pads XA0–8, based on PROBE, IBEN*, REF_L signals that control several multiplexers in the address input circuit. For example, a refresh row address signal RRA*0–8 (described below) can be input to the latch 996 when a refresh enable signal RFSHEN* is applied to a multiplexer 997. As an additional example, the address pads can be remapped from those currently assigned to address inputs A0_P–A7_P, which are selected by a PROBE_SEL* signal applied to a multiplexer 989, as is described in detail in the inventors' copending U.S. application Ser. Nos. 08/619, 594 and 08/779,036, filed Mar. 18, 1996 and Jan. 6, 1997, entitled "CIRCUIT AND A METHOD FOR CONFIGURING PAD CONNECTIONS IN AN INTEGRATED DEVICE" and "HIGH SPEED TEST SYSTEM FOR A MEMORY DEVICE", all respectively. Moreover, an address counter signal CNT0–8 can be input to the latch 996 when the address control circuit 988 provides the CNTEN* signal to a multiplexer 991.

Figure 10B:
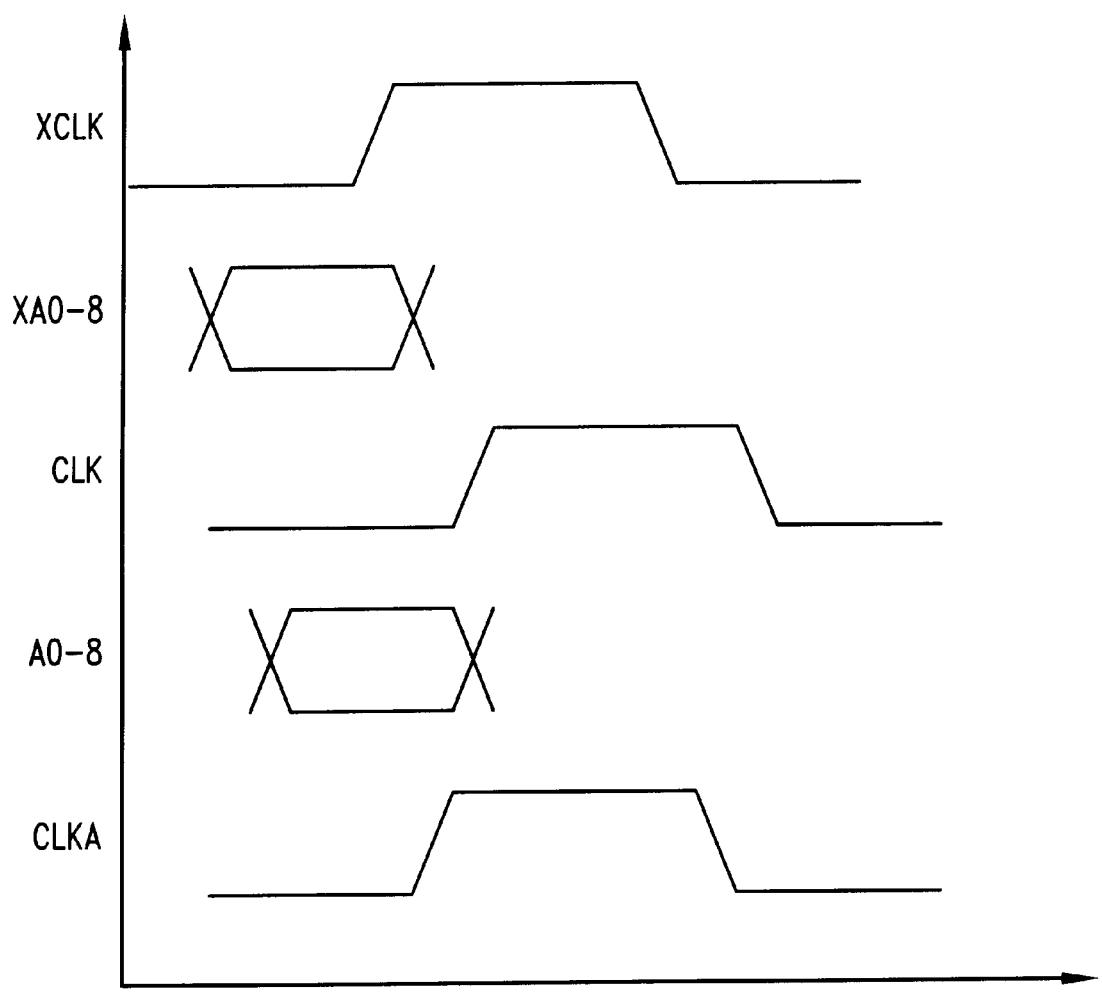
FIG. 10B is a timing diagram of clock, input and output signal waveforms for the address input circuitry of FIG. 10A.

As noted herein, the CLKA signal is generated within the memory device 200 immediately after the XCLK signal passes through an input buffer, and therefore is not delayed by a string of logic gates. Referring to the timing diagrams of FIG. 10B, an external address signal XA0–XA8 can be received before the rising edge of the external clock signal XCLK. Due to internal delays and buffering, the external address signal XA0–8 can be delayed only slightly, to become an internal address signal A0–A8, while the XCLK signal can be more significantly delayed before it becomes the internal clock signal CLK. Therefore, as shown in FIG. 10B, the CLK signal can transition to a active (high) value after receiving the A0–8 signal. Consequently, as described herein, the ACLK signal is generated immediately after buffering the XCLK signal, unlike the CLK signal, and thereby does not incur any significant delays beyond those from the input buffer 984.

Thus, when the CLKA signal transitions to a high value, the A0–8 signal is still present at the input of the latch 986, thereby allowing the CLKA signal to trap the A0–8 signal in the latch before the A0–8 signal is gone. As a result, the ALAT signal, which is based on the CLK_R signal, allows the latch 996 to receive the input address signals XA0–8 when CLK is low, and then latches the address signals therein when CLK (LAT) goes high. Such inputting of signals during CLK low, and then latching such signals in the latch 996 when CLK is high, applies equally to the refresh address signals RRA, address counter signals CNT0–8, etc.

A bank latch circuit 1004 receives the external bank select signal XBA at an input buffer 1006, delays it through a delay gate 1008 and passes it through a pass gate or multiplexer 1010 to an input latch 1012. The SEL* signal from the address control circuit 988 closes the multiplexer 1010, while the ALAT signal latches the XBA signal in the latch 1012. Alternatively, the RBANK1 signal can be input to the latch 1012 when the RESHEN* signal is low to close a multiplexer 1013, and the SEL* and PROBE_SEL* signals are high to cause a NAND gate 1015 to open the multiplexer 1010. As with the latch 996, the latch 1012 likewise allows the XBA and RBANK1 signals to be latched therein when CLK (i.e., ALAT) is low, and then to be latched therein when CLK goes high. Such operation of the input latches 996, 1012 and other input latches herein operate substantially similarly.

A first NAND gate 1014 receives the CLK signal and the non-inverted output of the latch 1012, and only outputs an active low when both CLK and XBA are high. Likewise, a second NAND gate 1016 receives the CLK signal and the inverted output of the latch 1012, and only outputs an active low when CLK is high, but XBA is low. The CLK_R* signal, which is input to the NAND gates 1014, 1016, validates the inverted and noninverted signals output from the latch 1012, and therefore, such signals are valid only when CLK_R* is high. A pair of inverters 1018, 1019 invert the outputs of the NAND gates 1014, 1016 to provide bank select signals BANK1 and BANK2, respectively, to control the generation of the RAS* signal, as noted above. Thus, in operation, if XBA is low, the inverted output of the latch 1012, the NAND gate 1016 and the inverter 1018 output a high (active) BANK0 signal to select Bank 0. Conversely, if XBA is high, the non-inverted output of the latch 1012, the NAND gate 1014 and the inverter 1019 output a high BANK1 signal to select Bank 1.

An inverter 1020 inverts the XBA signal output from the latch 1012 to produce a BANK 0 input signal B0_IN that is input to a latch 1022 when a multiplexer 1024 is closed by a high column command signal CCMD and CLK signal provided to a NAND gate 1026. During each column access (CCMD high) and when CLK is high, a new address applied to the external address pins, including the XBA pin, is input to the latch 1022. Therefore, during each column access, B0_IN can have a different value, which is input to the latch 1022.

Thereafter, when CLK falls to a low value, then the B0_IN signal is latched in the latch 1022 and output from the inverting output as a Bank 1 latch signal L_BANK1 when a multiplexer 1028 is closed by a low RDC1L3 signal applied thereto. The non-inverting output of the latch 1022 is input to a conventional D flip-flop 1030, whose inverting output is clocked therefrom when the CLK signal is high, and through a multiplexer 1032 when the RDC1L3 signal is high, to become the L_BANK1 signal. An inverter 1034 inverts the L_BANK1 signal to produce a latch Bank 0 signal L_BANK0, so that when XBA is low, L_BANK0 has an active high value, while when XBA is high, L_BANK1 is high. As a result, during a read latency of three, the flip-flop 1030 provides an additional clock pulse delay before being output from the multiplexer 1032 as the L_BANK0 or L_BANK1 signal.

Both L_BANK0 and L_BANK1 signals are employed by the CAS control circuitry 600 (FIG. 9A) to select between Bank 0 and Bank 1. Since a high column command signal CCMD is required to input the B0_IN signal into the latch 1022, the L_BANK0 and L_BANK1 signals are valid only during column access time. As a result, the latched bank signals L_BANK0 and L_BANK1 can change or alternate during a single low RAS time, for each column, thereby allowing for alternative columns between Banks 0 and 1 to be selected for a given selected row. Overall, the address input circuitry allows for improved flexibility for writing or reading data between individual columns in Banks 0 and 1.

Row (RAS) Input Circuitry

Referring to FIG. 11A, the row input circuitry 1036 is shown in greater detail as receiving the DVC2 signal from the DVC2 generator, and the RAS0* and RAS1* signals from the command bank circuitry 880 of FIG. 8A. The row input circuitry 1036 includes two address tracking circuits 1040, one for each of Bank 0 and Bank 1 in the memory device 200. While the address tracking circuit 1040 is generally described herein for array Bank 0, the same description applies equally to the other address tracking circuit for Bank 1. In general, the address tracking circuit 1040 simulates a delay imposed on signals output from a row to a DQ pad so that the memory device 200 knows when to shut off a given row and initiate equilibration for the row.

Figure 11B:
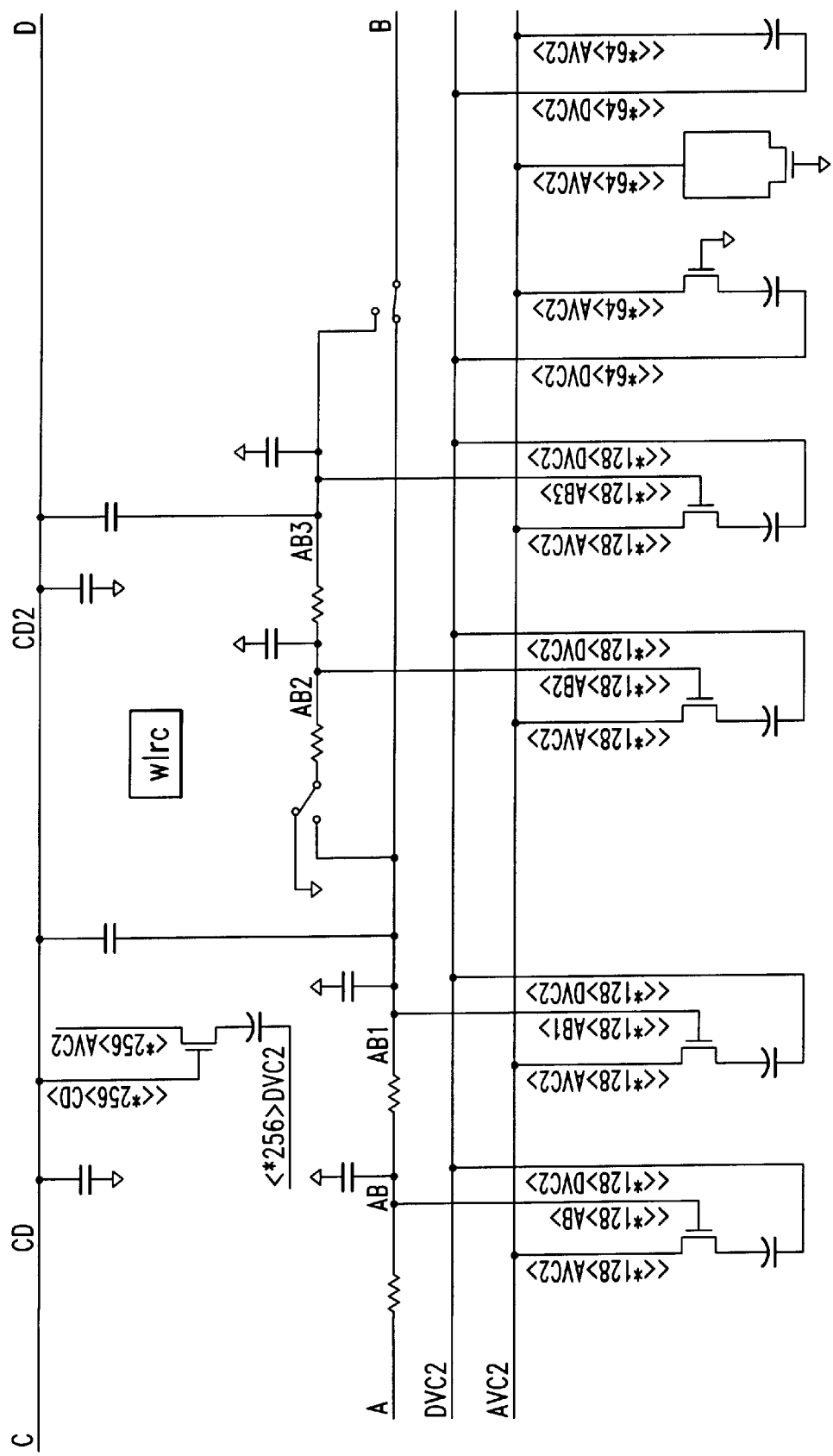
FIG. 11B is a schematic diagram of an exemplary write line RC circuit for use by the row input circuitry of FIG. 11A.

A one shot type circuit 1038 consisting of a delay element at one input to a NOR gate in the address tracking circuit 1040 receives the RAS0* signal and delays the signal to produce a row address signal RA that is shifted one nanosecond before RAS* rises to a high value. A simulated row decoder and driver circuit 1042 receives the inverted and non-inverted RA signal and provides a wordline signal that has the same delays as the row decoders and drivers employed in the memory device 200. The simulated row decoder circuit 1042 is conventional and substantially similar to the row decoder and driver circuitry shown and described in detail herein, and simply models the delays inherent in such circuitry. Likewise, a word line RC circuit 1044 receives the wordline signal and imposes the same RC time delay imposed on the wordlines from the address registers to the row decoders. As noted herein, the length of the data lines, as well as address lines, are approximately equal, due to the preferred physical layout of the memory device 200. Therefore, the word line RC circuit 1044 substantially accurately models the RC time delays inherent in all such word lines in the memory device 200. FIG. 11B shows an exemplary word line RC circuit 1044, which can be understood by one skilled in the art based in part on the detailed description provided herein.

A pair of amplifying inverters 1046, and a 0 delay gate 1048, coupled to the output of the word line RC circuit 1044, provide a row line track signal RLT that models the total delays inherent in the routing of RAS* to the appropriate row decoder. A switch 1050, 4 nanosecond delay gate 1052, and an inverter 1054 together provide a circuit that allows an additional delay to be added to the output signal of the word line RC circuit 1044 as an RLT option signal RLT_OP. As a result, the RLT_OP signal lags behind the RLT signal by 4 nanoseconds. The delay 0 gate 1048 and delay gate 1052 provide options that allow additional delays of between 0–3 nanoseconds and 0–6 nanoseconds (shown as 0 of 3 and 4 of 6 in FIG. 11A), respectively, to be added during manufacturing, if necessary. As an alternative, the switch 1050 can be switched to an alternative position, from that currently shown in FIG. 11A, to provide the wordline signal from the model row decoder circuit 1042 directly to the delay gate 1052, thereby bypassing the word line RC circuit 1044. As a result of such alternative, the RLT signal would lag behind the RLT_OP.

Each of two RAS chain circuits 1056 (only one of which is shown) receive the RLT and RLT_OP signals each into a NAND gates 1058, 1060. A 5 nanosecond delay 1062 delays the RLT signal before being input to the NAND gate 1056, while a one nanosecond delay gate 1064 further delays this signal before being input to the NAND gate 1060. When both the RLT and RLT_OP signals are high, an active low value from the NAND gate 1058 is amplified by two inverters 1066 and inverted by an inverter 1068 to become an N-sense amp control signal NSENSE for the left and right halves of Banks 0 and 1. Likewise, when both the RLT and RLT_OP signals are high, an active low value from the NAND gate 1060 is amplified by two inverters 1066 and inverted by an inverter 1068 to become a P-sense amp control signal PSENSE for the left and right halves of Banks 0 and 1. The NSENSE and PSENSE signals control the N and P sense amplifiers, respectively, as described below with respect to the data path and data block circuitry of FIGS. 20 and 21. Specifically, the NSENSE and PSENSE signals control the turn on and turn off of the N- and P-sense amps 138, 139 (FIG. 4) when the signals are high and low, respectively.

Since the RLT signal is delayed six nanoseconds, while the RLT_OP signal is delayed only four, the NAND gate 1058 outputs a low two nanosecond value after RLT_OP goes high, to ultimately produce the NSENSE signal, and outputs a low as soon as RLT_OP goes low again. Likewise, since the RLT signal is delayed a total of seven nanoseconds, while the RLT_OP signal is delayed only four, the NAND gate 1060 outputs a low three nanosecond value after RLT_OP goes high, to ultimately produce the PSENSE signal, and outputs a low as soon as RLT_OP goes low again. The one nanosecond difference between the two and three nsec value NSENSE and PSENSE signals represents a one nanosecond margin of error between enabling of the N-sense amps 138 to pull down the column lines, and thereafter, switching off the N-sense amps and enabling the P-sense amps 139 to pull up the column lines.

Figure 11C:
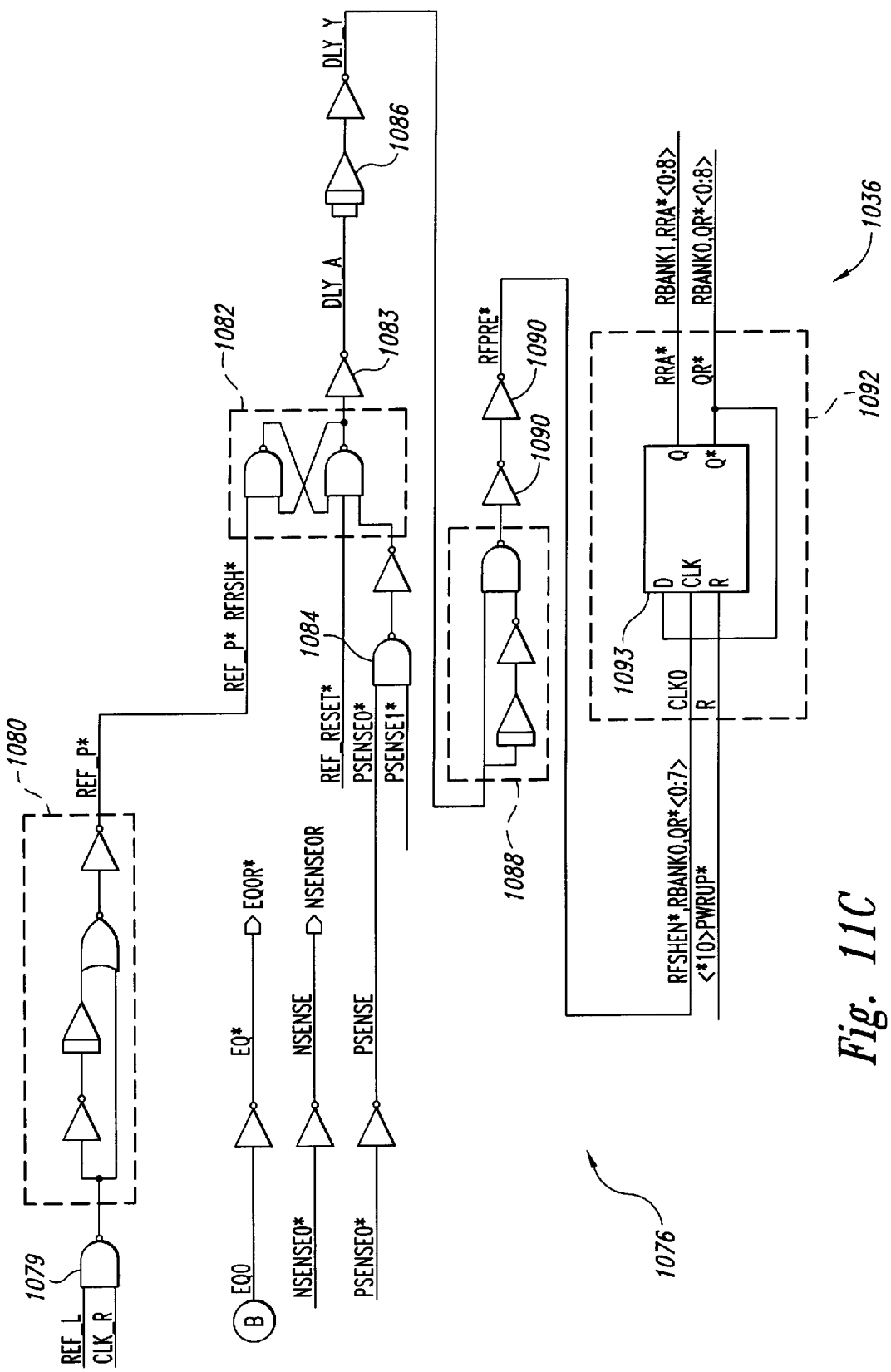
FIG. 11C is a partial schematic, partial block diagram of refresh precharge circuitry for use by the memory device of FIG. 3.

A NAND gate 1070 receives one of the RAS0* and RAS1* signals, and a one nanosecond delayed and inverted RLT_OP signal, which, when both are high, generates a low value output. This low value output is inverted by an inverter 1074 and amplified by one of the inverters 1068 to become an equilibration signal EQ* that initiates equilibration of the column lines in one of the left or right Banks 0 or 1, as shown in FIG. 11 C. While not shown, four sets of three of the amplifying inverters 1068 are provided to provide the EQ, NSENSE and PSENSE signals to one of the left and right halves of array Banks 0 and 1. Whenever RAS* or RLT_OP are low, then EQ* is high, which turns off the equilibration. In other words, during a read or write operation, equilibration of the lines are turned off. A switch 1072 can be set to allow CLK and RAS_S signal, both input to a NAND gate 1073, to further control the input of the NAND gate 1070.

Figure 1:
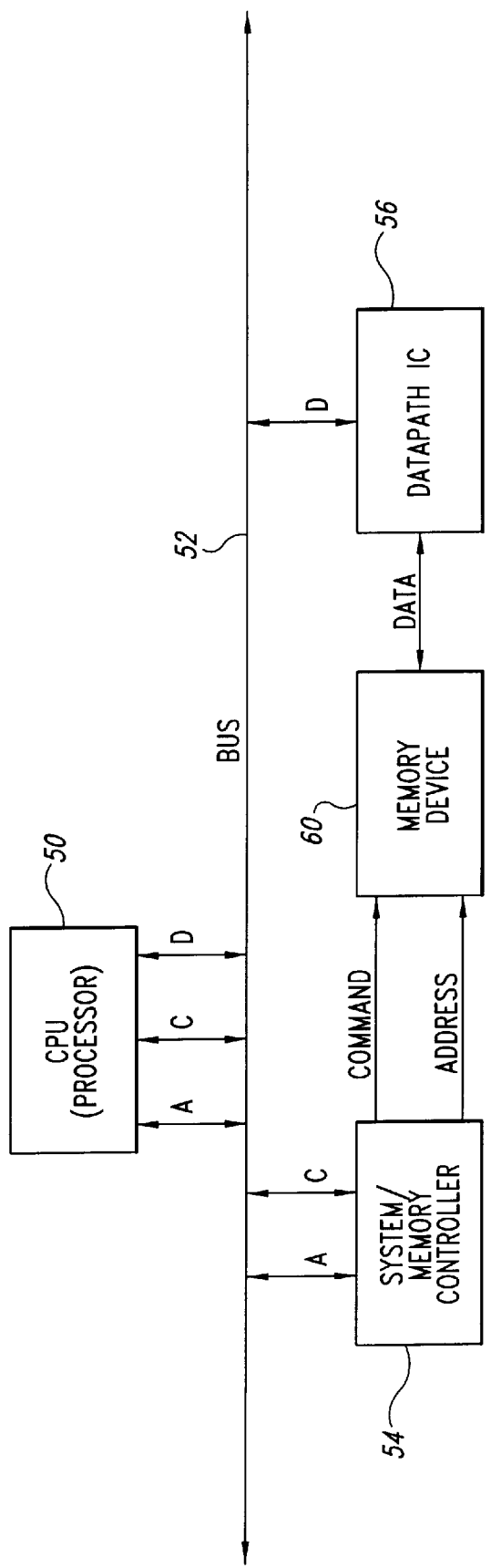
FIG. 1 is a block diagram of a prior art computer architecture.
Figure 2:
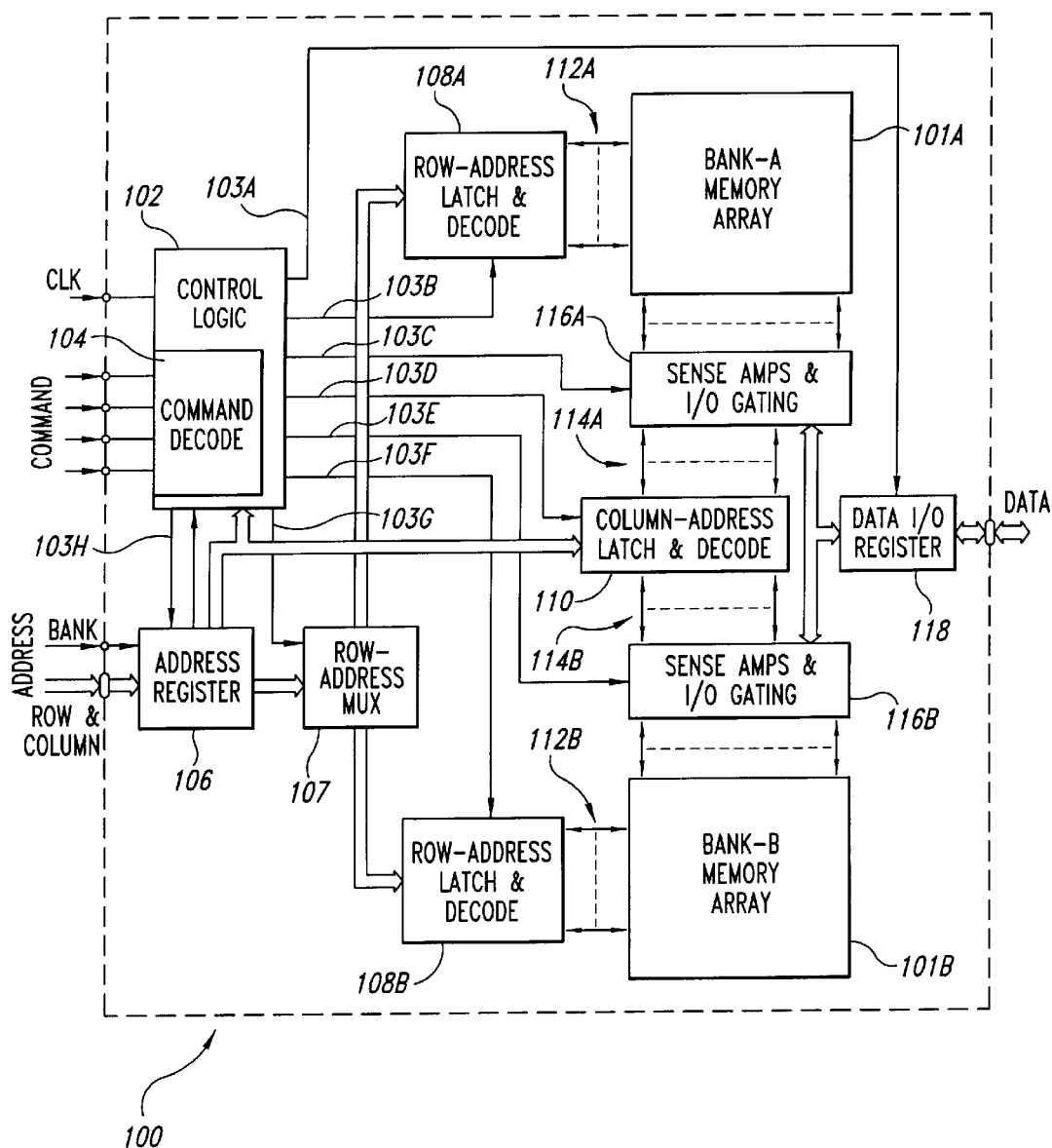
FIG. 2 is a block diagram of a prior art memory device.

Referring to FIG. 1 IC, a refresh precharge circuit 1076 receives the REF_L and CLK signals at a NAND gate 1078, whose output is provided to a one shot 1080. When the REF_L and CLK signals are both high, then the one shot 1080 outputs a low value pulse of 3 nanoseconds in duration to an input of a flip-flop 1082 that outputs an active low value to an inverter 1083 when a REF_RESET signal and the PSENSE signals for the Banks 0 and 1 are all high. (The REF_RESET signal is generated by NORing together the PWRUP* and PRECHRG signals.) Whenever the REF_RESET or either PSENSE signal goes low, the flip-flop outputs a high value. A 36 nanosecond delay gate 1086 and inverter 1087 respectively delays and inverts the output of the flip-flop 1082 to provide a delay signal DLY_Y. The 36 nanosecond delay is preferably adjustable during manufacturing and estimates the time for each bit line pair in a column to return to full rail (0 and Vcc respectively) after a write has been performed.

A one shot 1088 receives the DLY_Y signal and outputs a three nanosecond low value pulse that is amplified by a pair of inverters 1090 and input to a clock input of a refresh counter circuit 1092. The refresh counter circuit 1092 consists of IO D flip-flops 1093 that operate as a conventional counter circuit, which produces a nine bit output. The first D flip-flop in the chain of 10 receives the RFPRE* at the CLK input, while the remaining 9 have their inverting outputs coupled to the CLK input of the subsequent flip-flop. The non-inverting output of the first flip-flop produces a refresh Bank 1 signal RBANK1, while its inverting output produces a refresh Bank 0 signal RBANK0. The 9 subsequent flip-flops produce a counter signal that produces the row refresh address signal bits RRA*0–RRA*8 to sequentially provide row addresses for row refreshing through the multiplexer 987 of the nine address input latches 982 (FIG. 10A), for row addresses 000000000-111111111.

Column Counter Circuitry

Figure 12A:
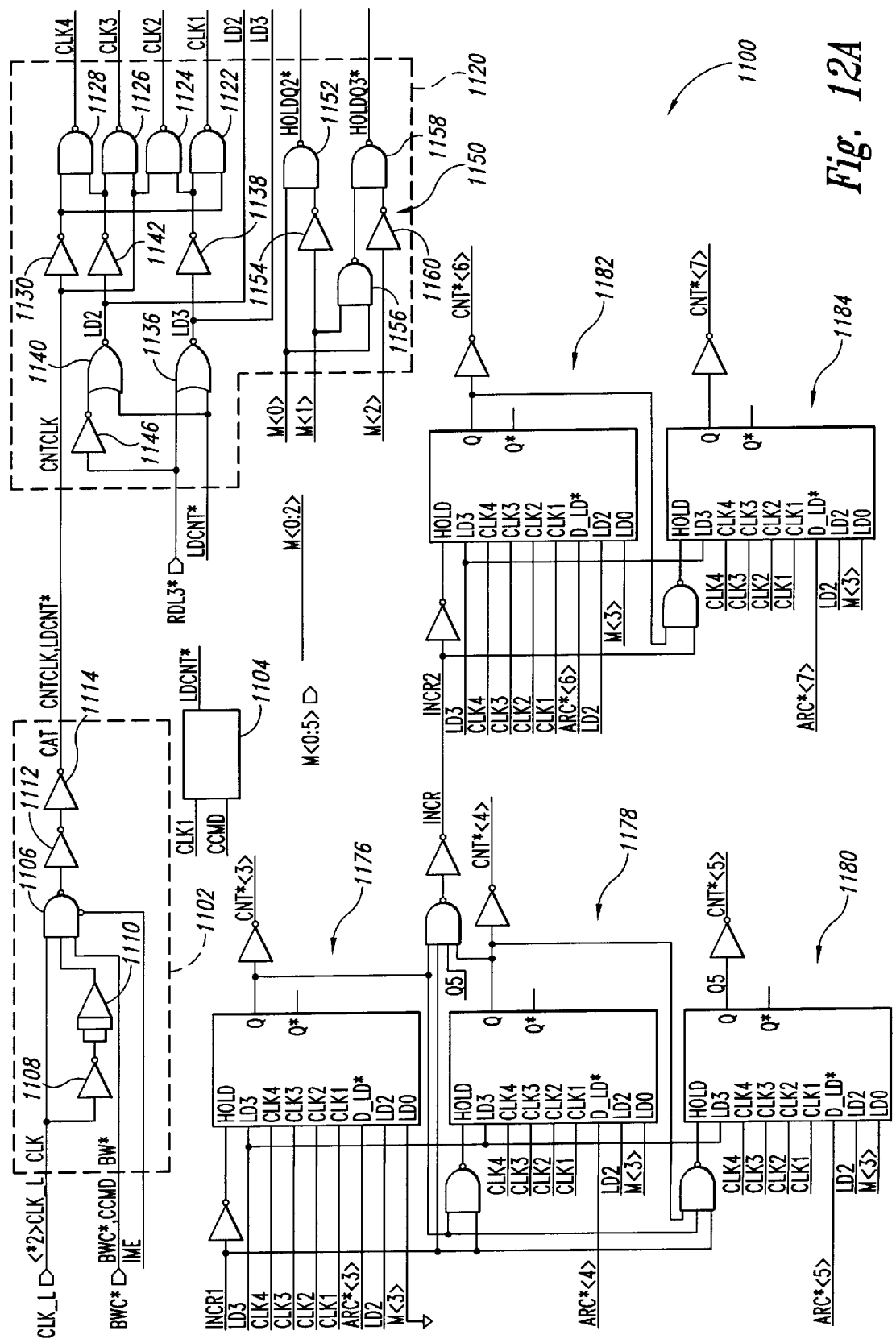
FIGS. 12A and 12B together form a partial schematic, partial block diagram of column counter circuitry for the memory device of FIG. 3.
Figure 12B:
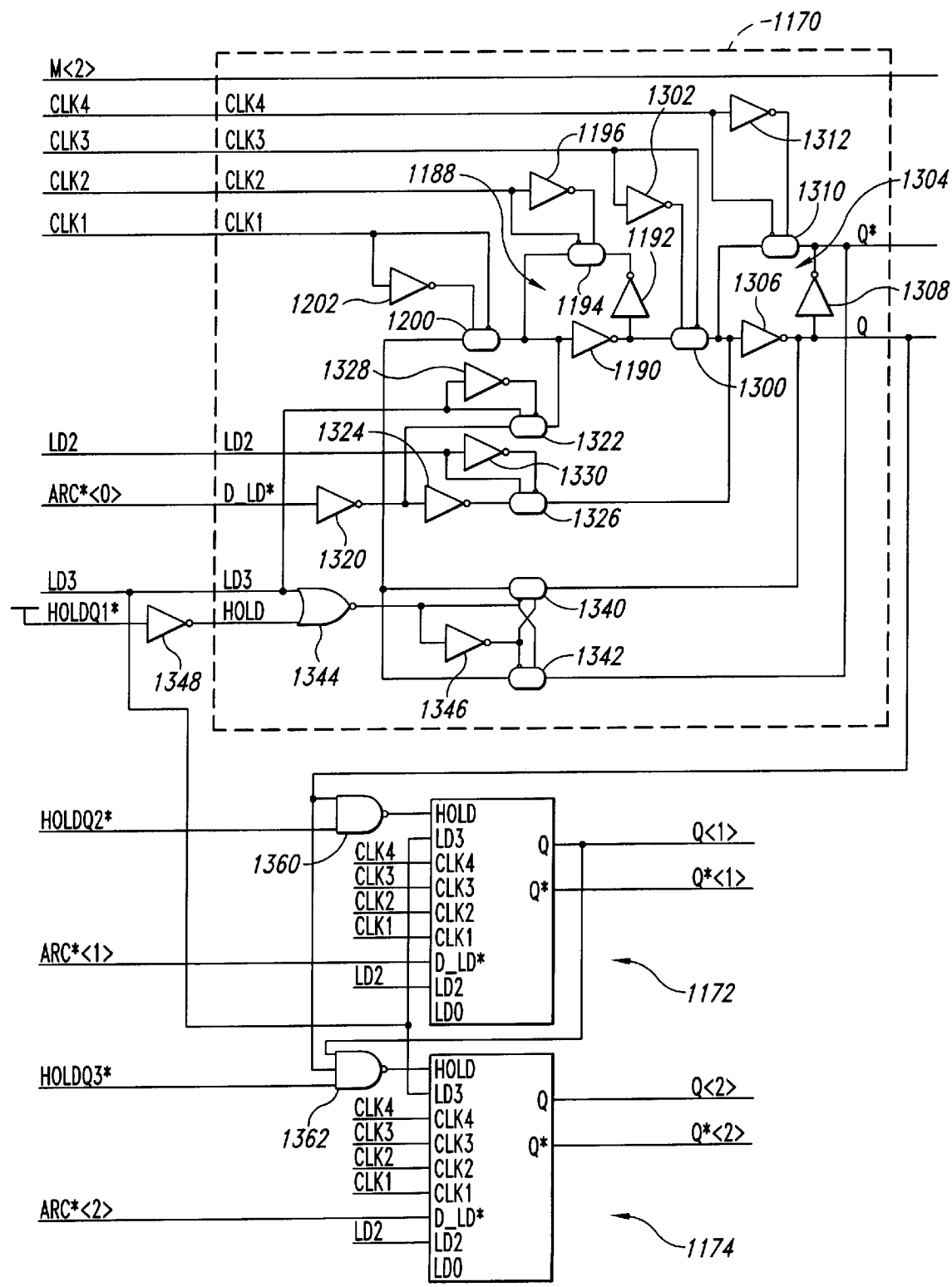

The purpose of the column counter circuitry 1100 illustrated in FIGS. 12A–12B is to generate the number of a column that is to be accessed during a read or a write operation, and to sequentially increment the column number each clock cycle. Furthermore, the column number can be preset to any value so that the column number begins incrementing from the preselected column number.

With reference to FIGS. 12A–12B, a count clock CNTCLK signal and an inverted load counter LDCNT* signal are generated by identical, respective timer circuits 1102, 1104 from the clocked latched CLK_L signal. The CLK_L signal is applied to one input of a NAND gate 1106. A second input of the NAND gate 1106 receives the CLK_L signal after passing through an inverter 1108 and a delay circuit 1110. Thus, the CLK_L signal and the output of the delay circuit 1108 are both high after the leading edge of CLK_L for a period corresponding to the delay of the delay circuit 1110. The output of the NAND gate 1110 is buffered by two inverters 1112, 1114 to generate the count clock CNTCLK signal in the timer circuit 1102 and the inverted load counter LDCNT* signal in the timer circuit 1104. The third input of the NAND gate 1106 in the timer circuit 1102 receives the block write command BWC* signal which goes high on the falling edge of CLK_L for two clock period in the event of a block write operation. Thus, the BWC* signal prevents the CNTCLK pulse from being generated responsive to the CLK_L signal after a block write command.

As explained below, since a column counter is incremented by each CNTCLK pulse, the BWC* signal prevents the column counter from being incremented on two successive CLK_L signals since a block write requires two clock cycles. The NAND gate 1106 for the timer circuit 1102 is also enabled by a low IDLE signal which is generated when the memory device is idle. Disabling the NAND gate 1106 prevents various circuitry receiving the CNTCLK signal from operating, thus conserving power. In summary, the timer circuit 1102 generates a negative going pulse for a short time after each leading edge of CLK_L, except if IDLE is active high and except for the second CLK_L pulse following BWC* going low.

The timer circuit 1104 operates in essentially the same manner except that its NAND gate 1110 receives a column command signal CCMD* instead of the block write command BWC* signal. The column command signal CCMD* is generated only when a new externally generated address is to be used to access the memory device. Thus, the timer circuit 1104 generates a negative going pulse for a short time after the leading edge of a single CLK_L pulse when CCMD goes low responsive to receipt of a new external address.

The count clock CNTCLK signal from the timer circuit 1102 and the load counter LDCNT* signal from the timer circuit 1104 are applied to a clock decoder circuit 1120. The purpose of the clock decoder circuit 1120 is to generate various counter control signals responsive to the CNTCLK and LDCNT* signals depending upon the latency mode. Four clock CLK1–4 signals are generated by respective NAND gates 1122, 1124, 1126, 1128. The NAND gates 1124, 1126 receive the CNTCLK signal directly while the NAND gates 1122, 1128 receive the CNTCLK signal through an inverter 1130. Thus, when enabled, the NAND gates 1122, 1128 output CLK1 and CLK4 signals, respectively, that are identical to CNTCLK, while the NAND gates 1124, 1126 output CLK2 and CLK3 signals, respectively, that are the inverse of CNTCLK.

The NAND gates 1122, 1124 are disabled alternately with the NAND gates 1126, 1128 depending upon the read latency mode, and all of the NAND gates 1122–1128 are disabled during a LDCNT* pulse. The NAND gates 1122, 1124 receive the output of a NOR gate 1136 through an inverter 1138. Thus, the NAND gates 1122, 1124 are disabled during the active low load count LDCNT* pulse whenever the read latency three RDL3* signal is active low (i.e., during the latency three operating mode). The NAND gates 1126, 1128 receive the output of a NOR gate 1140 through an inverter 1142. The NOR gate 1140, like the NOR gate 1136, receives the load counter LDCNT* signal. But the NOR gate 1140 receives the RDL3* signal through an inverter 1146 rather than directly so that it disables the NAND gates 1126, 1128 during the active low load count LDCNT* pulse whenever the read latency three RDL3* signal is inactive high (i.e., during the latency two operating mode).

In summary, the clock signals CLK1–4 are generated during each CNTCLK pulse except that either CLK1–2 is inhibited during the load counter LDCNT* pulse in the latency three operating mode and CLK3–4 is inhibited during the load counter LDCNT* pulse in the latency two operating mode.

The decoder circuit 1120 also includes a mode decoder circuit 1150 that generates hold signals to halt the column counter from incrementing after a predetermined numbers of counts, as explained in greater detail below. The mode decoder 1150 decodes the first three bits of the mode word M<2:0> which specify the burst length, i.e., the number of memory locations that are accessed during a burst transfer. Bursts of either 2, 4 or 8 columns or a full page are selected by M<2:0> being 001, 010, 011, 111, respectively. The mode 0 bit M<0> is applied to a NAND gate 1152, while the mode 1 bit M<1> is applied to the NAND gate 1152 through an inverter 1154. Thus, the NAND gate 1152 outputs a low HOLDQ2* signal whenever M<1,0> is 01, i.e., a burst length of 2.

A NAND gate 1156 receives the M<0> and M<1> bits and thus applies a high to a NAND gate 1158 whenever either M<0> or M<1> is low. The NAND gate 1158 thus decodes M<X01> and M<X10> (where X is a "don't care" value). The NAND gate 1158 also receives the complement of the mode bit 2 M<2> through an inverter 1160. Thus, the inputs to the NAND gate 1158 are all high for M<2:0> equal to 001 or 010, thereby causing the NAND gate 1158 to generate a low HOLDQ3* signal. The HOLDQ3* signal is inactive high for M<2:0> being 1XX or X11. The only valid combination of mode bits for 1XX or X11 are 111 and 011, i.e., a page burst and a burst of 8. Thus, HOLDQ3* is active low for all modes other than burst 8 and page burst modes, i.e., either a burst 2 or burst 4 mode. However, as explained below, the HOLDQ3* signal is of no effect in a burst 2 mode. Thus, the HOLDQ3* signal functions as explained below to differentiate the burst 4 mode from the burst 8 and page burst modes.

The remainder of the column counter circuitry 1100 comprises a column counter having 8 stages 1170–1184, only one of which 1170 will be shown and described in detain in the interests of brevity. Basically, each counter stage 1170–1184 includes a register formed by a first latch having an output connected to the input of a second latch, with each of the latches having a gated input. Further, either of the latches can be preset, with the first latch being preset in the latency three mode and the second latch being preset in the latency two mode.

The first latch 1188 is formed by a pair of inverters 1190, 1192 ;connected end input-to-output through a pass gate 1194. The pass gate 1194 is operated by the CLK2 signal applied directly and through an inverter 1196. The pass gate 1196 is conductive to latch the applied signal whenever CLK2 is low which occurs between CNTCLK pulses. The input to the inverter 1190 is connected to a pass gate 1200 that is operated by the CLK1 signal applied directly and through an inverter 1202. The pass gate 1200 is conductive whenever the CLK1 is low which occurs during CNTCLK.

The output of the inverter 1190 is applied to the second latch 1304 through a pass gate 1300 which is operated by the CLK3 signal applied directly and through an inverter 1302. The pass gate 1300 is conductive whenever the CLK3 is low which occurs between CNTCLK pulses. The second latch 1304 is formed by a pair of inverters 1306, 1308 connected end input-to-output through a pass gate 1310. The pass gate 1194 is operated by the CLK2 signal applied directly and through an inverter 1196. The pass gate 1310 is conductive to latch the applied signal whenever CLK4 is low which occurs during CNTCLK.

The first and second latches 1188, 1304, respectively, can be preset with the bit of an external address ARC*<0> which is applied through an inverter 1320 to a first pass gate 1322 and through an inverter 1324 to a second pass gate 1326. The latches 1188, 1304 of the other column counter stages 1172–1184 can be present with other external address bits ARC<0:7>. The first pass gate 1322 applies the output of the inverter 1320 to the first latch 1188 while the second pass gate 1326 applies the complement of the inverter 1320 output to the second latch 1304. The first pass gate 1322 is enabled by a high load latency three LD3 signal applied directly and through an inverter 1328 while the second pass gate 1326 is enabled by a high load latency two LD2 signal applied directly and through an inverter 1330. Thus, the first latch 1188 is preset responsive to a LDCNT* pulse when RDL3* is low during a latency three mode, and the second latch 1304 is preset responsive to a LDCNT* pulse when RDL3* is high during a latency two mode. As a result, an input address requires an additional clock period to reach the output of the counter stage 1170 during the latency three mode as compared to the latency two mode.

Either the Q* or the Q output of the counter stage 1170 is fed back to the input to cause the stage 1170 to either increment its count our hold its current count. More specifically, the input to the inverter 1306 is applied to the pass gate 1200 though a pass gate 1340 while the output of the inverter 1306 is applied to the pass gate 1200 though a pass gate 1342. The pass gates 1340, 1342 are alternately enabled by the output of a NOR gate 1344 applied directly and through an inverter 1346 to the pass gates 1340, 1342. The HOLD input to the NOR gate 1344 is held low by a high applied to the input of an inverter 1348. The other input receives the load latency three LD3 signal which is high during LDCNT* if RDL3* is low, which occurs during a read latency three operation. In such case, the low at the output of the NOR gate 1344 enables the pass gate 1340 to connect the Q output of the counter stage 1170 to the pass gate 1200. As a result, the counter of the counter stage 1170 is held for the first counter clock CNTCLK pulse since the CNTCLK pulse is generated during the LDCNT* pulse.

In a read latency two operation, the load latency three LD3 signal which is continuously low, thereby causing the NOR gate 1344 to output a high. The high at the output of the NOR gate 1344 enables the pass gate 1342 to connect the Q* output of the counter stage 1170 to the pass gate 1200. As a result, the counter stage is able to increment responsive to the next CNTCLK* pulse.

Thus, in the latency two mode, the counter stage 1170 increments with each CNTCLK* pulse, including the CNTCLK* pulse occurring during the loading of the counter stage 1170. However, in the latency three mode, the counter stage 1170 delays incrementing for the CNTCLK* pulse occurring during the loading of the counter stage 1170 thereby allowing the column counter to compensate for the additional clock cycle required to perform a read operation in the latency three mode.

It will be recalled that the NOR gate 1136 is enabled by the low RDL3* during the latency three mode, thereby allowing LD3 to go high during the low LDCNT* pulse. The high LD3 applied through the inverter 1138 disables the NAND gates 1122, 1124, thereby preventing CLK1 and CLK2 from being generated. Instead, the output of the NAND gates 1122, 1124 are held high to hold CLK1 and CLK2 high. The low RDL3* applied through the inverter 1146 disables the NOR gate 1140, thereby holding LD2 low and allowing CLK3 and CLK4 to be generated in the normal manner by the NAND gates 1126, 1128. The high CLK1 signal disables the pass gate 1200 and the high CLK2 disables the latch 1188. As a result, the output of the inverter 1320 can be loaded into the first latch 1188 through the pass gate 1322.

It will also be recalled that the NOR gate 1140 is enabled by the high RDL3* during the latency two mode, thereby allowing LD2 to go high during the low LDCNT* pulse. The high LD2 applied through the inverter 1142 disables the NAND gates 1126, 1128, thereby preventing CLK3 and CLK4 from being generated. Instead, the output of the NAND gates 1126, 1128 are held high to hold CLK3 and CLK4 high. The high RDL3* disables the NOR gate 1136, thereby holding LD3 low and allowing CLK1 and CLK2 to be generated in the normal manner by the NAND gates 1122, 1124. The high CLK3 signal disables the pass gate 1300 and the high CLK4 signal disables the second latch 1304. As a result, the output of the inverter 1320 can be loaded into the second latch 1304 through the pass gate 1326.

The remaining counter stages 1172–1188 operate in essentially the same manner as the counter stage 1170, except as described below. The output of each counter stage 1170–1180 is applied to the next counter stage 1170–1180 so that the counter stages 1170–1180 implement a binary counter as will be understood by one skilled in the art. However, the output of the first stage 1170 is applied to the second stage 1172 through a NAND gate 1360 which also receives the HOLDQ2* signal. A low HOLDQ2* signal disables the NAND gate 1360 so that the column counter formed by the counter stages 1170–1180 stops incrementing at the two count. It will be recalled that the NAND gate 1152 outputs a low HOLDQ2* signal whenever M<1,0> is 01, i.e., a burst length of 2. Thus, in the burst two mode, the column counter increments up to the two count and is then held at that count until the counter is once again loaded.

In a similar manner, the output of the first counter stage 1170 and the output of the second counter stage 1172 are applied to a NAND gate 1362 along with the HOLDQ3* signal. A low HOLDQ3* signal disables the NAND gate 1362 so that the column counter formed by the counter stages 1170–1180 stops incrementing at the four count. It will be recalled that the NAND gate 1152 outputs a low HOLDQ3* signal whenever the memory device 200 is operating in a burst 4 mode. Thus, in the burst two mode, the column counter increments up to the four count and is then held at that count until the counter is once again loaded.

Burst Counter Circuitry

Figure 13A:
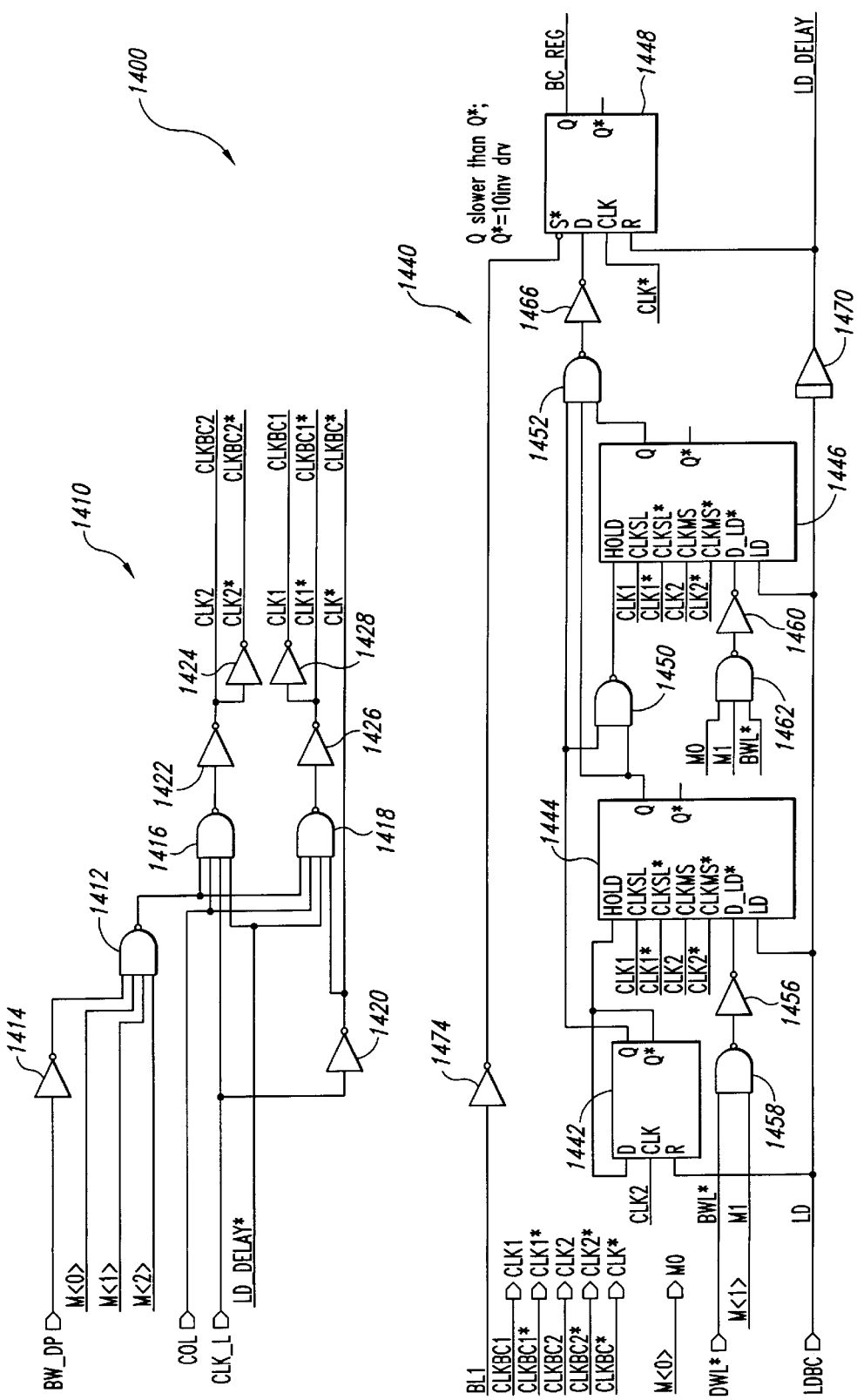
FIGS. 13A and 13B together form a partial schematic, partial block diagram of burst counter circuitry for the memory device of FIG. 3.
Figure 13B:
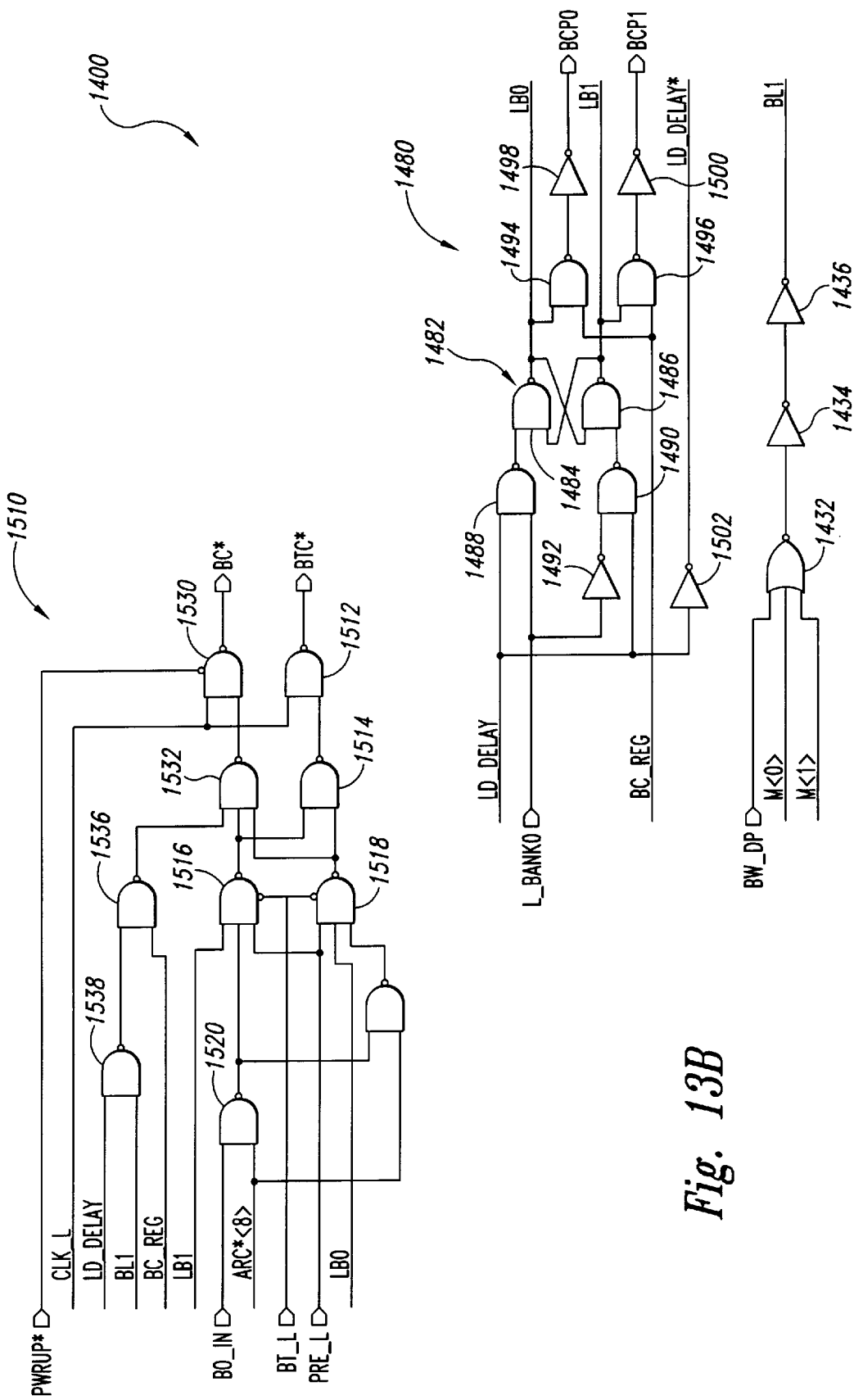

The burst counter circuitry 1400 illustrated in FIGS. 13A–13B performs the function of counting the number of memory accesses in a burst transfer, and terminating the burst transfer after 1, 2, 4, or 8 memory accesses have been completed, depending upon the operation mode selected.

The burst counter circuitry 1400 includes a burst counter clock generating circuit 1410 that generates a series of clock signals under all operating modes except for a page burst when a block write is not occurring. The 3 low order mode bits M<2:0> from the mode register which specify the bust length are decoded by a NAND gate 1412 along with the complement of a block write BW_DP signal applied through an inverter 1414. The NAND gate 1412 will output a high except when M<2:0> is 111 (i.e., the page burst mode) and BW_DP is low (i.e., not in the block write mode). A low at the output of the NAND gate 1412 in the non-block write page burst mode disables NAND gates 1416, 1418 so that they output a high rather than allowing the NAND gate 1416 to pass the CLK_L signal and the NAND gate 1418 to pass the complement of the CLK_L signal through an inverter 1420. The inverter 1420 also generates a CLK* signal as the complement of CLK_L. In all modes other than the non-block write page burst mode, the NAND gate 1412 enables the NAND gates 1416, 1418. The burst counter clock generating circuit 1410 operates in this manner because sequential units are not made to the columns of the array in a block write transfer.

When the NAND gate 1416 is further enabled by the column command COL signal, the clock enable CLKEN signal, and the clock CLK_L signal being high, the NAND gate 1416 outputs a low when CLK_L and a delayed load block counter LD_DELAY* signal are both high. The LD_DELAY* signal is simply a delayed version of CLK_L. Thus, when enabled, the NAND gate 1416 outputs a CLK2 signal at the output of an inverter 1422 that is essentially a delayed version of CLK_L. The NAND gate 1416 also outputs a CLK2* signal at the output of an inverter 1424 which is the complement of CLK2. Similarly, when the NAND gate 1418 is further enabled by the column command COL signal, the clock enable CLKEN signal, and the clock CLK_L signal being low, the NAND gate 1418 outputs a CLK1* signal at the output of an inverter 1426 that is essentially a truncated version of the complement of CLK_L. The NAND gate 1418 also outputs a CLK1 signal at the output of an inverter 1428 which is the complement of CLK1*.

The burst counter circuitry 1400 also includes circuitry for generating a burst length 1 BL1 signal when the memory device is operating in burst length 1 operating mode. The low order mode bits M<1:0> are applied to a NOR gate 1432 along with the block write signal BW_DP. When the burst length is not 2 (i.e., M<01>), 4 (i.e., M<10>), 8 or a page (i.e., both M<11>), and not in a block write mode (i.e., BW is low), the NOR gate 1432 outputs a high which is inverted twice by inverters 1434, 1436 to generate a high burst length 1 BL1 signal. As explained below, when operating with a burst length of 1, the BL1 signal causes a burst complete signal to be generated after each clock cycle.

The clock signals from the burst counter clock generating circuit 1410 are applied to a burst counter 1440 having a first stage formed by a flip-flop 1442, second and third stages formed by respective registers 1444, 1446, and an output latch formed by a flip-flop 1448. As explained below, the interconnections between the flip-flop 1442 and registers 1444, 1446 and their connections to a NAND gate 1450 causes the flip-flop 1442 and registers 1444, 1446 to function as a three stage counter. The terminal count of the counter (i.e., "111") is detected by a NAND gate 1452. As further explained below, the three stages of the counter are loaded with a value depending upon the burst length. For a burst length of 8, the counter is loaded with the value "000" and then increments during 7 cycles of CLK2 to "111". For a burst length of 4, the counter is loaded with the value "100" and then increments during 3 cycles of CLK2 to "111". For a burst length of 2, the counter is loaded with the value "110" and then increments during 1 cycle of CLK2 to "111".

It will be noted that the least significant bit of the binary values loaded into the counter is always 0. For this reason, the flip-flop 1442 is always reset when the load burst counter LDBC signal goes high so that its Q output is low and its Q* output is high. The register 1444 forming the second stage of the burst counter 1440 is loaded from the output of an inverter 1456 which receives the output of a NAND gate 1458. The NAND gate 1458 outputs a low when the burst length is 2 (i.e., M1 is high) since BWL* is high except in a block write mode. The low at the and output of the NAND gate 1458 causes the inverter 1456 to apply a low to the data load D-LD* input of the register 1444 which sets its Q output high and its Q* output low.

The register 1446 forming the third stage of the burst counter 1440 is loaded from the output of an inverter 1460 which receives the output of a NAND gate 1462. The NAND gate 1462 outputs a low when the burst length is 8 (i.e., M0 and M1 are both high) since BWL* is high except in a block write mode. The low at the and output of the NAND gate 1462 causes the inverter 1460 to apply a low to the data load D-LD* input of the register 1446 which sets its Q output high and its Q* output low. Thus, when the burst length is 2, the Q outputs of the registers 1446, 1444 are both set high and the Q output of the flip-flop 1442 is set low (i.e., the counter is set to "110"). When the burst length is 4, the Q output of the register 1446 is set high and the Q outputs of the register 1444 and the flip-flop 1442 are both set low (i.e., the counter is set to "100"). When the burst length is 8, the Q outputs of the registers 1446, 1444 and the flip-flop 1442 are all set low (i.e., the counter is set to "000"). Thus, in the burst 2 mode the counter increments once from "110" to reach the terminal count (i.e., "111"), in the burst 4 mode the counter increments three times from "100" to reach the terminal count, and in the burst 8 mode the counter increments seven times from "000" to reach the terminal count.

The flip-flop 1448 adds an additional clock cycle to these counts of 1, 3, and 7 so that the burst counter 1440 counts 2, 4, and 8 CLK2 cycles in the burst 2, 4, and 8 modes. More specifically, when the terminal "111" count is detected by the NAND gate 1452, its output goes low which causes an inverter 1466 to apply a high to the data D input of the flip-flop 1448. On the next clock cycle, the CLK* signal clocks the high to the Q output of the flip-flop 1448, thereby causing the burst complete register BC_REG signal to go high. The high BC_REG signal signifies the completion of a burst memory transfer.

In addition to loading the burst counter 1440, the load burst count LDBC signal is applied to a delay circuit 1470 to generate a load delay LD_DELAY signal that resets the flip-flop 1448 after a sufficient period has lapsed for the high BC_REG signal to be detected by other circuitry. The high BC_REG signal is also used for other purposes as explained below.

The burst counter 1440 must also generate a high BC_REG signal at the appropriate time during a burst length 1 transfer and during a block write transfer. In a burst length 1 transfer, BL1 is high as explained above. The high BL1 signal is applied to the set input of the flip-flop 1448 though an inverter 1474 thereby forcing the flip-flop 1448 to output a high on its Q output. Thus, in the burst length one mode, the BC_REG signal if forced high to indicate a burst complete after a single memory transfer.

In the block write mode, the block write latch BWL* signal is active low, thereby causing the NAND gates 1458, 1462 to each output a high. As a result, the third stage of the burst counter 1440 (i.e., register 1446) and the second stage of the burst counter 1440 (i.e., register 1444) are both set high. Thus, for a block write, the burst counter 1440 is set to "110" thereby allowing the burst counter 1440 to count only once from "110" to reach the terminal count of "111".

The burst counter circuitry 1400 also includes a latch circuit 1480 for generating burst complete signals BCP0 and BCP1 for Banks 0 and 1, respectively. The latch circuit 1480 includes a flip-flop 1482 formed by a pair of NAND gates 1484, 1486. The flip-flop 1482 is set by a low applied to the NAND gate 1484 from a NAND gate 1488 which occurs responsive to the load delay signal LD_DELAY signal when the latched Bank 0 L_BANK0 signal is high. Conversely, the flip-flop 1482 is reset by a low applied to the NAND gate 1486 from a NAND gate 1490 which occurs responsive to the load delay signal LD_DELAY signal when the latched Bank 0 L_BANK0 signal is low since the L_BANK0 signal is applied to the NAND gate 1490 through an inverter 1492. Thus, when L_BANK0 is high, the NAND gate 1484 outputs a high left Bank 0 LB0 signal, and when L_BANK0 is low, the NAND gate 1486 outputs a high left Bank 1 LB1 signal. The LB0 and LB1 signals are gated through respective NAND gates 1494, 1496 by the burst complete register BC_REG signal which, are coupled through respective inverters 1498, 1500. Thus, the inverter 1498 outputs a high BCP0 signal responsive to BC_REG when LB0 is high, and the inverter 1500 outputs a high BCP1 signal responsive to BC_REG when LB1 is high. The DC_DELAY signal that is applied to the NAND gates 1488, 1490 is also applied to an inverter 1502 that generates a complementary low LD_DELAY* signal.

The remaining burst counter circuitry 1400 includes a decoder circuit 1510 that generates an active low burst complete BC* signal and an active low burst transfer complete BTC* signal. The active low BTC* signal is generated by a NAND gate 1512 responsive the clock CLK_L signal when the NAND gate 1512 is enabled by a high at the output of a NAND gate 1514. Thus, the NAND gate 1512 is enabled whenever either NAND gate 1516 or NAND gate 1518 outputs a low. The NAND gate 1516 will output a low responsive to a high precharge PRE-L signal whenever a column in Bank 1 is being accessed as indicated by LB1 being high and either B0_IN is low (i.e., a command for Bank 1 is present) or A8* is low.

The NAND gate 1518 will output a low to cause the NAND gate 1514 to enable the NAND gate 1512 responsive to a high precharge PRE-L signal whenever a column in Bank 0 is being accessed as indicated by LB0 being high and a NAND gate 1520 detects that either both B0_IN is high (i.e., a command for Bank 0 is present) and A8* is high (i.e., a command for Bank 0 is present) or that A8* is low. Thus, the CLK_L signal will generate a burst transfer complete BTC* signal responsive to a precharge PRE_L signal on basically three conditions. First, if a column in Bank 0 is active (as indicated by LB0 being high) and both a bank command for Bank 0 is received (as indicated by B0_IN being high) and the high order address bit A8* is high. Second, if a column in Bank 1 is active (as indicated by LB1 being high) and a bank command for Bank 1 is received (as indicated by B0_IN being low). Third, if a column in either bank is active (as indicated when either LB0 or LB1 is high) and the high order address bit A8* is low.

The active low burst complete BC* signal is generated by a NAND gate 1530 responsive the clock CLK_L signal when the NAND gate 1530 is enabled by a high at the output of a NAND gate 1532 and PWRUP* is low as it is under normal operating conditions. The NAND gate 1532 receives the same inputs as the NAND gate 1514. As a result, the BC* signal is generated under the same set of circumstances that cause the BTC* signal to be generated as described above. However, the BC* signal is also generated whenever the output of a NAND gate 1536 goes low which occurs whenever the burst complete register BC_REG signal and the output of a NAND gate 1538 are both high. The output of the NAND gate 1538 will be high whenever either LD_DELAY is low or the burst length 1 BL1 signal is low. Thus, the BC* signal is also generated when BC_REG is high and either LD_DELAY or BL1 is low. As explained above, the BC* signal is used by the CAS Control Circuit to terminate a read or a write operation when a burst transfer has been completed.

Redundant Column Compare Circuitry

Figure 14A:
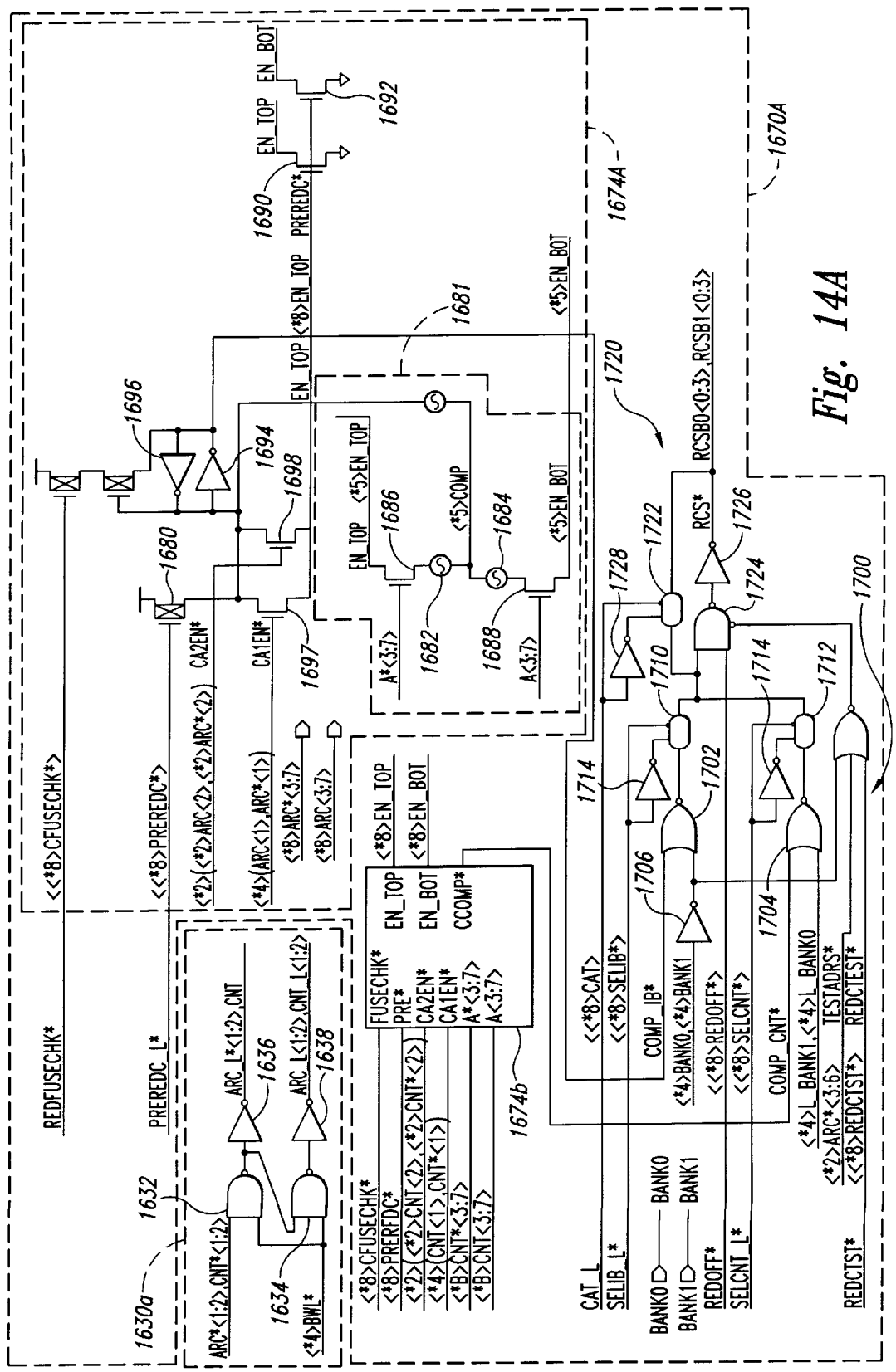
FIGS. 14A and 14B together form a partial schematic, partial block diagram of redundant column compare circuitry.
Figure 14B:
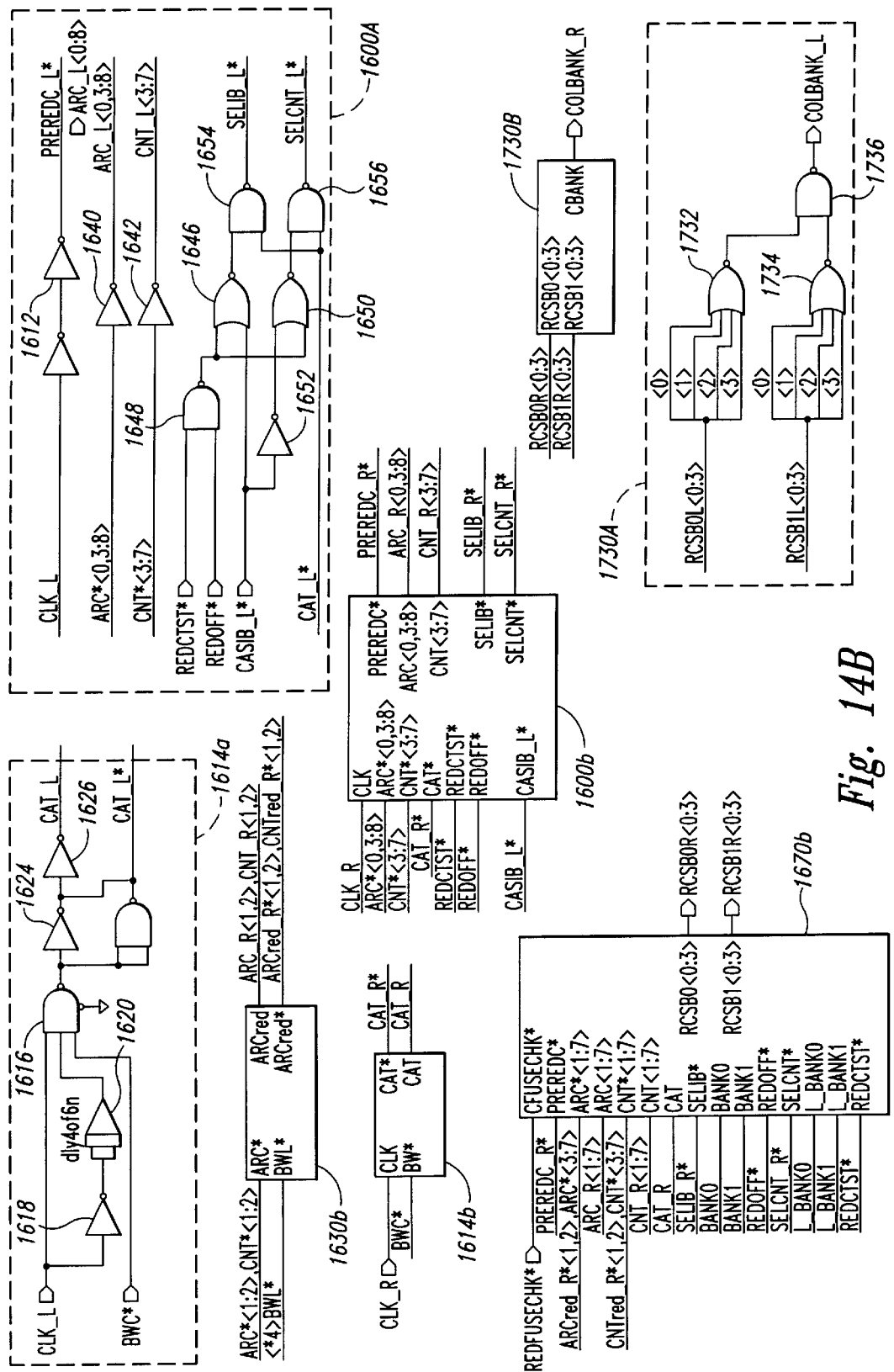

The redundant column compare circuit 234 shown in FIG. 3 is illustrated in detail in FIGS. 14A–14B. The circuitry shown in detail in FIGS. 14A–14B is used for checking redundancy of the columns in the left hand portion of the array 211 which includes the left half of Bank 0 211A of the memory array (FIG. 3) and the left half of Bank 1 211B. The identical circuitry for the right half of Bank 0 211A of the memory array (FIG. 3) and the right half of Bank 1 211B is shown in FIG. 10 in block diagram form. The circuitry for both sides of the memory array is designated with the same reference numerals. However, the circuitry for the left side of the array is generally identified with the reference designation "A" and the signals are sometimes identified in FIGS. 14A–14B (and in other figures) with a designation "L". However, the circuitry for the right side of the array is generally identified with the reference designation "B" and the signals are sometimes identified in FIGS. 14A–14B (and in other figures) with a designation "R".

The redundant column compare circuit 234 is operated by a number of control signals, some of which are generated by control circuits 1600A, 1600B shown in FIG. 14B. The operation of the column compare circuit 234 is generally synchronized to a clock signal CLK which is also used to generate a precharge redundant column signal PREREDC* by passing CLK thorough two inverters 1610, 1612 in the control circuits 1600.

The clock signal CLK is also applied to a address trap control circuit 1614A which generates a column address trap CAT pulse and its complement CAT* once the address that will be used to access the memory array 211 has been determined, as explained in greater detail below. The CLK signal is applied to a NAND gate 1616 both directly and through an inverter 1618 and a delay circuit 1620. The NAND gate, inverter 1618 and delay circuit 1620 form a one-shot that is enabled whenever the NAND gate 1616 is enabled to generate a short, negative going pulse each leading edge of CLK. The NAND gate 1616 is enabled whenever a block write command signal BWC* is inactive high. As explained further below, a block write operation extends over two clock cycles, and the same address should be maintained during the entire block write data. Thus, when BWL* is active low, the NAND gate 1616 is disabled from generating an additional column address trap CAT pulse and its inverse CAT*.

Although columns to which data is to be written during the block write must be checked to determine if a redundant column must be substituted, the addresses for these columns are generated by other circuitry, as explained in greater detail below.

The column address trap CAT pulse is generated by passing the pulses at the output of the NAND gate 1616 though two inverters 1624, 1626 while the active low CAT* pulse is generated at the output of the inverter 1624. The address trap control circuit 1614A generates the address trap pulses for the redundant column compare circuitry for the left side of the memory array while a second address trap control circuit 1614B generates the address trap signals for the remaining redundant column compare circuitry, as explained further below.

The low order bits of addresses are generated in a different manner during a block write operation. In particular, during a block write operation data is written to a block of either 2, 4 or 8 columns starting at a reference address. Thus, the columns in the block are selected by the three low-order bits of the address. These three low-order address bits are generated in a block write operation in a manner that is different from how they are generated in other memory access operations. Specifically, four low order address circuits 1630A are provided for the left side of Banks 0 and 1. Each of the low order address circuits 1630A receives a respective bits of bits 1 and 2 of an external address ARC1*, ARC2* and the complement of bits 1 and 2 of a column counter address CNT1*, CNT2*. (The 0 bit for these addresses are generated in a different manner, as described below.) Four similar low order address circuits 1630B are provided for those same signals in the right side of Banks 0 and 1.

The four low order address circuits 1630 (FIG. 14A) each include a first NAND gate 1632 receiving a respective signal ARC1*, ARC2*, CNT1*, and CNT2* and an active low block write latch signal BWL* (i.e., one circuit 1630 receives, ARC1*, a second receives ARC2*, etc.). A second NAND gate 1634 receives both BWL* and the output of the first NAND gate 1632. As a result, during a block write when BWL* is active low, the outputs of both NAND gates 1632, 1634 are high. The outputs of the NAND gates 1632 of the four circuits 1630 are coupled through respective inverters 1636 to output low ARC1L*, ARC2L*, CNT1L*, CNT2L* signals. (These signals are represented in FIG. 10 by the notation ARCL*<1:2> and CNTL*<1:2>). The outputs of the NAND gates 1634 are coupled through respective inverters 1638 to output low ARCL<1:2> and CNTL<1:2> signals. Thus, during a block write when BWL* is active low, the low order external address bits 1 and 2 (i.e., ARCL<1:2>, ARCL*<1:2> and CNTL<1:2>, CNTL*<1:2>) are forced low. As explained below, forcing these low order address bits low causes all of the columns in the block to which the block write will occur to be checked for a defective column.

During a write to a single column, BWL* is inactive high, thereby enabling both NAND gates 1632, 1634 in each of the four circuits 1630 so they essentially function as inverters. Thus, the ARCL*<1:2> and CNTL*<1:2> signals output from respective inverters 1636 are simply the address signals ARC*<1:2> and CNT*<1:2> applied to the input to the NAND gate 1632. The ARCL<1:2> and CNTL<1:2> signals output from respective inverters 1638 are the complement of the address signals ARC*<1:2> and CNT*<1:2> applied to the input to the NAND gate 1632. In summary, the external ARC addresses and external CNT address signals (and their complements) are either forced low during a block write or they are otherwise equal to the low order bits to the external or internal address.

A second set of four low order address circuits 1630B is provided for the right side of Banks 0 and 1 to generate ARCR<1:2> and CNTR<1:2> signals from bits 1 and 1 of the external and internal addresses, ARC*<1:2> and CNT*<1:2>, respectively.

The remaining bits of the internal and external address signals for the left side of Banks 0 and 1, i.e., the CNTL<3:8> and ARCL<0,3:8> signals, are generated by the control circuits 1600A shown in FIG. 14B. Specifically, respective inverters 1640 receive the incoming external address signals ARC<0,3:8>* and generate ARCL<0,3:8>. Bits 3–7 of the internal address signals, i.e., the CNTL<3:7> signals, are generated at the outputs of respective inverters 1642 which receive the incoming external address signals CNT<3:7>*. As explained below, bit 0 of the external address signals CNT<0> is used to control data path circuitry between the data bus and the memory array 110.

A second control circuit 1600B generates the remaining bits of the internal and external address signals for the right side of Banks 0 and 1, i.e., the CNTR<3:8> and ARCR<0, 3:8> signals, from the incoming internal address signals CNT<3:7> and the external address signals ARC<0,3:8> in the same manner as the control circuit 1600A for the right side.

As mentioned above, a determination is made whether a column corresponding to the internal and external addresses is defective before a determination is made whether the internal address or the external memory address will be used for the memory access. An active low column address strobe input buffer signal CASIB* provides an indication of whether the internal address or the external address will be used for a memory access. The CASIB* signal is generated by the address select input buffer circuit 820 shown in FIG. 9C as explained above. The CASIB* signal is applied to one input of a NOR gate 1646 in the column match circuitry 1670A, B for the left and right sides of the array. The other input of the NOR gate 1646 receives the output of a NAND gate 1648. The NAND gate 1648 receives an active low redundancy check off signal REDOFF* and active low redundancy test signal REDCTET*, both of which are high in normal operation. Thus, the NAND gate 1648 continuously enables the NOR gate 1646 so that the NOR gate 1646 functions as an inverter in normal operation.

Similarly, a NOR gate 1650, which receives the complement of CASIB* through an inverter 1652, also functions as an inverter in normal operation since it is continuously enabled by the NAND gate 1648. The output of the NAND gate 1646 enables a NAND gate 1654 when CASIB* is active low, while the output of the NAND gate 1650 enables a NAND gate 1656 when CASIB* is inactive high. The complement of the column address trap signal CAT* is applied to an input of both NAND gates 1654, 1656 so that one of the NAND gates 1654, 1656 will output a negative going pulse responsive to each CAT* pulse. A select input buffer SELIB* pulse is generated when column address strobe input buffer CASIB* signal is active low, and a select column counter SELCNT* pulse is generated with CASIB* is inactive high. As explained further below, SELIB* selects the results of the redundancy check for the external address, while SELCNT* selects the results of the redundancy check for the internal address.

The actual checking of addresses to determine if there is a need to substitute a redundant column for a defective column is performed by redundant column match circuitry 1670A, 1670B. The redundant column match circuitry 1670A is used to detect defective columns on the right side of Banks 0 and 1 while redundant column match circuitry 1670B is used to detect defective columns on the left side of Banks 0 and 1. Each redundant column match circuit 1670A includes 8 comparison circuits 1674A that are used to compare the external addresses to the column addresses of 8 defective columns. The 8 comparison circuits 1674A correspond to a respective one of 8 columns designated by the 3 low order bits A2–A0 of the address. As explained below, the comparison circuit 1674A for each column is enabled whenever its corresponding low order bits A2–A0 are high to designate that column. For example, the comparison circuit 1674A for column 8n+4 (where N is any integer) would be enabled by any address having 100 for its address bits A2–A0. As also explained below, the value of 8n is designated by the 5 high order bits A7–A3.

In the operation of each comparison circuit 1674A, the precharge redundant column PREREDCL* signal at the output of the inverter 1612 goes low to turn on a PMOS transistor 1680, thereby applying power to 5 fuse set circuits 1681 corresponding to each of the 5 high order bits of the address. Thus, within a comparison circuit 1674A for column 8n+4 (i.e., columns 4, 12, 20, 28, etc.), the five fuse set circuits 1681 correspond to respective 5 high order address bits A7–A4 to designate the value 8n. Each fuse set circuit 1681 includes a pair of fuses 1682, 1684 corresponding to one address bit and its complement, The fuses 1682, 1684 are coupled to respective NMOS transistors 1686, 1688. The gates of the NMOS transistor 1686 in the five fuse set circuits 1681 are coupled to respective bits 7–3 of the complement of the address. The gates of the NMOS transistor 1688 in the five fuse set circuits 1681 are coupled to respective 7–3 of the address. For example, the NMOS transistor 1686 may receive bit A4 while the NMOS transistor 1688 may receive bit A4*. Other fuse set circuits 1681 receive other high order bits of the address.

Each of the five fuse set circuits 1681 in a comparison circuit 1674A for a given column is programmed by blowing the fuses 1682, 1684 in a conventional manner to designate a respective bit of the 5 bits designating a defective column. In the example above, one of the comparison circuits 1674A is used to designate that a column corresponding to an address 2 or 10 or 18, etc., i.e., 000010 or 01010 or 10010 or X010 is defective. The fuse set circuits 1681 for that comparison circuit 1674A is programmed according the 5 higher order bits, A7–A3, to designate which group of 8 columns has a defective second column. Thus, for example, the A7–A3 bits of the comparison circuit would be programmed with 00110 (i.e., 8n=00110 or 48) to designate that column 50 (i.e., 8n+2) is defective and 10011 (i.e., 8n=10011 or 152) to designate that column 154 (i.e., 8n+2) is defective. In the above example where column 50 is defective, bit A3 would be programmed low by blowing the fuse 1682 and leaving fuse 1684 intact in the fuse set circuit 1681 for bit A3. Similarly bit A4 would be programmed high by blowing the fuse 1684 and leaving fuse 1682 intact in the fuse set circuit 1681 for bit A4, etc.

In the above example, the high coupled through the PMOS transistor 1680 in the comparison circuit 1674A for column 8n+2 is applied to five fuse set circuits 1681. As stated above, the fuse set circuit 1681 for the A3 bit is programmed low by blowing fuse 1682 and leaving fuse 1684 intact. For column 50, the A3 bit of an internal or external address will be low and its complement A3* will be high. Thus, when an internal or external address for column 50 is applied to the comparison circuit 1674A for column 8n+2, the NMOS transistor 1686 in the fuse set circuit 1681 for bit A3 will be turned on by the high A3* bit and the NMOS transistor 1688 will be turned off by the low A3 bit. Thus, the signal COMP will be isolated from both the EN TOP line and the EN BOT line.

As explained below, the significance of the signal COMP being isolated from both the EN TOP line and the EN BOT line is that the COMP signal can remain high to designate a bit match rather than being pulled low through the EN TOP and/or EN BOT lines. By way of further example, if column 50 is defective, the fuse 1684 in the fuse set circuit for bit A4 in the column 8n+2 comparison circuit 1674 is blown and the fuse 1682 is left intact. When an address for column 50 is received by the fuse set circuit, the NMOS transistor 1688 in the fuse set circuit 1681 for bit A4 will be turned on by the high A4 bit and the NMOS transistor 1686 will be turned off by the low A4* bit. Thus, the signal COMP for the A4 fuse set circuit will also will be isolated from both the EN TOP line and the EN BOT line. The five fuse set circuits 1681 for the 8n+2 column will thus be programmed as follows, and the transistors 1686, 1688 will have the following states:

TABLE 2

| Bit | Fuse 1682 | Tr. 1686 | Fuse 1684 | Tr. 1688 |
|---|---|---|---|---|
| $A_7 = 0$ | Blown | ON | Intact | OFF |
| $A_6 = 0$ | Blown | ON | Intact | OFF |

TABLE 2-continued

| Bit | Fuse 1682 | Tr. 1686 | Fuse 1684 | Tr. 1688 |
|---|---|---|---|---|
| $A_5 = 1$ | Intact | OFF | Blown | ON |
| $A_4 = 1$ | Intact | OFF | Blown | ON |
| $A_3 = 0$ | Blown | ON | Intact | OFF |

The above table has been arranged with the fuses and transistors that are in series with each other positioned adjacent to each other in the table (i.e., fuse 1682 is in series with transistor ("Tr.") 1686, and fuse 1684 is in series with transistor 1688). It will be apparent from Table 1 that, for all of the fuse set circuits 1681, the COMP signal will be isolated from both the EN TOP line and the EN BOT line, thereby allowing the COMP signals for all 5 fuse set circuits 1681 to be high as explained below. As also explained below, the COMP signal being high for all 5 fuse set circuits 1681 in a comparison circuit 1674 for a column, indicates that the internal or external address is attempting to access a defective column.

When PREREDC* goes high on the trailing edge of CLK, the PMOS transistor 1680 turns off to isolate power from the fuses 1682, 1684 in each fuse set circuit 1681. However, because of internal capacitances, the voltages remain stable for a short period of time. When PREREDC* goes high, a pair of NMOS transistors 1690, 1692 are turned on so as to ground the EN TOP and EN BOT lines. However, as mentioned above, if the signal COMP is isolated from the EN TOP and EN BOT lines, the COMP signal remains high for a short period. The COMP signal is applied to an inverter 1694 which is connected to a second inverter 1696 output-to-input to form a latch. As a result, an active low COMP* signal is generated by each of the 5 fuse set circuits 1681 to indicate that an address corresponding to a defective column.

As mentioned several times above, each of the 8 comparison circuits 1674 corresponds to one of 8 columns so that each comparison circuit 1674 can be used to designate that column 8n+c is defective, where c is the column corresponding to the comparison circuit 1674 and, as explained above, 8n is designated by the high order address bits. Each comparison circuit 1674 is assigned a respective column by disabling the comparison circuit 1674 from operating when an address corresponds to a different column. As explained above, a comparison circuit 1674 can designate a defective column in the COMP signal only if all 5 of its fuse set circuits 1681 are high. Thus, if a comparison circuit 1674 is disabled from generating high COMP signals in its fuse set circuits 1681, it cannot designate a defective column for a column other than the column to which it corresponds.

A comparison circuit 1674 is disabled from designated other than its corresponding column as defective by selectively grounding the COMP signal line through one or both NMOS transistors 1697, 1698. In the comparison circuit 1674A, the external address signals ARC<1:2> and ARC*<1:2> are applied to the gates of the transistors 1697, 1698 so that the COMP signal will be grounded for all columns 8n+c other than the two columns to which it corresponds. Similarly, in the comparison circuit 1674B, the external address signals CTN<1:2> and CTN*<1:2> are applied to the gates of the transistors 1696, 1698 so that the COMP signal will be grounded for all columns 8n+c other than the two columns to which it corresponds. For example, to designate a comparison circuit as corresponding to column 8n+2, the transistors 1696, 1698 are connected to address bits or their complement so that they will all be off when the low order address bits are 01 for a column 8n+2, i.e., $A_2A_1=01$. Thus, the transistor 1696 for address bit 1 receives A1* thereby turning off transistor 1696, and the transistor 1698 for address bit 2 receives $A_2$ thereby turning off transistor 1698. As a result, the COMP signal can be high if the fuses 1682, 1684 are blown to indicate that a column 8n+2 is defective. The NMOS transistors for the all 8 comparison circuits 1674 are connected according to the following table:

TABLE 3

| Col. | Binary Val. | Tr. 1698 | Tr. 1696 |
|---|---|---|---|
| 0, 1 | 00x | $A_2$ | $A_1$ |
| 2, 3 | 01x | $A_2$ | $A_1$* |
| 4, 5 | 10x | $A_2$* | $A_1$ |
| 6, 7 | 11x | $A_2$* | $A_1$* |

The circuit details of the sets of 8 comparison circuits 1674A, B have been explained with reference to the 8 comparison circuits 1674A which check to determine if an external address corresponds to a location in the left side of memory Banks 0 and 1 with a defective column. As mentioned above, a second set of 8 comparison circuits 1674B perform the same function to checks to determine if an internal address generated by the column counter corresponds to a location in the left side of memory Banks 0 and 1 with a defective column.

As mentioned above, the low order address circuits 1630A force the address signals ARCL<1:2>, ARCL*<1:2>, CTNL<1:2>, CTNL*<1:2> to be low during a block write. As a result, the transistors 1697, 1698 in all eight comparison circuits 1674A are turned off, thereby enabling all 8 of the comparison circuits 1674A. The comparison circuits 1674A for all 8 columns therefore check their 5 fuse set circuits to determine if any column in the block is defective.

The comparison circuits 1674A, B in the column match circuit 1670B operate in the same manner to determine if an external address and an internal address generated by the column counter correspond to a location in the right side of memory Banks 0 and 1 with a defective column.

The COMP* output of each of the 8 external address comparison circuits 1674A is applied to a respective one of 8 latch circuits 1700 in the column match circuitry 1670A as compare input buffer COMP IB* signals. The latch circuits 1700 for the 8 columns also receive respective COMP* signals from corresponding internal address 8 internal address comparison circuits 1674B as compare counter COMP CNT* signals. Thus, for example, the latch circuit 1700 that receives the COMP IB* signal from the external address comparison circuit 1674A for column 2 (i.e., transistors 1698, 1697 connected to $A_2A1$*) also receives the COMP CNT* signal from the internal address comparison circuit 1674B for column 2 (i.e., transistors 1698, 1697 also connected to $A_2A_1$*).

The latch circuit 1700 is where the decision is first made as to whether the memory arrays 211 are being accessed according to an external address or an internal address from the burst counter. Thus, unlike conventional memory devices, this decision is not made until after both the internal address and the external address have been checked for the need to use a redundant column. The COMP IB* and COMPCNT* signals from the 2 sets of corresponding comparison circuits 1674A, B are applied to respective NOR gates 1702, 1704 in the corresponding latch circuit 1700. The NOR gate 1702 also receives the complement of a memory bank designation LBANK* which designates that the left portion of the memory array is being addressed. The NOR gate 1704 also receives a memory bank designation BANK* through an inverter 1706 which receives the BANK signal. The BANK* signal enables the NOR gate 1702 if an external address is to be written to the bank corresponding to the column match circuitry 1670A while the LBANK* signal enables the NOR gate 1704 if an internal address is to be written to the bank corresponding to the column match circuitry 1670A.

The output of the NOR gates 1702, 1704 are applied to respective pass gates 1710, 1712 each controlled by a select signal and its complement applied through an inverter 1714. The pass gate 1702 is controlled by the active low select input buffer SELIB* signal when the memory array 211 is to be accessed by an external address, and the pass gate 1704 is controlled by the active low select counter SELCNT* signal when the memory array 211 is to be accessed by an internal address. It will be recalled that the NAND gate 1654 generates a negative going select input buffer SELIB_L* pulse for each column address trap CATh* pulse when column address strobe input buffer CASIB_L* signal is active low. Conversely, the NAND gate 1654 generates a negative going column counter SELCNT* pulse for each column address trap CATL* pulse when CASIB_L* is inactive high. Thus, when an external address is to be used to access the memory array 211, a SELIB L* pulse enables the pass gate 1710 to apply a logic level to a latch 1720 indicative of whether a bit in an external address corresponds to a defective column.

When an internal address is to be used to access the memory array 211, a SELCNT_L* pulse enables the pass gate 1712 to apply a logic level to the latch 1720 indicative of whether a bit in an internal address corresponds to a defective column. The output of the pass gate 1710 will be high if a bit corresponding to the latch circuit 1700 for an external address matches a corresponding bit of an address for a defective column. Similarly, the output of the pass gate 1712 will be high if a bit corresponding to the latch circuit 1700 for an internal address matches a corresponding bit of an address for a defective column.

The latch 1720 is formed by a pass gate 1722 connected in a loop with a NAND gate 1724 and an inverter 1726. The NAND gate 1724 is enabled in normal operation since an active low redundancy off REDOFF* signal is normally high. The pass gate 1722 is enabled to latch the incoming signal by the column address trap CATL signal and its complement applied to the pass gate 1722 through an inverter 1728. As explained above, the CATL signal is generated by the address trap control circuit 1614 responsive to the clock CLK signal whenever the memory array is not being accessed by a block write. The CATL signal thus latches the output of either the pass gate 1710 or the pass gate 1712 to the output of the inverter 1726 to generate a redundant column select RCSB0<0:3> signal. The eight latch circuits 1700 in the column match circuitry 1670A output 4 redundant column select RCSB0 signals for 4 bits of an address in the left side of Bank 0 and 4 redundant column select RCSB1 signals for 4 bits of an address in the left side of Bank 1. Similarly, the eight latch circuits 1700 in the column match circuitry 1670B output 4 redundant column select RCSB0 signals for 4 bits of an address in the right side of Bank 0 and 4 redundant column select RCSB1 signals for 4 bits of an address the right side of Bank 1. Together, the RCS signals from all of the latch circuits 1700 in both column match circuits 1640A, B comprise 8 bits that will all be high if an internal or external address designates an address in Bank 0 having a defective column, and 8 bits that will all be high if an internal or external address designates an address in Bank 1 having a defective column.

The 8 RCSB0 signals from the column match circuitry 1670A are applied to a decoder circuit 1730A (FIG. 14B) formed by a pair of NOR gates 1732, 1734. having their outputs applied to inputs of a NAND gate 1736. The decoder circuit 1730A detects when the outputs of all 8 latch circuits 1700. in column match circuitry 1670A are low, and then outputs a low COLBANK_L signal. Similarly, a decoder circuit 1730B detects when the outputs of all 8 latch circuits 1700 in column match circuitry 1670B are low, and then outputs a low COLBANK_R signal. The COLBANK_L signal indicates that an internal or external address is not attempting to access an address having a defective column in the left side of Banks 0 or 1 of the memory array 211. Similarly, COLBANK_R signal indicates that an internal or external address is not attempting to access an address having a defective column in the right side of Banks 0 or 1 of the memory array 211. Thus, if COLBANK_R and COLBANK_L are both low, it is not necessary to substitute a redundant column for a defective column being addressed.

Redundant Row Compare Circuitry

Figure 15A:
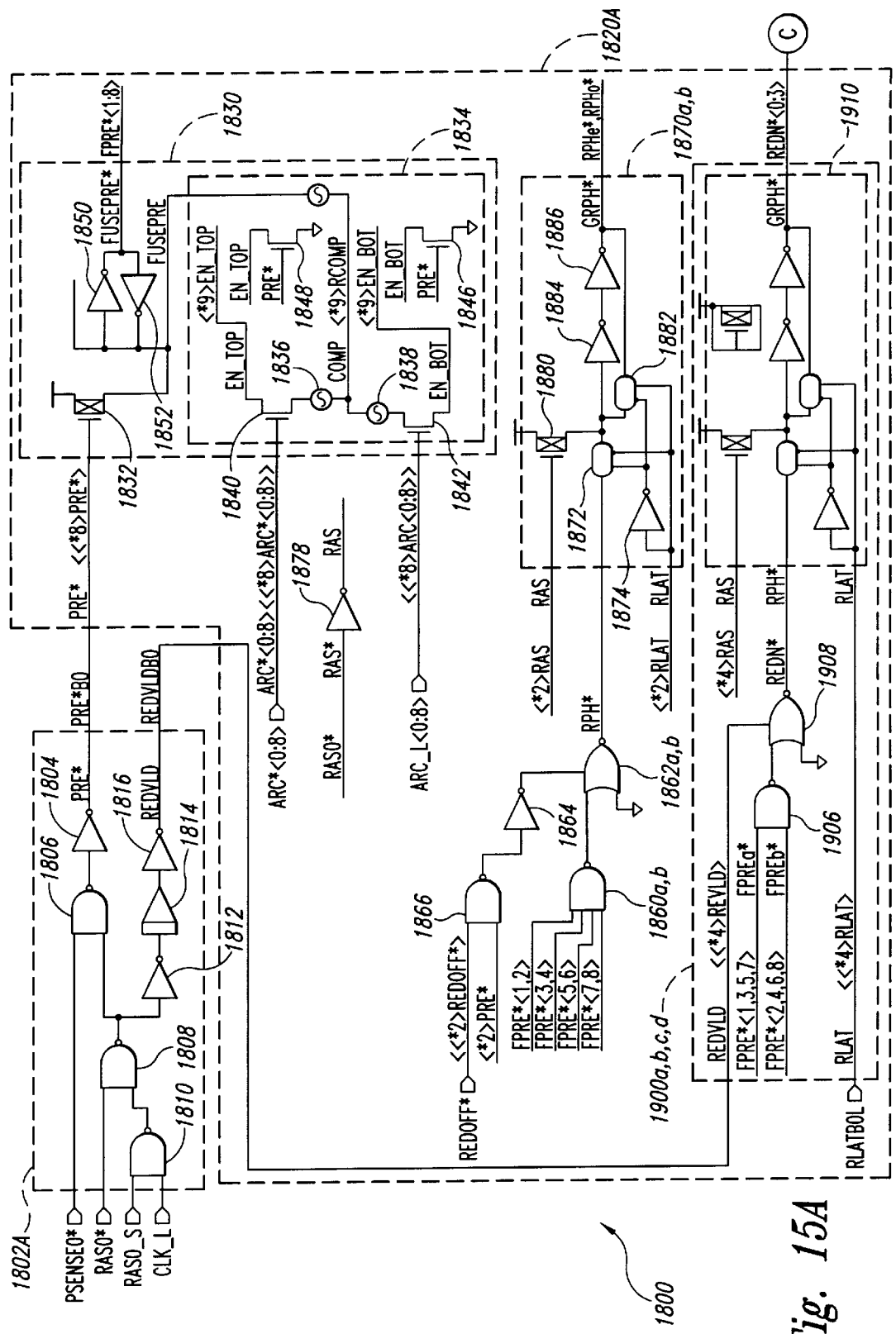
FIGS. 15A and 15B together form a partial schematic, partial block diagram of redundant row compare circuitry for the memory device of FIG. 3.
Figure 15B:
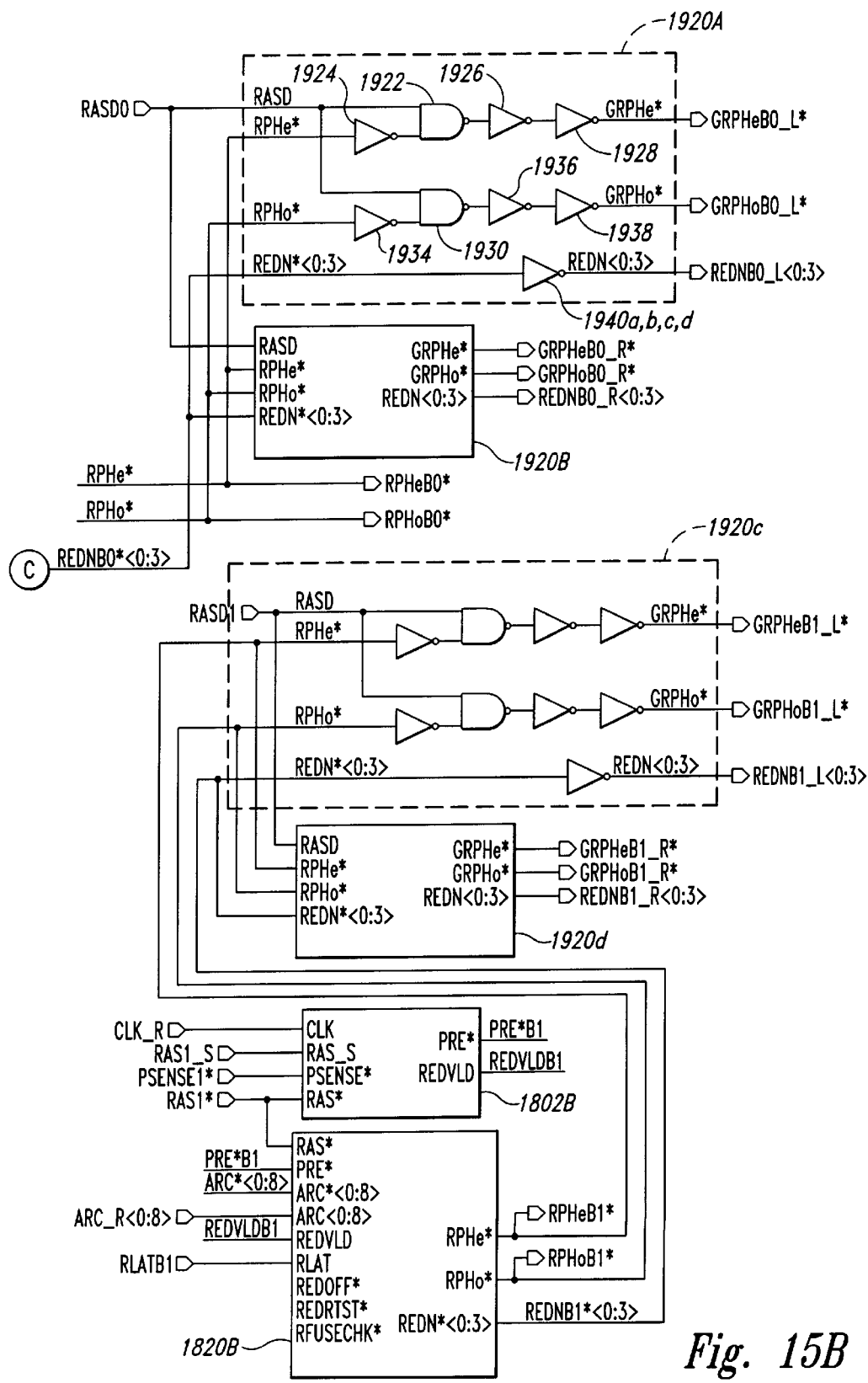

A redundant row compare circuit 1800 shown in FIGS. 15A–15B is used for checking redundancy of the rows of memory cells in the array 211 (FIG. 3). The circuitry for Bank 0 is shown in detail while the circuitry for Bank 1 is shown in block diagram form. The components used for both banks of the memory array are designated with the same reference numerals. However, the circuitry for Bank 0 of the array is generally identified with the reference designation "A" and the circuitry for Bank 1 of the array is generally identified with the reference designation "B". Also, signals associated with the left sides of Banks 0 and 1 are sometimes identified in FIGS. 15A–15B with a designation "L" and signals associated with the right sides of Banks 0 and 1 are sometimes identified in with a designation "R".

The redundant row compare circuit 1800 is operated by a number of control signals, some of which are generated by control circuits 1802A, 1802B. The control circuit 1802A generates an active low precharge Bank 0 PRE*B0 signal at the output of an inverter 1804 whenever either input to a NAND gate 1806 is low, i.e., whenever PSENSE0* is low or the output of a NAND gate 1808 is low. The output of the NAND gate 1808 will be low whenever RAS0* is inactive high and the output of a NAND gate 1810 is high, i.e., either CLK_L is low or a RAS setup RAS0_S signal is inactive low. Thus, the precharge PRE* signal will be active low if any of 3 conditions occur. First, PRE* will be low whenever PSENSE0* is low, which normally occurs when the sense amps for a row have been activated. Second, PRE* will be low when RAS0* is high and CLK_L is low. Third, PRE* will be low when RAS0* is high and RAS0_S is low. However, in normal operation PRE* is driven low by a low PSENSE0* rather than by RAS0* being high and CLK_L or RAS0_S being low.

After the memory array has been accessed, PSENSE0* goes high. However, PRE* does not go high until the active low row address strobe for Bank 0 RAS0* goes low or the RAS setup signal RAS_S is high at the leading edge of CLK_L. In operation, the RAS setup signal RAS_S is validated by CLK_L thereby causing the output of the NAND gate 1810 to go low which causes PRE* to go high. Before the falling edge of CLK_L which would cause PRE* to go low, RAS0* has gone low, thereby holding PRE* high subsequent to the falling edge of CLK_L. Using both the RAS setup RAS_S signal and the active low RAS signal in this manner results in an earlier check for a defective row, thereby maximizing the speed of the memory device.

The control circuit 1802A also generates an active high REDVLD signal responsive to the output of the NAND gate 1808 going high, which occurs whenever either RAS0* is active low or RAS0_S is active high during CLK_L. The high at the output of the NAND gate 1808 is applied through an inverter 1812 to a delay circuit 1814. The delayed low from the delay circuit 1814 is then coupled through an inverter 1816 to output a high REDVLDB0 signal.

The checking of addresses to determine if there is a need to substitute a redundant row for a defective row is performed by two row compare circuits 1820A, B each of which includes eight redundant row match circuits 1830. For the sake of brevity, only the row compare circuit 1820A for Bank 0 is shown in detail in FIGS. 15A–15B and explained in detail herein. Thus, the memory device can replace 8 defective rows for each bank. Each of the 8 redundant row match circuits 1830 includes 9 fuse set circuits 1834 that are used to compare the 9 bits of the row address to the addresses or rows that have been recorded in the fuse set circuits 1834 as being defective. When a positive comparison is made between an incoming row address and the address of a defective row encoded in the 9 fuse set circuits 1834, a respective fuse precharge FPRE* signal goes low signifying that the incoming row address is for a defective row. A low FPRE* for any of the 4 odd row match circuits is detected by a odd detect gate, and a FPRE* for any of the 4 even row match circuits is detected by an even detect gate. Finally, the FPRE* signals for each pair of adjacent row match circuits 1830 (e.g., match circuits 1 and 2) are applied to respective match gates to provide 4 match signals. Any of the 8 redundant rows can then be determined from the 4 match signals (i.e., row 1) (or 2, row 3) (or 4, row 5 or 6, row 7 or 8) in combination with the outputs from the odd and even detect gates.

With reference to FIGS. 15A–15B, in the operation of each row match circuit 1830, the precharge PRE* signal at the output of the control circuit 1802 goes low to turn on a PMOS transistor 1832 in each of the 8 fuse match circuits 1830. When the PMOS transistor 1832 turns on, it applies power to the 9 fuse set circuits 1834 in the row match circuit 1830. Each fuse set circuit 1834 includes a pair of fuses 1836, 1838 corresponding to one row address bit and its complement. The fuses 1836, 1838 are coupled to respective NMOS transistors 1840, 1842. The gate of the NMOS transistor 1840 in each of the 9 fuse set circuits 1834 is coupled to a respective bit 0–8 of the complement of the row address. The gate of the NMOS transistor 1842 in each of the 9 fuse set circuits 1834 is coupled to a respective bit 0–8 of the row address. For example, the NMOS transistor 1840 may receive a complementary row address bit ARC*<4> while the NMOS transistor 1842 may receive a row address bit ARC<4>. Other fuse set circuits 1834 receive other bits of the row address.

Each of the 9 fuse set circuits 1834 in a row match circuit 1830 is programmed by blowing the fuses 1836, 1838 in a conventional manner to designate a respective address bit of the 9 bits of an address for a defective row. For example, the A8–A0 bits of the comparison circuit would be programmed with "100110110" to designate that row number 310 is defective. In the above example where row 310 is defective, the third address bit would be programmed high by blowing the fuse 1838 and leaving fuse 1836 intact in the fuse set circuit 1834 for the third address bit. Thus, when the address (i.e., ARC<0:8>) for a defective row (e.g., "100110110") is received by the row match circuits 1830, a high ARC<2> signal and a low ARC*<2> signal are applied to the fuse set circuit 1834 for the third address bit. The high ARC<2> signal turns on the NMOS transistor 1842. However, since the fuse 1838 has been blown, the compare COMP line remains isolated from an NMOS transistor 1846. The low ARC*<2> signal does not turn on the NMOS transistor 1840 thereby isolating the compare COMP line from an NMOS transistor 1848, despite the fact that the fuse 1836 is intact.

Similarly the fourth address bit would be programmed low by blowing the fuse 1836 and leaving fuse 1838 intact in the fuse set circuit 1834 for the fourth address bit. When the address "100110110" for the defective row is received by the row match circuits 1830, the low ARC<3> signal and the high ARC*<3> signal are applied to the fuse set circuit 1834 for the fourth address bit. The high ARC*<3> signal turns on the NMOS transistor 1840, but the blown fuse 1836 keeps the compare COMP line isolated from the NMOS transistor 1846. The low ARC<3> signal turns off the NMOS transistor 1842 thereby isolating the compare COMP line from an NMOS transistor 1846 despite the presence of the intact fuse 1838.

The 9 fuse set circuits 1834 for a row match circuit 1830 will thus be programmed with "100110110" as follows to allow the row match circuit 1830 to designate that row 310 is defective:

TABLE 4

| ARC Bit | Fuse 1838 | Tr. 1842 | Fuse 1836 | Tr. 1840 |
| --- | --- | --- | --- | --- |
| $ARC_0 = 0$ | Intact | OFF | Blown | ON |
| $ARC_1 = 1$ | Blown | ON | Intact | OFF |
| $ARC_2 = 1$ | Blown | ON | Intact | OFF |
| $ARC_3 = 0$ | Intact | OFF | Blown | ON |
| $ARC_4 = 1$ | Blown | ON | Intact | OFF |
| $ARC_5 = 1$ | Blown | ON | Intact | OFF |
| $ARC_6 = 0$ | Intact | OFF | Blown | ON |
| $ARC_7 = 0$ | Intact | OFF | Blown | ON |
| $ARC_8 = 1$ | Blown | ON | Intact | OFF |

As explained below, the significance of the signal COMP being isolated from both NMOS transistors 1846, 1848 is that the COMP signal for each fuse match circuit 1834 remains high rather than being pulled low by one of the NMOS transistors 1846, 1848. The COMP lines for all 9 fuse match circuits 1834 in each row match circuit 1830 are connected to each other to provide one FUSEPRE signal for each row match circuit 1830. Thus, if all 9 address bits match the programmed bits of 9 respective fuse match circuits 1834, none of the COMP of the 9 fuse match circuits 1834 will be pulled low by an NMOS transistor 1846, 1848 to that FUSEPRE will be high. A high FUSEPRE signal from a row match circuit 1830 thus indicates that an incoming row address matches the address of a defective row that has been programmed in that row match circuit.

As explained above, the precharge PRE* signal at the output of the control circuit 1802 goes low to turn on the PMOS transistor 1832 thereby applying power to the fuse set circuits 1834 in the row match circuit 1830. When PRE* goes high as explained above, the PMOS transistor 1832 turns off to isolate power from the fuses 1836, 1838 in each fuse set circuit 1834. However, because of internal capacitances, the voltages remain stable for a short period of time. When PRE* goes high, the NMOS transistors 1846, 1848 are turned on to ground the EN TOP and EN BOT lines. However, as mentioned above, if the signal COMP is isolated from the transistors 1846, 1848, the COMP signal remains high for a short period. The COMP signal is applied to an inverter 1850 which is connected to a second inverter 1852 output-to-input to form a latch. The FPRE* signal at the output of the inverter 1850 will be low when PRE* is low to turn on the PMOS transistor 1832. If the incoming address matches an address of a defective row programmed in the row match circuit 1830, the FPRE* signal will remain high when PRE* goes low. Otherwise, one of the COMP lines from the 9 fuse match circuits 1834 will go low, thereby causing FPRE* to be latched high. The 8 row match circuits 1830 thus output 8 FPRE* signals, i.e., FPRE*<1:8> to detect up to 8 defective rows for Bank 0.

The odd numbered FPRE* signals, i.e., FPRE*<1,3,5,7> are applied to a first NAND gate 1860A while the even numbered FPRE* signals, i.e., FPRE*<2,4,6,8> are applied to a second NAND gate 1860B. Thus, the output of one of the NAND gates 1860A, B will be high if an incoming address matches the address of a defective row stored in one of the eight row match circuits 1830. The output of the NAND gate 1860A will be high if the incoming address matches the address of a defective row stored in an odd address match circuit 1830 (i.e., an address match circuit outputting FPRE*<1,3,5, or 7>), and the output of the NAND gate 1860B will be high if the incoming address matches the address of a defective row stored in an even address match circuit 1830 (i.e., an address match circuit outputting FPRE*<2,4,6, or 8>). The outputs of both NAND gates 1860A, B will be low only if the incoming address did not match the address of a defective row stored in any of the address match circuits 1830.

The output of each NAND gate 1860A, B is applied to a respective NOR gate 1862A, B each of which is enabled through a respective inverter 1864 when a respective NAND gate 1866 detects that PRE* is high and REDOFF* is high as it is in normal operation where the redundant row feature is enabled. Thus, when PRE* goes high, the NOR gates 1862A, B function as inverters to output low RPH* signals when a defective row has been detected by an odd or an even row match circuit 1830, respectively.

The RPH* signals are applied to respective latch circuits 1870A, B. Each latch circuit 1870A, B includes an input pass gate 1872 that is coupled to a row latch RLAT signal directly and through an inverter 1874. The pass gate 1872 is enabled when RLAT is low. RLAT is generated from RLATB0L which is a short negative-going pulse that is generated by the address decoder circuit when the active low Bank 0 row address strobe RAS0* signal goes low. It will be recalled that RAS0* goes low a short time after RAS0_S causes PRE* to go high. Thus, the output of the NOR gates 1862 are coupled through the pass gates 1872 shortly after the row match circuits 1830 output FPRE*<1:8>.

Prior to RLAT going low, RAS (which is generated by applying RAS0* to an inverter 1878) is low, thereby turning on a PMOS transistor 1880. The high RLAT also turns on a latching pass gate 1882 to connect a pair of inverters 1884, 1886 to each other input-to-output to form a latch. Thus, prior to RLAT going low, the GRPH output of the inverter 1886 is latched high. When RAS goes high to turn off the PMOS transistor, and RLAT goes low for a short time to enable the pass gate 1872. RLAT then shortly goes high to latch the input from the pass gate 1872 to the output of the inverter 1876 and disable the pass gate 1872. Thus, a short time after PRE* goes high, the latch circuits 1870A, B output low GRPH* signals corresponding to the outputs of the NOR gates 1862A, B, respectively. The latch circuit 1870A will output a low GRPH*oB0 signal if an incoming address matches the address of a defective row stored in an odd address match circuit 1830 (i.e., an address match circuit outputting FPRE*<1,3,5, or 7>). Similarly, the latch circuit 1870B will output a low GRPH*eB0 signal if an incoming address matches the address of a defective row stored in an even address match circuit 1830 (i.e., an address match circuit outputting FPRE*<2,4,6, or 8>).

The FPRE*<1–8> signals are also applied to 4 decoder circuits 1900A–D each of which receives FPRE* signals from adjacent row match circuits 1830 (e.g., match circuits 1 and 2). Thus, the decoder circuit 1900A receives FPRE*<1,2>, the decoder circuit 1900B receives FPRE*<3,4>, the decoder circuit 1900C receives FPRE*<5,6>, and the decoder circuit 1900D receives FPRE*<7,8>. The incoming FPRE* signals are applied to a NAND gate 1906 which will output a high if either FPRE* input is low indicative of an incoming address matching the address of a defective row. If a NOR gate 1908 is enabled by REDVLD being high, the REDN* output of the NOR gate 1908 will be low when either FPRE* input is low. The REDN* signal is applied to a latch circuit 1910 which operates in the same manner as the latch circuits 1870A, B. Thus, in the interest of brevity, a detailed explanation of its operation will not be repeated.

A short time after PRE* goes high, the latch circuit 1910 for each of the 4 decoder circuits 1900A–D outputs a respective low REDN*<0:3> signal if either of its corresponding row match circuits 1830 has detected an incoming address for a defective row. Thus, if a row match circuit 1830 outputs either FPRE*<1> low or FPRE*<2> low, the decoder circuit 1900A outputs a low REDN*<1> signal. If a row match circuit 1830 outputs either FPRE*<3> low or FPRE*<4> low, the decoder circuit 1900B outputs a low REDN*<2> signal. If a row match circuit 1830 outputs either FPRE*<5> low or FPRE*<6> low, the decoder circuit 1900C outputs a low REDN*<3> signal. Finally, if a row match circuit 1830 outputs either FPRE*<7> low or FPRE*<8> low, the decoder circuit 1900B outputs a low REDN*<4> signal. The redundant row corresponding to a row match circuit 1830 can be uniquely identified by the four REDN*<1:4> signals and the two GRPHoB0* and GRPHeB0* signals since the low REDN* signal designates a single even redundant row and a single odd redundant row, and the GRPHoB0* and GRPHeB0* signals validates either the odd row or the even row.

The REDN*<1:4>, GRPHoB0* and GRPHeB0* signals are applied to a gating circuit 1920A (FIG. 15B) that also receives an active high delayed row address strobe RASD0. The RPHeB0* signal signifying a defective even row is applied to a NAND gate 1922 though an inverter 1924. Thus, when the NAND gate 1922 is enabled by RASD0 being high, it outputs a low global even phase, Bank 0, left GPHeB0_L* signal through two inverters 1926, 1928. Similarly, the RPHoB0* signal signifying a defective odd row is applied to a NAND gate 1930 though an inverter 1934. When the NAND gate 1930 is enabled by RASD0 being high, it outputs a low global odd phase, Bank 0, left GPHoB0_L* signal through two inverters 1936, 1938. Finally, the four REDNB*<0:3> signals output from respective latch circuits 1900A, B, C, D are coupled through respective inverters 1940A, B, C, D to generate corresponding REDNB0_L<0:3> signals.

The global even phase, Bank 0, left GPHeB0_L* signal, the global odd phase, Bank 0, left GPHoB0_L* signal, and the four REDNB0_L<0:3> signals allow the identity of a redundant row used to replace a defective row for the left side of Bank 0 to be uniquely determined. A second gating circuit 1920B identical to the first gating circuit 1920A generates a global even phase, Bank 0, right GPHeB0_R* signal, a global odd phase, Bank 0, right GPHoB0_R* signal, and four REDNB0_R<0:3> signals which allow the identity of a redundant row used to replace a defective row for the right side of Bank 0 to be uniquely determined.

The remaining components of the redundant row compare circuit 1800 are identical to the above described components, and are used to generate the same signals for Bank 1 that have been described above for Bank 0. These components, which are shown in FIG. 15B, include a control circuit 1802B generating PRE*B1 in the same manner as the control circuit 1802A generates PRE*B0, and it is used for the same purpose and in the same manner. A second row compare circuit 1820B generates RPHeB1*, RPHoB1*, and four REDNB1*<0:3> signals for Bank 1 in the same manner and for the same purpose that the row compare circuit 1820A generates RPHeB0*, RPHoB0*, and four REDNB0*<0:3> signals for Bank 0 as explained above. Finally, the RPHeB1*, RPHoB1*, and REDNB1*<0:3> signals from the second row compare circuit 1820B are applied to two gating circuits 1920C, D which generate the same signals for Bank 1 that were generated as described above for Bank 1. Specifically, the gating circuit 1920C generates a global even phase, Bank 1, left GPHeB1_L* signal, a global odd phase, Bank 1, left GPHoB1_L* signal, and four REDNB1_L<0:3> signals. Similarly, the gating circuit 1920D generates a global even phase, Bank 1, right GPHeB1_R* signal, a global odd phase, Bank 1, right GPHoB1_R* signal, and four REDNB1_R<0:3> signals.

Address Predecoder and Latch

Figure 16A:
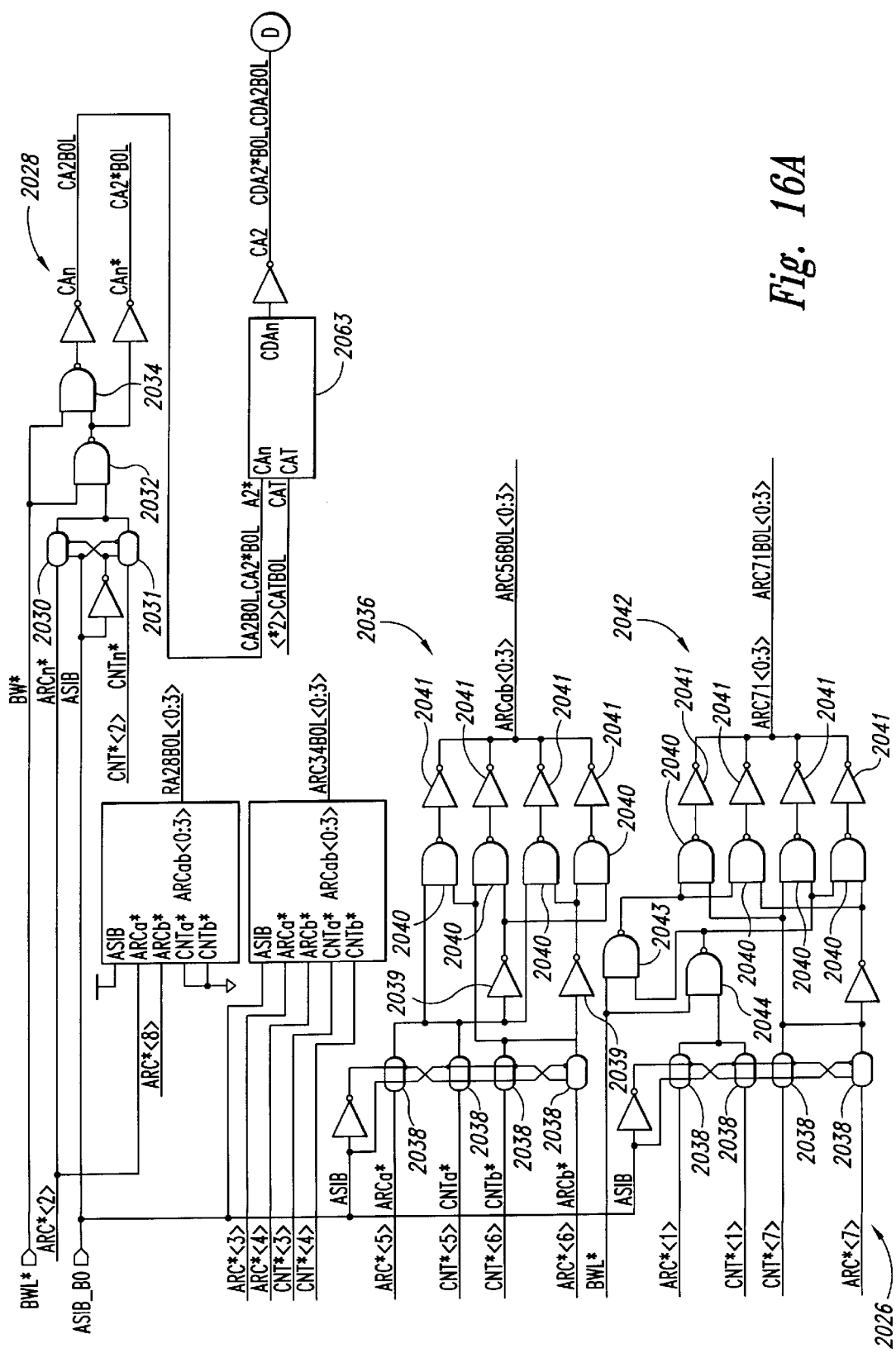
FIG. 16A is a partial schematic, partial block diagram of address predecoder circuitry for the memory device in FIG. 3.

Referring to FIG. 16A, the address predecoder 2026 receives the ARC*<2> signal and CNT*<2> signals from the input latches in the address input circuitry 2080 (FIG. 10), and a pair of multiplexers 2030, 2031 pass one of these signals in response to the address select in buffer signal for Bank 0 ASIB_B0 from the CAS control circuit 600 (FIG. 9A). If the ASIB signal is high, indicating that the address was externally generated, then the multiplexer 2030 passes the ARC*<2> signal to a NAND gate 2032. Conversely, if the ASIB_0 signal is low, indicating that the address was generated by the column counter, then the multiplexer 2031 passes the CNT*<2> signal to the NAND gate 2032. The NAND gate 2032 also receives the BWL* signal and outputs a column address signal for the left half of Bank 0 CA2*B0L. The NAND gate 2034, operating essentially as an OR gate, outputs a high value, that is inverted to a low value, when either BWL*, ARC*<2> or CNT*<2> are low. A NAND gate 2034 receives the output of the NAND gate 2032 and the BWL* signal and outputs a low value only when both inputs are high. The CA2*B0L signal is input to predecoder latches (described below) to generate a column address signal CA2 that is employed by decoders in the data path circuitry to generate, with CA1 and CA0 signals, the IOSEL signals for selecting one of the eight I/O lines 146 (FIG. 4C). The CA2 signal is also employed to enable or select between each of the two column decoder halves 162, 162' (FIG. 4C). As explained below, when CA2 is low, it selects a lower order column decoder 162, which selects column 0–64 under the GCOL0–64 signal, while when high, it selects the high order of column 65–128 based on the GCOL65–128 signal. By dividing the column decoder into two sections, the present invention saves current since it need not energize an entire column decoder and corresponding column lines.

Three predecoder cell circuits 2036 preliminarily decode two of the eight or nine address bits provided to the predecoder circuit 2028, only one of which is shown in detail in FIG. 16A as predecoding address bits 5 and 6. The remaining predecoder cell circuits 2036 operate substantially identically, except that they predecode address bits 3 and 4, and 2 and 8. The ARC*5, ARC*6, CNT*5 and CNT*6 signals are each provided to one of four multiplexer circuits 2038, which outputs the ARC* signals in response to a high ASIB_B0 and output the CNT* signals in response to a low ASIB_B0. The output of the multiplexers 2038 are input to two of four NAND gates 2040, and inverted by inverters 2039 and input to the other two NAND gates. The NAND gates 2040 in turn produce four output signals based on only two input signals. For example, if ASIB_B0 is high, then the ARC*5 and ARC*6 signals are input to the NAND gates 2040. The uppermost NAND gate 2040 receives the ARC*5 and ARC*6 signals and outputs a low value if both are high, while the lowermost NAND gate receives the inverted ARC*5 and ARC*6 signals and outputs a high value. For any combination of input signals, only one of the NAND gates 2040 will output a low value. One of four inverters 2041 are coupled to each of the NAND gates 2040 to invert the output therefrom, as the address for row or column Bank 0 left for bits 5, 6 signal ARC56B0L<0:3>.

A block write predecoder 2042 receives the ARC*<1>, ARC*<7>, CNT*<1> and CNT*<7> signals and is substantially similar to the predecoder cell circuits 2036. The block write predecoder 2042, however, also includes a pair of NAND gates 2043, 2044 that each receive the BWL* signal. The NAND gate 2044 also receives the ARC*<1> or CNT*<1> signal, while the NAND gate 2043 also receives the output of the NAND gate 2044. The NAND gates 2043 provides its output to the two uppermost NAND gates 2040, while the two lowermost NAND gates 2040 receive the ARC*<7> or CNT*<7> signals. Whenever BWL* is low, the NAND gates 2043, 2044 both output high values to the NAND gates 2040, but when BWL* is high, the NAND gates 2043, 2044 output values dependent upon the value of ARC*<1> (or CNT*<1>).

Referring to FIG. 16B, a global phase enable circuit 2046 includes a one-shot circuit 2048 that receives the RAS0* signal and produces a row latch Bank 0 left signal RLATB0L, which is delayed and employed to latch a RA28B0L0–3 signal in each of four global phase latches 2049. Only one of the global phase latches 2049 are shown in FIG. 16B for generating the global phase or even rows of Bank 0 left, bit 0, signal GPHeB0L*0. The three remaining global phase latches 2049 produce the GPHEB0L*1–3 signals. Additionally, four identical global phase enable latches generate the global phase for odd rows of Bank 0 left signals GPHoB0L*<0:3>.

Within each of the global phase latches 2049, a NAND gate 2050 gates a high value for the RA28B0L0–3 signals into the latch when the NAND gate simultaneously receives a high global phase enable signal for the even rows of Bank 0 GPHEN_eB0L. A NAND gate 2051 gates the high RA28B0L0–3 signals from the latch when the NAND gate simultaneously receives the high latch output and a high RASD0 signal.

A series of NOR gates 2052, 2053 and NAND gates 2054, 2055 produce the global phase enable signals for even and odd rows of the left side of Bank 0 (signals GPHEN_eB0L and GPHEN_oB0L), based on the least significant address bit, ARC*<0>, RAS0*, and a row phase signal for even and odd rows of Bank 0 RPHeB0 and RPHoB0. The NOR gate 2052 receives the RAS0* signal and the inverted ARC*<0> signal, and outputs a high value to the NAND gate 2054 only when RAS0* is low, but ARC*<0> is high. The NOR gate 2053 receives the RAS0* signal and the ARC*<0> signal, and outputs a high value to the NAND gate 2055 only when these two input signals are low. An AND gate 2056, consisting of an inverter coupled to the output of a NAND gate, receives the RPHeB0 and RPHoB0 signals and outputs a high only when both of these input signals are low. Only when both of the inputs are high, do the NAND gates 2054, 2055 output low values, which in turn are inverted to high values to produce the GPHEN_eB0L and GPHEN_oB0L signals. The GPHEN_eB0L and GPHEN_oB0L signals are employed by the row decoders to select between even and odd rows, as described below.

Referring to FIG. 16C, a column address trap circuit 2058, which produces a column address trap signal for Bank 0 left (CATB0L), includes a three input NAND gate 2059 that receives the block write complete BWC* signal, the CLK_L signal, and an inverted and 4 nanosecond delayed CLK_L signal. The NAND gate 2059 produces a periodic four nanosecond low pulse for the CATB0L signal, which is amplified by a pair of inverters, only when BWC* is high. The width of the pulse can be altered by simply altering the value of the delay element used to delay the CLK_L signal. In general, the delay elements employed herein can be altered to provide greater or shorter width pulses or delays if necessary.

A NAND gate 2060 enables the NAND gate 2059 only when the NAND gate 2060 receives high COL and L_BANK0 signals. Each of three groups of predecoder latches 2062 for pairs of address bits receive the CATB0L signal and trap or latch column address bits for Bank 0 left 3 and 4, 5 and 6 and 1 and 7 (input signals ARC34B0L0–3, ARC56B0L0–3, and ARC71B0L0–3), where each group includes four of such latches to receive one bit 0–3 of the input signals. Likewise, the latches receive the RLATB0L signal which traps or latches row address bits for Bank 0 left 3 and 4, 5 and 6 and 1 and 7 for input signals ARC34B0L0–3, ARC56B0L0–3, and ARC71B0L0–3 from the address predecoder circuitry 2026. In other words, the address predecoder circuitry 2026 receives the address bits 1–8, and predecodes groups of two of such bits into groups of four bits, only one of which has a high value (for a total of 16 bits). The predecoder latches 2062, in turn, then latch a corresponding one of each of such 16 bits.

A pair of predecoder latches 2063 receive the CATB0L signal and trap or latch the CA2B0L, CA2B0L* signals and output the CDA2*B0L and the CDA2B0L signals. The operation of the predecoder latches 2062 are substantially similar to the operation of other latches described in detail herein, and are not described for purposes of brevity and clarity. The predecoder latches 2062, 2063 output row and column addresses for Bank 0 left RA34*B0L0–3, CDA34B0L0–3, RA56*B0L0–3, CDA56B0L0–3, RA71*B0L0–3, and CDA71B0L0–3, which are employed by the row and column decoder circuitry for selecting particular row and column lines, as described below.

Column Decode Enable Circuitry

Figure 17A:
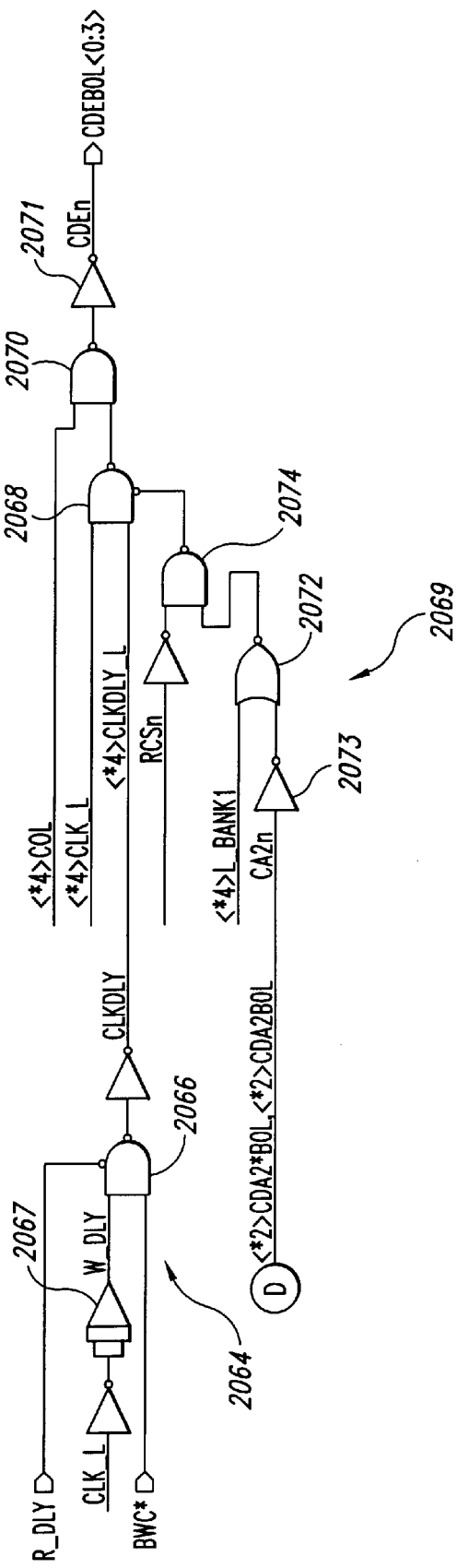
FIG. 17A is a schematic diagram of column decoder enable circuitry for the memory device of FIG. 3.

Referring to FIG. 17A, a column decode enable delay circuit 2064 provides a delayed signal to ensure that column decode enable circuits 2069 are properly enabled during read, versus write, operations. The column decode enable delay circuit 2064 includes a NAND gate 2066 that receives the BWC* signal and the inverted CLK_L signal, delayed 1 nsec by a delay element 2067, to produce a high output as a clock delayed latched signal CLKDLY_L one nsec after CLK_L goes low, whenever BWC* is low, from a NAND gate 2068. When BWC* is high, however, the CLKDLY_L signal is forced to a low value to ensure that this signal does not go high during a block write, thereby shutting off or forcing low a column decode enable signal for Bank 0 left CDEB0L, as explained herein.

The NAND gate 2066 has an enable input that receives the read delay signal R_DLY produced by the CAS control circuitry 600 (FIG. 9A). The NAND gate 2066 is equivalent to a NAND gate whose output is coupled through an inverter to a NOR gate, whose other input is the enable signal R_DLY. As a result, whenever R_DLY is high, the output of the NAND gate 2066 is forced to a low value, regardless of the values of CLK_L or BWC*, but when R_DLY is low, CLK_L and BWC* affect the output of the NAND gate. All of such NAND gates having an enable input shown herein operate substantially similarly.

As noted above, a high value for the R_DLY signal is generated only during a read command. Therefore, during a read operation, R_DLY is high, which forces the NAND gate 2066 to output a low value, that is inverted to a high CLKDLY_L, where the width of the high R_DLY signal determines the width of the high CLKDLY_L signal (namely 2 nsec, determined by the delay gate 684). During a read operation, the memory device 200 is unsure which direction the bit lines and I/O lines will move, and therefore, the greater delay of 2 nsecs is necessary (produced by delay element 784 in FIG. 9). However, during a write operation, the memory device 200 only needs to receive a column address, since it already knows in which direction to drive the I/O lines, and thus, only the one nsec delay is required (produced by the delay element 2067).

Each of two column decode enable circuits 2069 include a NAND gate 2068 that receives the CLKDLY_L signal and the CLK_L signal and outputs a low value to a NAND gate 2070 only when both of these input signals are high. The NAND gate 2070 outputs a signal, which is inverted by inverter 2071, to become the column decoder enable for Bank 0 left signal CDEB0L. Whenever CLK_L is low, the NAND gate 2068 outputs a low value, that in turn forces CDEB0L to an active high value, thereby always enabling the column decoders for the left half of Bank 0 when CLK_L is low.

The column decoders for the left half of Bank 0 are disabled, and CDEB0L is forced low, by one of four events. First, during each access to a column, COL (generated by the CAS control circuitry 600) goes high, which forces the NAND gate 2070 to output a high value to the inverter 2071. Second, if a redundant column has been selected, then RCSn has a high value, which is inverted and input to a NAND gate 2074, whose corresponding high output disables the NAND gate 2068 and forces the NAND gate 2068 to provide a low input to the NAND gate 2070. (Another column decoder enable circuit (not shown) produces a CDEB0L for the redundant columns.)

Third, if Bank 1 is selected, then the L_BANK1 signal is high, which is input to a NOR gate 2072, whose corresponding low output to the NAND gate 2074 disables the NAND gate 2068. Fourth, since the column decoders are divided into two halves for each bank half, only one of the two column decoder halves for the left half of Bank 0 needs to be enabled. Therefore, each of the two column decode enable circuits 2069 receive one of the CDA2*B0L and CDA2*B0L signals, to an inverter 2073 whose output is input to the NOR gate 2072. Consequently, when the input signal to the inverter 2073 has a low value, the NOR gate 2072 provides a low input to the NAND gate 2074, which disables the NAND gate 2068.

Figure 17B:
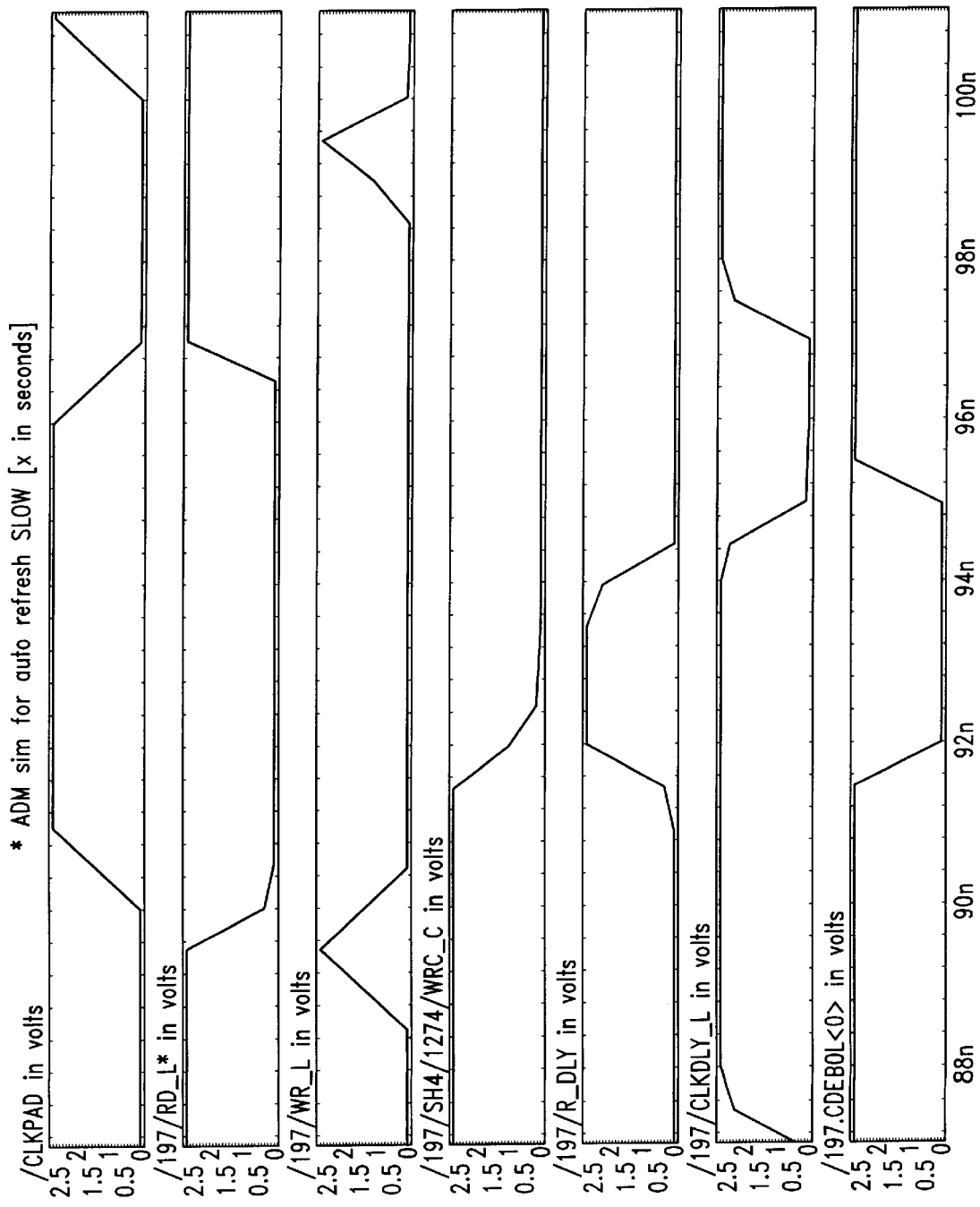
FIG. 17B is a timing diagram of signal waveforms under a read operation for the column decode enable circuit of FIG. 17A.

Referring to the waveform diagram of FIG. 17B, an exemplary read operation is shown. Prior to the time when the CLK signal applied to the pad rises, the RD_L signal falls and is applied to the command latch circuitry 218. As a result, the NOR gate 788 (FIG. 9) receives a disable signal, and in response thereto, provides a high input to the NAND gate 680 to enable this gate. Thereafter, when CLK goes high and RD_L goes low, the clocked read signal READ* from the command latch circuitry 218 that is input to the NAND gate 584 resets this flip-flop and causes the NAND gate 596 to output a low WRC_C to the NOR gate 688 to thus continue to ensure that the NOR gate provides a high input to the NAND gate 680. The delay element and inverter 684, 682 produce the delayed and inverted CLK signal, which, when combined with the CLK signal, produce the R_DLY having a high pulse width of approximately 2 nsecs due to the amount of delay of the delay element. In response thereto, the NAND gate 2066 provides the high CLKDLY_L signal to the NAND gate 2068, which, when combined with the high CLK_L signal produces a low CDEB0L signal having a width of about four nanoseconds. In other words, the rising edge of CLK_L produces the falling edge of CDEB0L, while the falling edge of CLKDLY_L ends the CDEB0L signal, causing it to rise again.

Figure 17C:
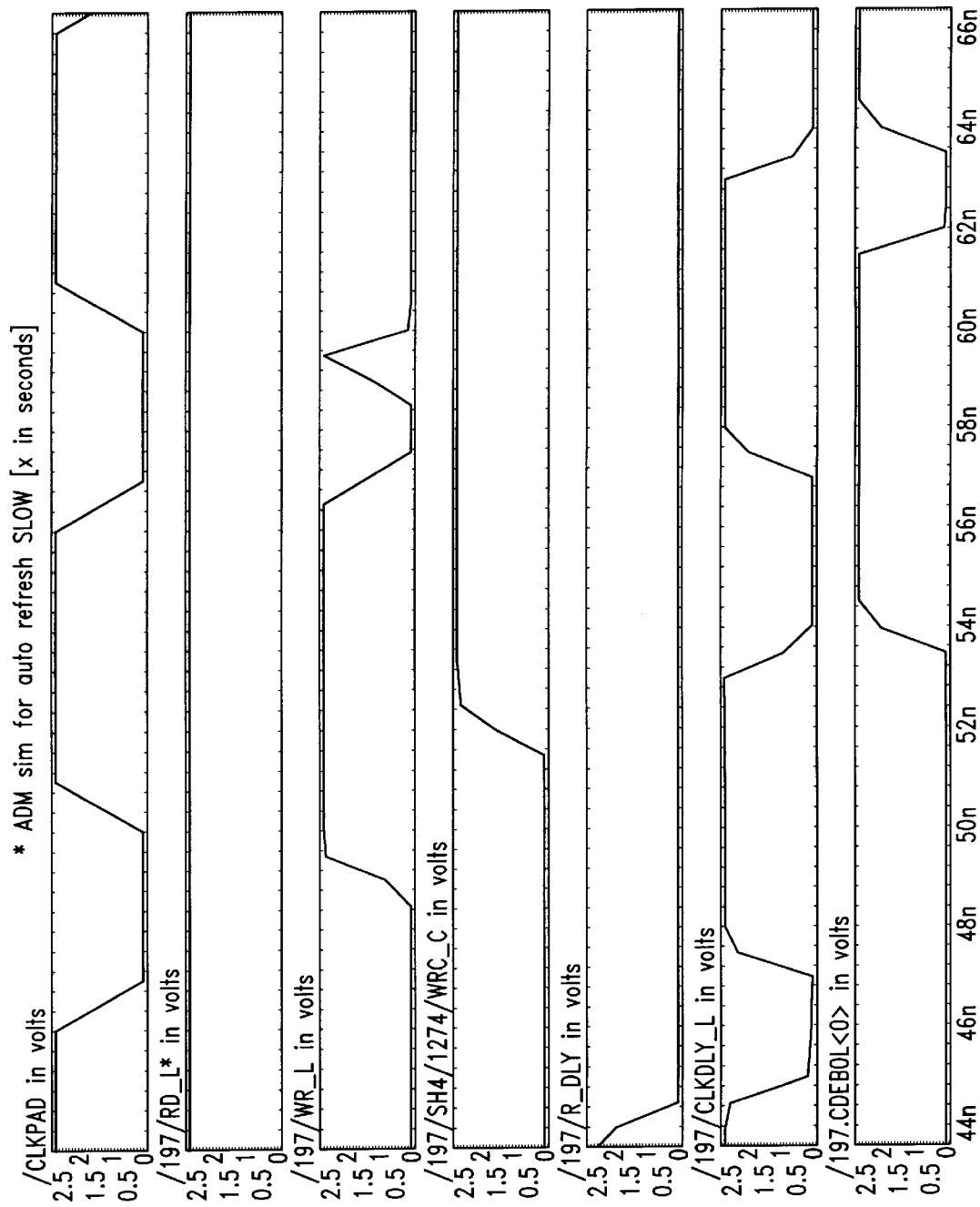
FIG. 17C is a timing diagram of signal waveforms under a write operation for the column decode enable circuit of FIG. 17A.

Referring to the waveform diagrams of FIG. 17C, an exemplary write operation is shown. Prior to the time when the CLK signal is applied to the ad rises, the WR_L signal rises and is applied to the command latch circuitry 218. Thereafter, when CLK is high, the WR_L signal is validated or clocked from the NOR gate 316 (WRITE_C*; FIG. 6A), and output from the NAND gate 596 as the WRC_C signal, which stays high. RD_L remains high, enabling the NOR gate 688 to provide a low input to the NAND gate 680. In response thereto, the NAND gate 680 provides a low R_DLY signal to the enable input of the NAND gate 2066. The inverter and delay element 2067 produce the delayed and inverted CLK signal that causes the NAND gate 2066 to produce the high CLKDLY_L signal delayed approximately 1 nsecs from CLK due to the amount of delay of the delay element. The NAND gate 2068 combines the high delayed and inverted CLK signal with the high CLK signal to produce a low CDEB0L signal having a width of about two nanoseconds. In other words, the rising edge of CLK produces the falling edge of CDEB0L, while the falling edge of CLKDLY_L ends the CDEB0L signal, causing it to rise again. Overall, the column decoders are off a shorter period of time during a write, than during a read.

The address predecoder 2026, global phase enable circuit 2046, predecoder latches 2062, column decode enable circuit 2064, etc. of FIGS. 16A–17A are generally described above for the left half of Bank 0 of the memory device 200. The same description applies substantially equally for the address predecoder, global phase enable circuit, predecoder latches, column decode enable circuits, etc. for the right half of Bank 0, and for the left and right sections of Bank 1. The construction and operation of such circuits and latches are substantially similar to the operation of the previously described circuits and latches, and thus are not described in detail herein for purposes of brevity and clarity. Any necessary changes required to adapt the circuitry of the left half of Bank 0 to the right half of Bank 0, or to Bank 1, would be readily understandable to one skilled in the relevant art based on the detailed description provided herein.

Row Decoder Circuit

Figure 18:
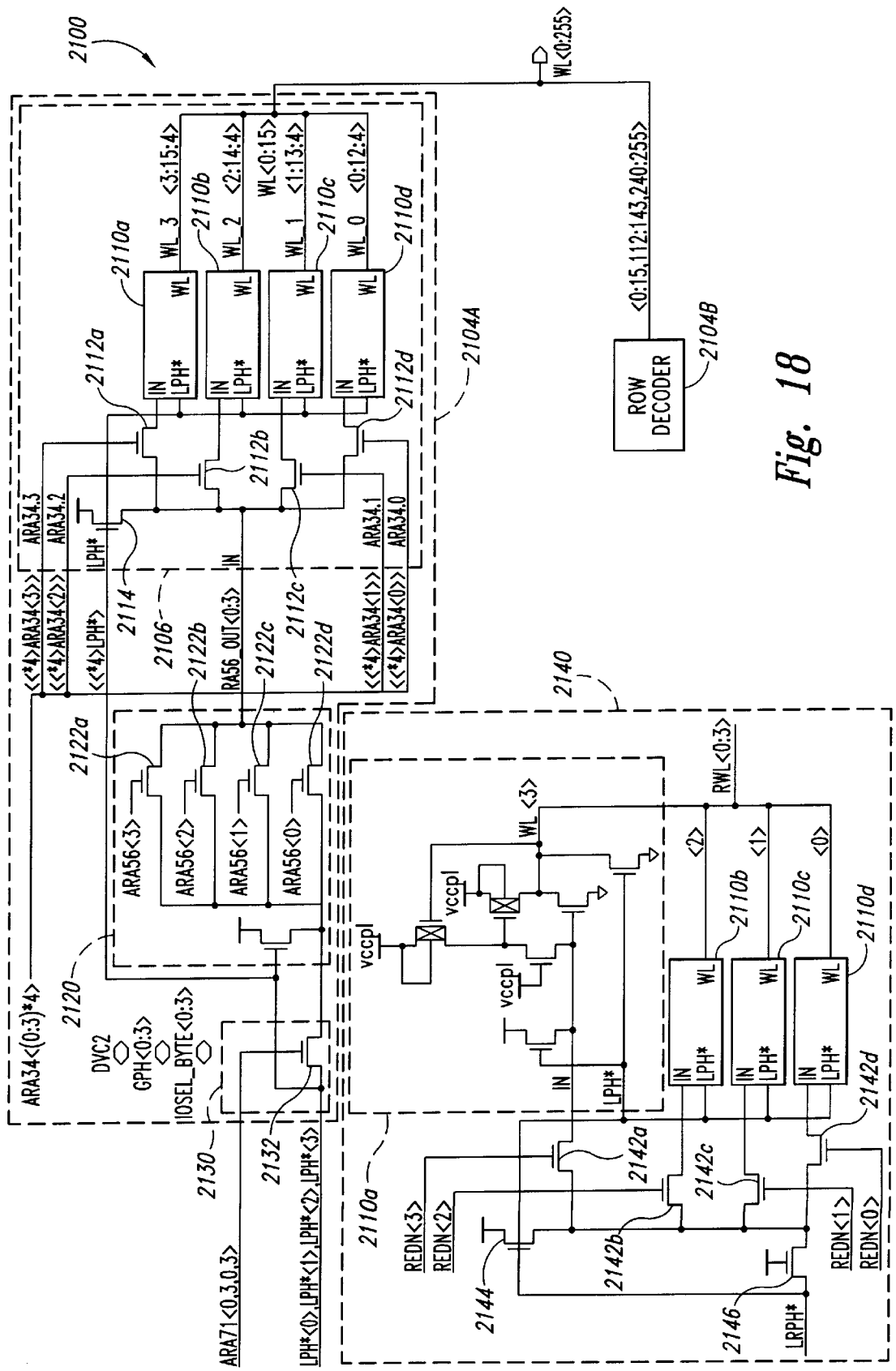
FIG. 18 is a partial schematic, partial block diagram of row decoder circuitry for the memory device of FIG. 3.

A row decoder 2100 illustrated in FIG. 18 decodes several bits of a row address and selectively generates word line signals for corresponding rows of the memory array. The row decoder 2100 basically applies an active low local phase LPH* signal to a tree of NMOS transistors, with the transistor in each branch being decoded by one or more bits of the row address. The initial decode consists of 4 branches corresponding to the 4 combinations of row address bits 1 and 7 (i.e., 00, 01, 10, 11). Connected to each of the 4 branches of the initial decode are 4 second decoder branches corresponding to the 4 combinations of row address bits 5 and 6. Thus, there are 16 paths through the first and second decoder branches. Connected to each of the 4 branches of the second decode are 4 third decoder branches corresponding to the 4 combinations of row address bits 3 and 4. At this point there are therefore 64 paths through the first, second, and third decoder branches. There are 4 third decoder branches for each of four local phase LPH* signals. Each of the local phase signals is generated from bits 0, 2, 8, and 9 of the row address.

With further reference to FIG. 18, the row decoder 2100 includes two sets of decoders 2104A, B, each of which includes 64 third stage decoders 2106. Each third stage decoder 2106 includes 4 row drivers 2110A, B, C, D each having an output coupled to a respective word line of the memory array. Each row driver 2110 has two inputs, an IN input that is coupled to the drain of a respective NMOS transistor 2112 A, B, C, D and an enable LPH* input that receives a local phase LPH* signal. When enabled, each row driver 2110 functions as an inverter to output a high responsive to a low IN signal and to output a low responsive to a high IN signal. The sources of the NMOS transistors 2112A–D are connected to each other, to a pull-up NMOS transistor 2114, and to an output of a prior decoder stage, as explained below. The gate of each transistor 2112 is connected to a respective decode signal generated from bits 3 and 4 of the row address. Thus, transistor 2112D is turned on by a high ARA34<0>, transistor 2112C is turned on by a high ARA34<1>, transistor 2112B is turned on by a high ARA34<2>, and transistor 2112D is turned on by a high ARA34<3>. Each ARA34<0:3> signal corresponds to one of 4 combination of bits 3 and 4 of the row address.

In operation, when the local phase LPH* signal is low, a low applied to a third stage decoder 2106 is coupled through one of the transistors 2112 that is turned on by an ARA input to the IN input of its respective row driver 2110. The row driver 2110 then outputs a high to activate a word line of the array. When LPH* is high, transistor 2114 is turned on to force the sources of the transistors 2112 high, thereby turning off all of the transistors 2112 (including the transistor 2112 that would be turned on by a high ARA signal). As explained below, the low LPH* signal also forces the outputs of the row drivers 2110 low to prevent the respective word line from being activated.

As mentioned above, there are 4 third decoder branches (i.e., transistors 2112A, B, C, D) for each second stage decoder branch. Thus, there are 4 third stage decoders for each second stage decoder. Each second stage decoder 2120 includes 4 NMOS transistors 2122A, B, C, D and an NMOS pull-up transistor 2124. The drain of each transistor 2122 is connected to a respective third stage decoder 2106, while the gates of each transistor 2122 is connected to a respective decode input ARA56. The sources of the transistors 2122 are connected to each other and to a pull-up transistor 2124. The transistors 2122 operate in the same manner as the transistors 2112A, B, C, D in the third stage decoder 2106. Thus, transistor 2122D is turned on by a high ARA56<0>, transistor 2122C is turned on by a high ARA56<1>, transistor 2122B is turned on by a high ARA56<2>, and transistor 2122D is turned on by a high ARA56<3>. Each ARA56<0:3> signal corresponds to one of 4 combination of bits 5 and 6 of the row address. The pull-up transistor 2124 forces the sources of the transistors 2122 high when LPH* is inactive high, and allows the sources of the transistors 2122 to be low when a low input signal is received.

As mentioned above, there are 4 second decoder branches (i.e., transistors 2122A, B, C, D) for each first stage decoder branch. Thus, there are 4 second stage decoders 2120 for each first stage decoder. Each first stage decoder 2130 includes 4 NMOS transistors 2132 (only one of which is shown in FIG. 18) each having its drain connected to a respective second stage decoder 2120, its gate connected to one of 4 ARA inputs, and its source connected to one of 4 local phase LPH* inputs. The transistors 2132 operate in the same manner as the transistors 2122A, B, C, D in the second stage decoder 2120 and the transistors 2112A, B, C, D in the third stage decoder 2106. Thus, each ARA71<0:3> signal corresponds to one of 4 combination of bits 7 and 1 of the row address. When the ARA71 signal applied to the gate of a transistor 2132 is high, the transistor 2132 is turned on to couple an active low LPH* input signal to a respective second stage decoder 2120.

There are 4 second stage decoders 2120 for each first stage decoder 2130, and 4 third stage decoders 2106 for each second stage decoder 2120. Thus, there are 16 third stage decoders 2106 for each of 4 first stage decoders 2130. Since there are 4 local phase LPH* signals, there are 4 first decoder stages for each of the 4 local phase LPH* signals, although only part of one first decoder stage 2130 is shown in FIG. 18.

The row decoder 2100 also includes a decoder stage 2140 for decoding a redundant row address. The redundant row decoder 2140 includes 4 NMOS transistors 2142. The drain of each transistor 2142 is connected to a respective row driver 2110, the gate of each transistor 2142 is connected to a row enable REDN signal, and the sources the transistor 2142 are connected to each other, to the source of an NMOS pull up transistor 2144, and to the drain of an NMOS coupling transistor 2146. When LPH* is active low, the coupling transistor 2146 is turned on to couple the low LPH* through one of the transistors 2142 to its respective row driver 2110. The row driver then activates the word line of a redundant row of the memory array. When LPH* is high, the transistor 2144 turns on to force the sources of the transistors 2142 high, thereby turning off all of the transistors 2142 (including the transistor 2142 that would be turned on by a high REDN signal). The low LPH* signal also forces the outputs of the row drivers 2110 low to prevent the respective word line from being activated.

Figure 24:
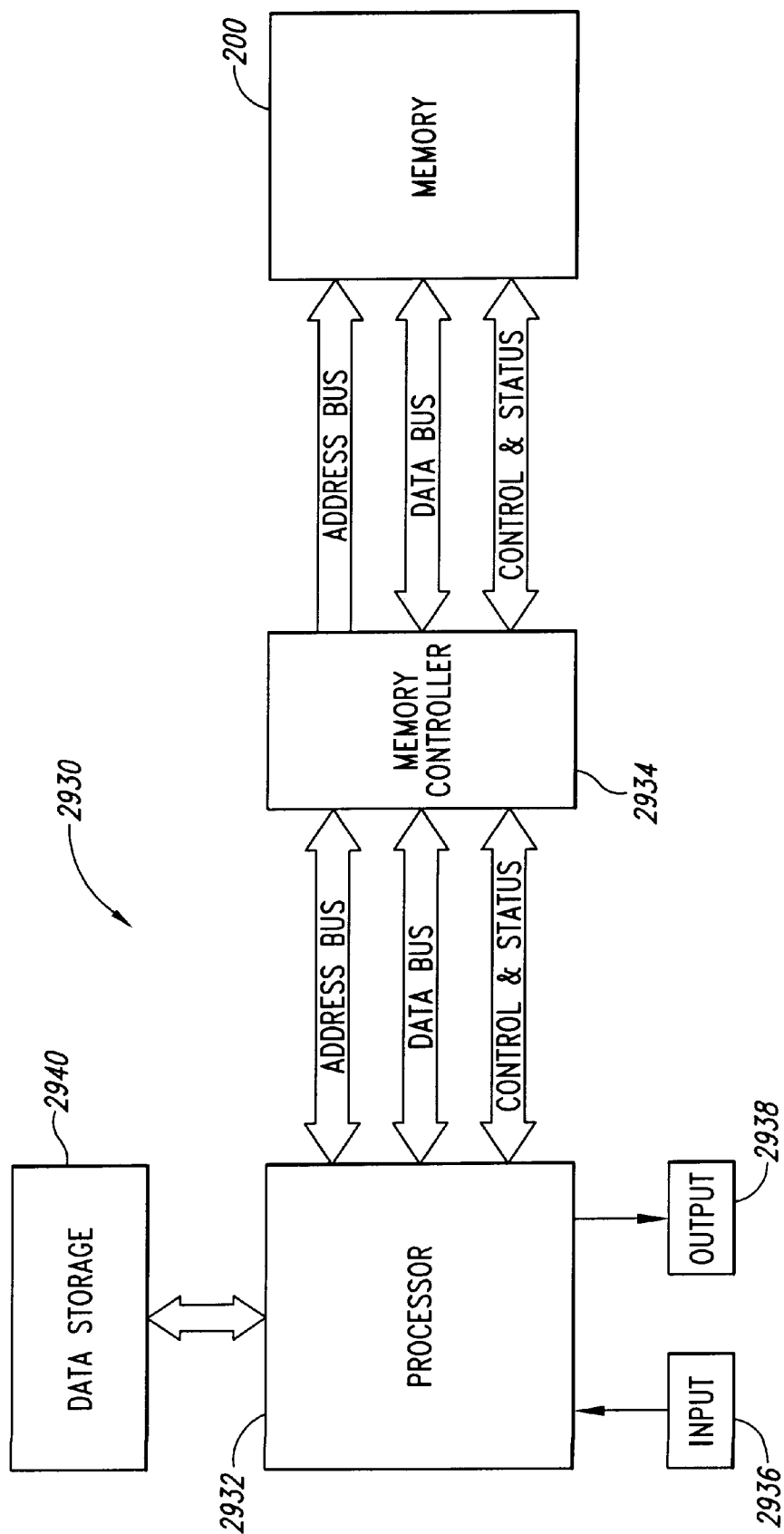
FIG. 24 is a block diagram of an exemplary computer system employing the memory device of FIG. 3.

The above-mentioned row driver 2110 is illustrated in greater detail in FIG. 24. As mentioned above, the driver circuit 2110 receives an input signal IN and an enable signal LPH*, and outputs a low word line WL. When the enable signal LPH* is low, the word line signal WL is forced low regardless of the value of the input IN. When LPH* is low, WL is the complement of IN. An output stage of the driver 2110 is an inverter formed by a PMOS transistor 2202 and an NMOS transistor 2204. The source of the PMOS transistor 2202 is connected to a charge pump voltage Vccp that is higher than a logic high signal used by the memory device. Thus, the PMOS transistor 2202 is able to drive WL to Vccp when IN is low. The source of the NMOS transistor 2204 is connected to ground so that WL is at ground when IN is high. The input IN signal is applied directly to the gate of the NMOS transistor 2204 and to the PMOS transistor 2202 through an NMOS transistor 2206 that is biased on by Vccp applied to its gate. The gate of the PMOS transistor 2202 is also coupled to Vccp through a PMOS transistor 2208 which provides positive feedback as described below.

In operation (assuming LPH* is low), a low input IN signal turns off the NMOS transistor 2204 and turns on the NMOS transistor 2206 because of Vccp applied to its gate. The NMOS transistor 2206 then pulls the gate of the PMOS transistor 2202 low to turn on the PMOS transistor 2202. The transistor 2202 then pulls WL high and turns off the PMOS transistor 2208 to further drive the input to the PMOS transistor low. A high input IN signal is applied to the driver 2200 turns on the NMOS transistor 2204 which then pulls WL to ground. When WL goes low, it turns on the PMOS transistor 2208, thereby applying Vccp to the gate of the PMOS transistor 2202 and turning it off.

A high LPH* signal turns on an NMOS transistor 2210 thereby forcing WL low regardless of the level of the input IN signal. The high LPH* signal also turns on an NMOS transistor 2212 which then applied a high signal to the circuitry of the row driver 22110 in the same manner as a high input IN signal to further drive WL low.

Column Decoder Circuitry

Figure 19A:
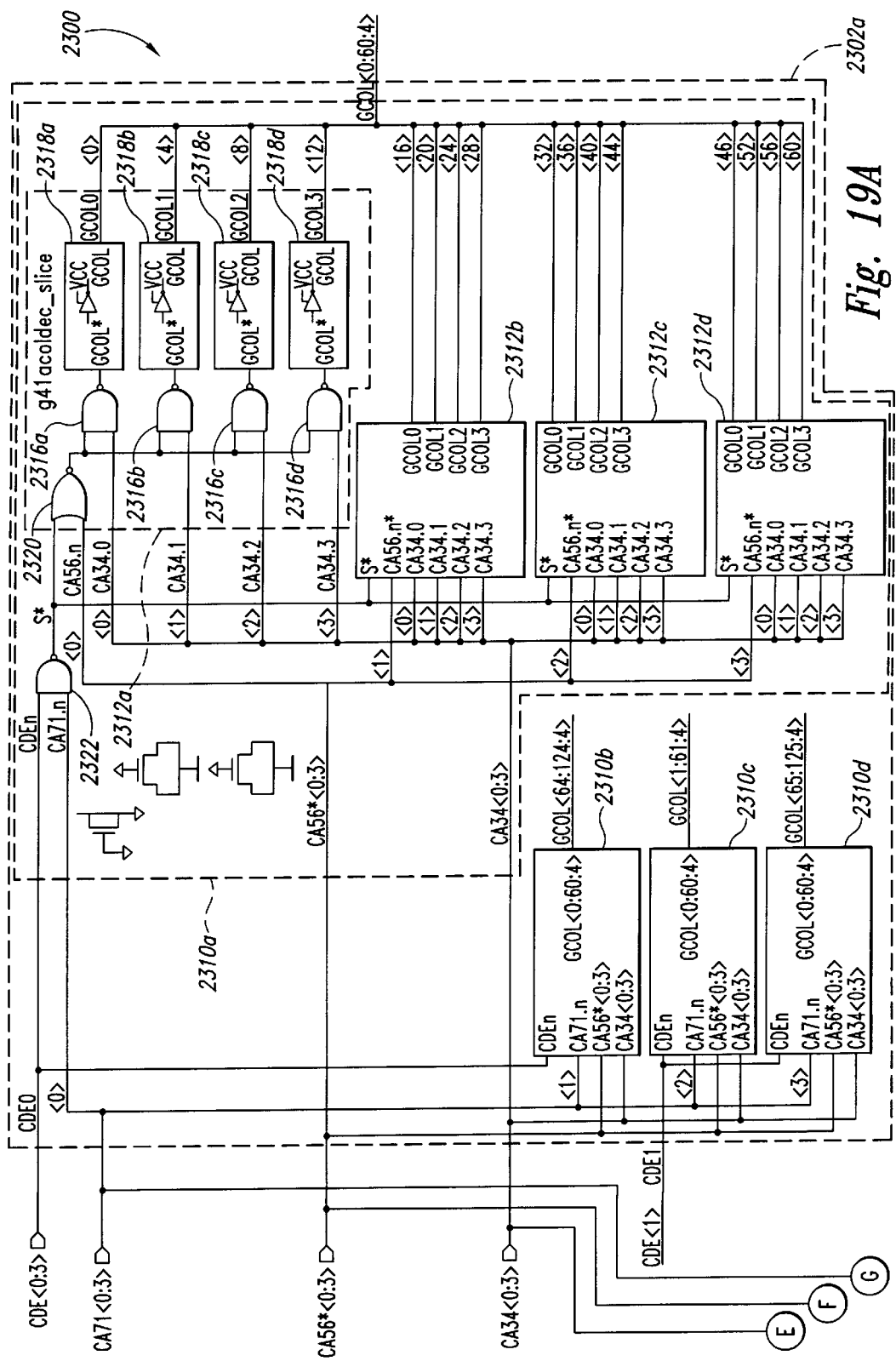
FIGS. 19A and 19B together form a partial schematic, partial block diagram of column decoder circuitry for the memory device of FIG. 3.
Figure 19B:
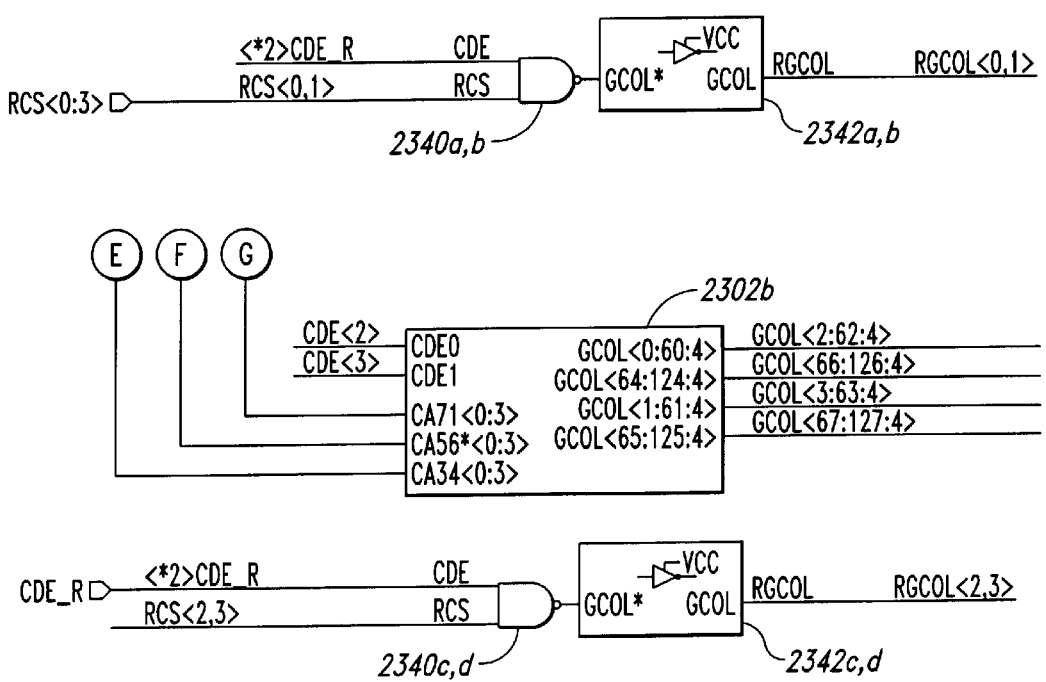

A column decoder 2300 is used to select one of the columns of the array during a memory access. With reference to FIGS. 19A–19B, the column decoder 2300 is similar to the row decoder 136 in that it includes a number of stages providing a multi-branch decode, only one of which couples a enable input signal to an output. The column decoder 2300 includes two decoder circuits 2302A, B, only one of which 2302A is shown in detail in FIGS. 19A–19B. The decoder circuit 2302A generates global column GCOL signals for the first two columns of each set of 4 columns from column 0 to column 61, i.e., columns 0, 1, 4, 5, 8, 9 . . . 60, 61 and for the first two columns of each set of 4 columns from column 64 to column 125, i.e., columns 64, 65, 68, 69, 72, 73 . . . 124, 125. The decoder circuit 2302B is identical to the decoder circuit 2302A, and it generates the global column GCOL signals for the remaining columns. Specifically, the decoder circuit 2302B generates global column GCOL signals for the last two columns of each set of 4 columns from column 2 to column 63, i.e., columns 2, 3, 6, 7, 10, 11 . . . 62, 63 and for the last two columns of each set of 4 columns from column 66 to column 127, i.e., columns 66, 67, 70, 71, 74, 75 . . . 126, 127.

The decoder circuits 2302A, B include 4 final stage decoders 2310A, B, C, D, only one of which 2310A is illustrated in detail in FIGS. 19A–19B. Each decoder 2310 contains 4 gating and driver circuits 2312A, B, C, D. Thus, there are 16 gating and driver circuits 2312 in each decoder circuit 2302A, 2302B. Each of the gating and driver circuits 2312 includes a set of 4 NAND gates 2316A, B, C, D The NAND gates 2316A, B, C, D receive respective decode signals CA34<0:3> generated from bits 3 and 4 of the column address. The outputs of the NAND gates 2316A–D are applied to respective inverting column driver circuits 2318A–D which, in turn, generate respective global column GCOL signals. Thus, there are 64 NAND gates 2316 and column drivers 2318 in each decoder circuit 2302A, 2302B.

The stage 2310A generates global column GCOL signals for every fourth column of the memory array between column 0 and column 60, i.e., columns 0, 4, 8, 12 . . . 56, 60. The stage 2310B generates global column GCOL signals for every fourth column of the memory array between column 64 and column 124, i.e., columns 64, 68, 72, 76 . . . 120, 124. The stage 2310C generates global column GCOL signals for every fourth column of the memory array between column 1 and column 61, i.e., columns 1, 5, 9, 13 . . . 57, 61. Finally, stage 2310D generates global column GCOL signals for every fourth column of the memory array between column 65 and column 125, i.e., columns 65, 69, 73, 77 . . . 121, 125.

The 4 CA34<0:3> signals applied to the NAND gates 2316 correspond to the 4 combinations of bits 3 and 4, namely "00", "01", "10", and "11". The NAND gates 2316A–D are all enabled by a high at the output of a NOR gate 2320 when both inputs to the NOR gate 2310 are low. The NOR gate 2320 receives an active low enable S* signal from a NAND gate 2322 and one of 4 CA56<0:3> signals which correspond to the 4 combinations of bits 5 and 6 of the column address. The other 3 CA56<0:3> signals are applied to the other gating and driver circuits 2312B, C, D. Thus, only the one gating and driver circuit 2312A–D selected by its respective combination of bits 5 and 6 of the column address is enabled at any time.

The enable S* signal is generated by the NAND gate 2322 is applied to the NOR gates 2320 of all of the gating and driver circuits 2312 in the decoders 2310A–D. The NAND gate 2322 in the decoder 2310A receives one of 4 CA71<0:3> signals which correspond to the 4 combinations of bits 7 and 1 of the column address. The other 3 CA71<0:3> signals are applied to the other decoders 2310B, C, D gating and driver circuits 2312B, C, D. Thus, only the one decoders 2310A–D selected by its respective combination of bits 7 and 1 of the column address is enabled at any time. The NAND gate 2322 in the decoder 2310A also receives one of 4 a column decode enable CDEn<0:3> signals which are generated from bits 0 and 2 of the column address. The decoders 2310A, B are enabled by the CDEn<0> signal while the decoders 2310C, D are enabled by the CDEn<1> signal. The decoders 2310A, B in the decoder circuit 2302B are enabled by the CDEn<2> signal while the decoders 2310C, D in the decoder circuit 2302B are enabled by the CDEn<3> signal. The column decoder 2300 thus generates respective global column GCOL<0:127> for 128 columns in the memory array based on the values of the column address.

The column decoder 2300 also generates global column RGCOL<0:3> signals for the redundant rows of columns in the memory array that are used to replace a defective column. Two pairs of NAND gates 2340A, B, 2340C, D are enabled by a redundant column enable CDE_R signal. The 4 NAND gates 2340A–D also decode 4 bits of a redundant column select RCS<0:3> signal. Thus, when enabled by a high CDE_R, the NAND gate 2340A outputs an active low when RCS<0> is high, the NAND gate 2340B outputs an active low when RCS<1> is high, the NAND gate 2340C outputs an active low when RCS<2> is high, and the NAND gate 2340D outputs an active low when RCS<3> is high. The outputs of the NAND gates 2340A–D are applied to respective column drivers 2342A–D which apply active high global column RGCOL signals to respective redundant columns in the memory array.

Datapath Circuitry

Figure 20A:
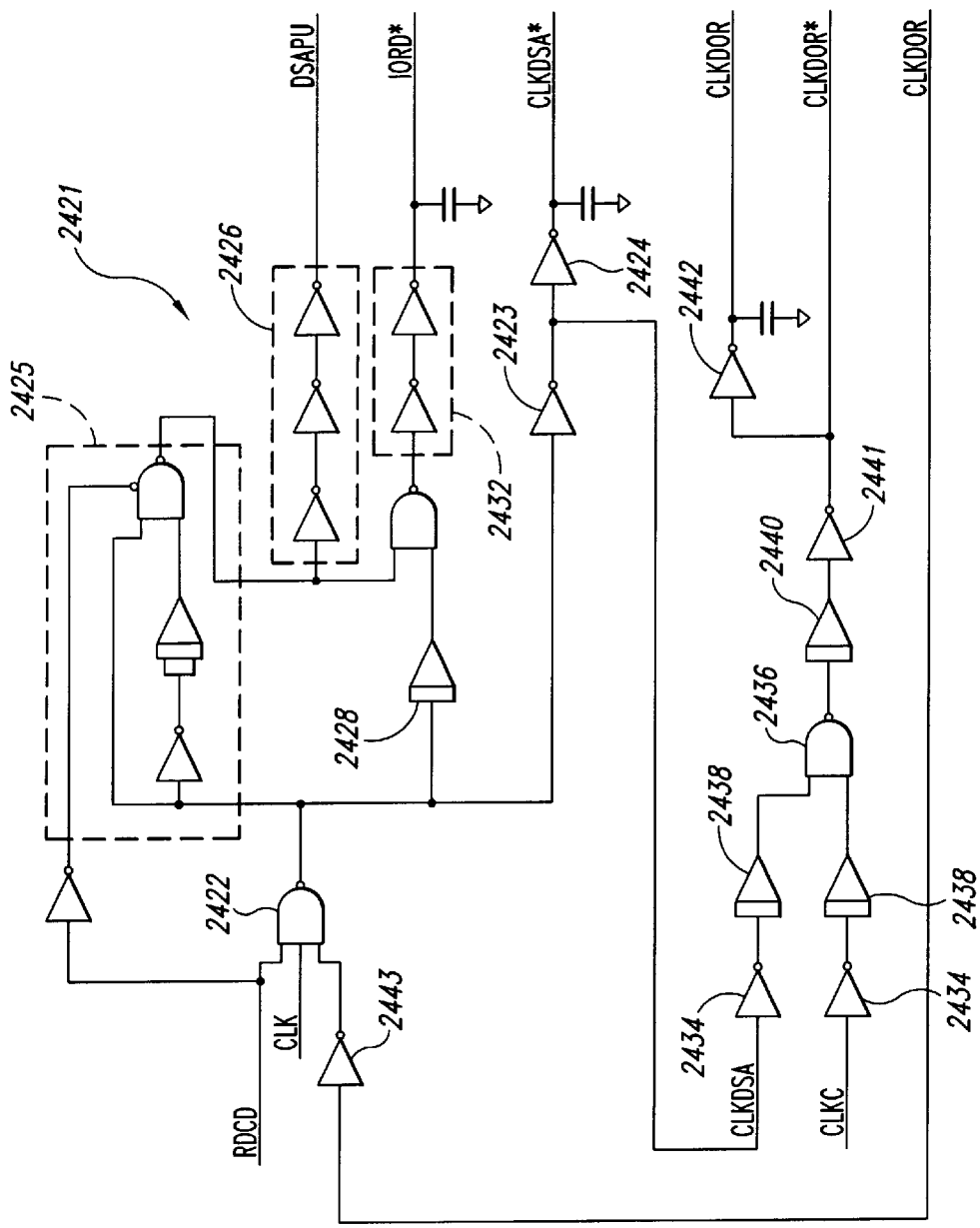
FIGS. 20A, 20B and 20C together form a partial schematic, partial block diagram of data path circuitry for the memory device of FIG. 3.

Referring to FIG. 20A, datapath circuitry 2420 includes data clock circuitry 2421 that properly times data in and out of the data or DQ pads. The data clock circuitry includes a NAND gate 2422 that receives the read signal with a latency of two signal RDCD (generated by the CAS control circuitry, FIG. 9A), the CLK signal, and an inverted clock data output register signal CLKDOR. When all three inputs are high, the NAND gate 2422 provides a low output that is inverted by a first inverter 2423 to become a clock data sense amp signal CLKDSA (or data sense amp enable signal DSAEN), and inverted again by an inverter 2424, to become the CLKDSA* signal. The waveform timing diagrams of FIG. 9B show the CLKDSA signal, which enables the data sense amps, described below in the data block circuitry (FIG. 211B). The DSAEN signal preferably mimics the delays and timing of the I/O pull up signal IOPU.

A one shot 2425 also receives the low output of the NAND gate 2422, and provides a 2 nsec low pulse in response thereto. A series of three inverters 2426 amplify and invert the 2 nsec pulse to provide a 2 nsec high pulse as a data sense amp pull up signal DSAPU, which is shown in FIG. 9B. A NAND gate 2430 also receives the 2 nsec low pulse, as well as the high output of the NAND gate 2422 that is delayed one nsec by a delay element 2428. When both inputs are high, the NAND gate 2430 provides a low value output pulse that is amplified by a pair of inverters 2432 to become the I/O read signal IORD*, shown in FIG. 9B.

One of two inverters 2434 inverts the CLKDSA signal while the other inverter inverts the CLKC signal. A NAND gate 2436 receives the inverted CLKDSA and CLKC signals and outputs a low value only when both signals are high. A delay element 2438 can be coupled to either of the inputs of the NAND gate 2436 to ensure that the high values of the inverted CLKDSA and CLKC signals are received at the appropriate time. A one nsec delay element 2440 receives the low output from the NAND gate 2436, and an inverter 2441 inverts the delayed signal to produce the CLKDOR* signal. A second inverter 2442 inverts the CLKDOR* signal to produce the CLKDOR which is provided to the NAND gate 2422.

As shown in FIG. 9B, the CLKDSA signal produces the CLKDOR signal, which has a one nsec delay therefrom. Therefore, the clocking of the sense amps enabled by the CLKDSA signal occurs first, and then, one nsec thereafter, the data output registers are clocked by the CLKDOR signal to trap the sensed data. When CLKDOR is high, an inverter 2443 provides a low CLKDOR signal to the NAND gate 2422, that in turn, produces a high output as the CLKDSA signal to turn off the data sense amps. The high CLKDSA is inverted to a low value by the inverter 2423 to cause the NAND gate 2436 to output a high (inactive) CLKDOR* signal when CLKC transitions to a high value. Overall, the clocking, pull up and timing of the data sense amps are controlled by the clock, rather than other signals commonly used in the prior art. Therefore, as clock speed increases, the timing of the read and pull up of the data sense amps (signals DSAPU and IORD*) similarly speed up.

Figure 20B:
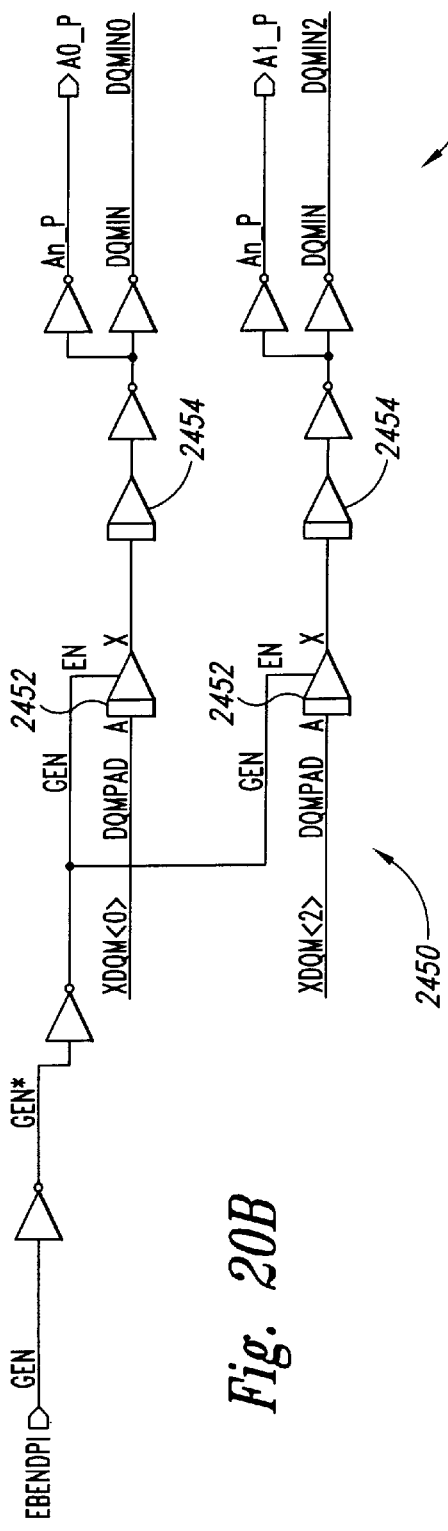

Referring to FIG. 20B, DQ mask circuitry 2450 includes input buffers that receive externally generated DQ mask signals XDQM. The XDQM signals are delayed by gates 2454 and amplified by a pair of inverters to produce DQ mask input signals DQMIN0 and DQMIN2 for the first and third DQ sections (DQ0–7 and DQ16–23). The XDQM signals can be used for remapping the address inputs to produce the A0_P and A1_P signals, as described above. As noted above, each bank of memory cells is divided into blocks of eight sub-arrays. Therefore, during a block write, data from the control register is written into multiple columns. During a mask operation, however, the memory device 200 can selectively turn off certain I/O lines by turning off I/O select lines (as is evident below with respect to the I/O select circuits 2680).

Figure 20C:
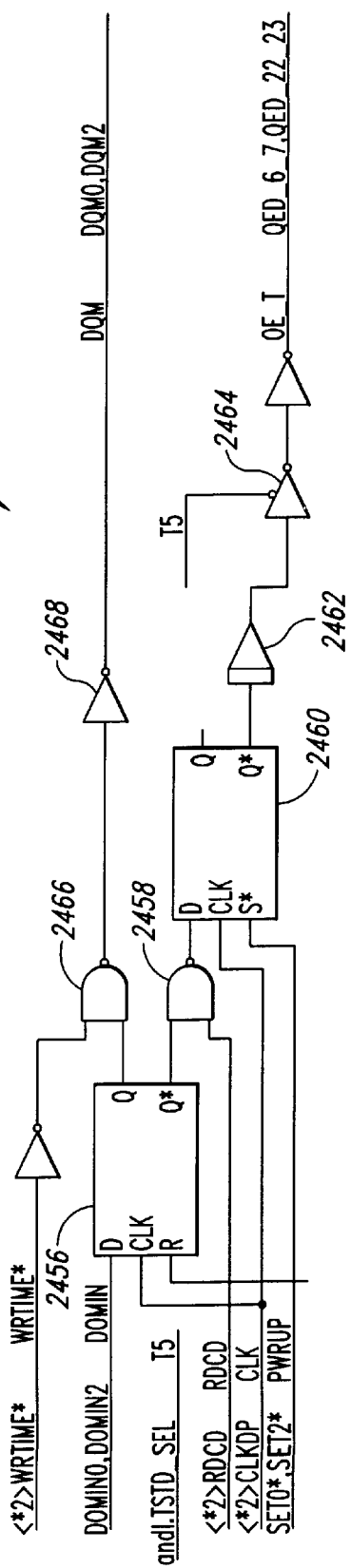

Referring to FIG. 20C, a register 2456 in a DQ mask input register 2457 receives the DQMIN0 signal and clocks it through its inverting output to a NAND gate 2458 when a high CLK signal is received at the register's clock input. The read signal with a latency of two signal RDCD (generated by the CAS control circuitry 600, FIG. 9), when high, causes the NAND gate 2458 to input a low value to a second register 2460. On the second CLK high pulse, the second register 2462 provides a high signal at its inverting output, which is amplified by a pair of inverters 2464, to become the data output enable signal QED for mask reads. As is known, during a read, a latency of two can be imposed. Therefore, for a mask read, to ensure proper two clock cycle delay for timing of the DQMIN0 signal, the first and second registers 2456, 2460 are employed. A delay element 2462 can be placed at the output of the second register 2460 to adjust this delay.

During a write operation, however, no such two cycle latency delay is required. Therefore, a NAND gate 2466 receives the inverted WRTIME* signal, and the non-inverted output of the first register 2456. When both DQMIN0 and the inverted NWTIME* are high, the NAND gate 2466 outputs a low signal, that is inverted by an inverter 2468 to become a DQ mask 0 signal DQM0. While the DQ mask input register 2457 is described above for only mask bit 0 (for DQ lines DQ0–7), a second of such circuits is employed for the mask bit 2 (for DQ lines DQ16–23).

Eight input/output select circuits 2680 each include a four input AND gate 2682 that receives the block write signal BW*, and a specific combination of inverted and non-inverted column address signals CA0–CA2. The BW* signal is normally high, and therefore, only one of the eight NAND gates 2682 will output a low value to a NAND gate 2684 in response to the combination of column signals applied thereto. In response thereto, the NAND gate 2684 outputs a high signal, which is inverted to a low input/output select signal IOSEL*. A specific combination of column address signals CA0–CA2 for the particular DQ sub-arrays in the left half of the array Banks 0 and 1 (DQ1–DQ7 and DQ16–DQ23), which generate the IO select signals IOSEL0–7, are shown in the table below.

TABLE 5

| Left Half | Right Half | CA2n | CA1n | CA0n | I/O Select |
|---|---|---|---|---|---|
| D0/D16 COL0 | D8/D24 COL0 | CA2* | CA1* | CA0* | IOSEL<0> |
| D1/D17 COL1 | D9/D25 COL1 | CA2* | CA1* | CA0 | IOSEL<1> |
| D2/D18 COL2 | D10/D26 COL2 | CA2* | CA1 | CA0* | IOSEL<2> |
| D3/D19 COL3 | D11/D27 COL3 | CA2* | CA1 | CA0 | IOSEL<3> |
| D4/D20 COL4 | D12/D28 COL4 | CA2 | CA1* | CA0* | IOSEL<4> |
| D5/D21 COL5 | D13/D29 COL5 | CA2 | CA1* | CA0 | IOSEL<5> |
| D6/D22 COL6 | D14/D30 COL6 | CA2 | CA1 | CA0* | IOSEL<6> |
| D7/D23 COL7 | D15/D31 COL7 | CA2 | CA1 | CA0 | IOSEL<7> |

The memory device 200 contains substantially similar input/output select circuitry 2680 that selects I/O lines in the right half of the array Banks 0 and 1 based on a specific combination of inverted and non-inverted column address signals CA0–CA2. The table above likewise shows the specific combination of CA0–CA2 signals that produce IO select signals IOSEL0–7 for the right half of the array Banks 0 and 1 (i.e., DQ8–15 and DQ24–31). The IOSEL0*–7* signals are used by the data routing circuitry of FIGS. 4C and 4D to selectively couple one of the eight IO lines 0–72 the single data line 148, as described herein.

During a block write operation, however, the memory device 200 internally selects and sequentially enables the I/O lines to couple to the single data line. Therefore, under a block write operation, BW* has a low value, which forces the NAND gate 2682 to always output a high value to the NAND gate 2684. A NOR gate 2686 receives the low BW* signal, and the data in signal DIN* from the flip-flop 2476. The output of the NOR gate 2686 is inverted before being input to the NAND gate 2484. As a result, the first input to the NAND gate 2684 is always a high value, while the first input to the NOR gate 2686 is always a low value (the BW* signal). Therefore, the IOSEL* signal output from each of the IO select circuits 2680 are dependent on the data input signal DIN*: if DIN* has a high value, then the IO select circuit outputs a high value for the IOSEL* signal, and vice versa.

Data Block Circuitry

Figure 21A:
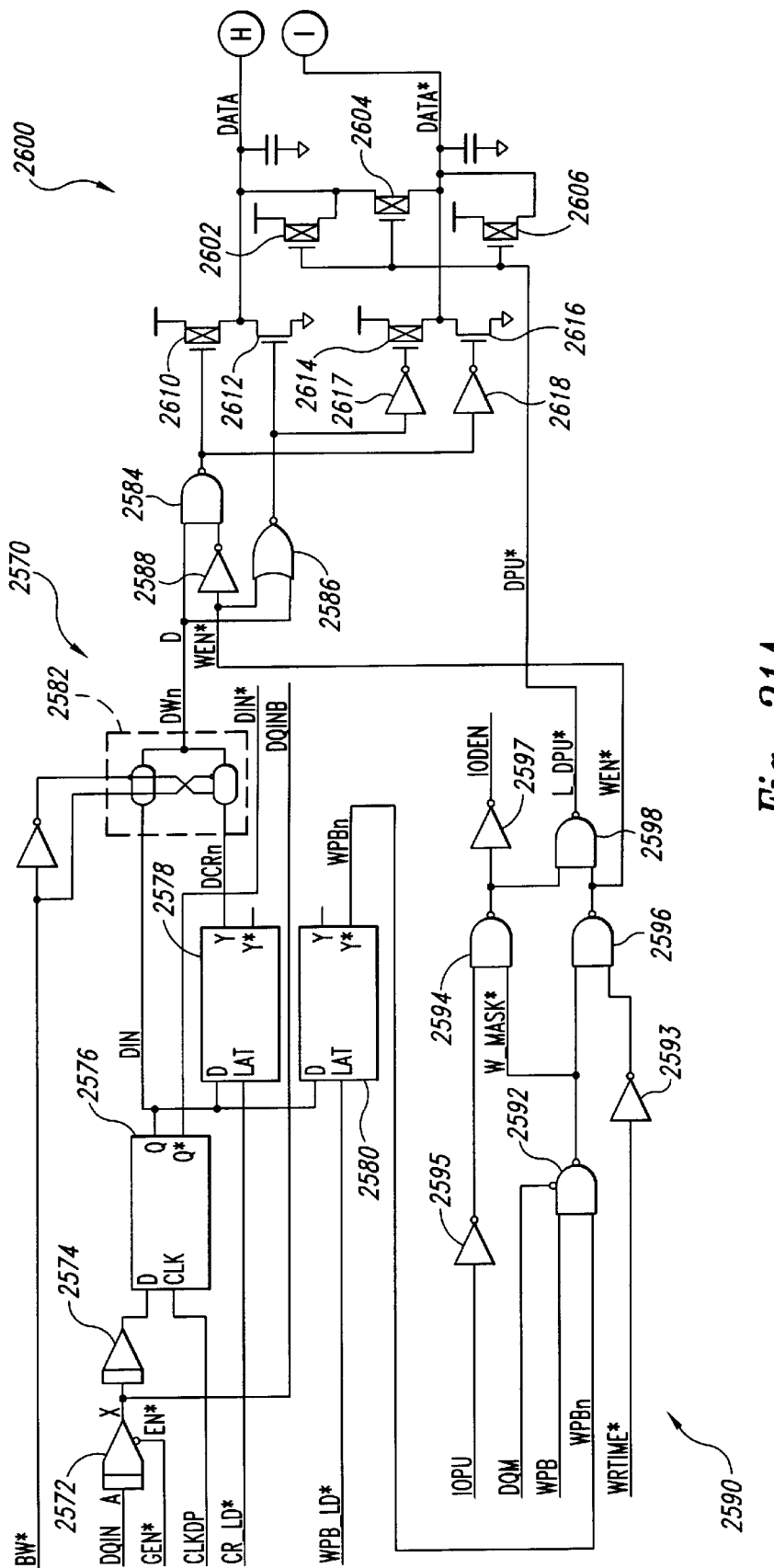
FIGS. 21A and 21B together form a partial schematic, partial block diagram of data block circuitry for the memory device of FIG. 3.

Referring to FIG. 21A, data sub-array or block circuitry 2570 provides data signals to (during a write) and data signals from (during a read) the 32 sub-arrays or blocks of memory cells in the memory device 200. The data block circuitry includes an input buffer 2572 that receives the external data signals DQIN from DQ pads DQ0–DQ7 and DQ16–DQ23, a delay element 2574 that delays the buffered signal by 3 nsecs, and an input register 2576 that receives the delayed signal at its data input terminal. Sixteen of such data block circuits 2570 are employed by the memory device 200 for the 16 sub-arrays and 16 DQ paths DQ0–DQ7 and DQ16–DQ23 for the left half of the device. Similarly, the memory device 200 employs 16 substantially similar data block circuits 2570 for the right half of the device, corresponding to sub-arrays and DQ paths DQ8–DQ15, and DQ24–DQ31. Only one of such data block circuits 2570 are described in detail herein, however, those skilled in the art will recognize that such description applies substantially equally for the remaining 31 data block circuits.

The DQIN signal is clocked from the non-inverting output of the input register 2576, when CLK goes high, to a multiplexer 2582. The DQIN signal is also clocked into the data input of a block write register or latch 2578. When the block write latch 2576 receives the control register load signal CR_LD (from the special command control circuitry 840 of FIG. 8A), then a block write mode bit applied to the memory device 200 is latched therein. The block write latch 2578 provides a block write data bit signal DCRn at is non-inverting output to a multiplexer 2582.

Similarly, the DQIN signal is clocked from the non-inverting output of the input register 2576 to the data input of a mask register or latch 2580. When the mask latch 2576 receives the write per bit load signal WPB_LD (from the special command control circuitry 840 of FIG. 8A), then a write per bit bit applied to the memory device 200 is latched therein. The mask latch 2580 provides a write per bit bit signal WPBn from the inverting output of the latch.

If the block write signal BW* applied to the multiplexer 2582 has a high value, then the DQIN signal from the input register 2576 is output as a data write signal DWn to the inputs of a NAND gate 2584 and a NOR gate 2586. However, if the BW* signal has a low value, the DCRn signal is output from the multiplexer as the DWn signal to the NAND gate 2584 and NOR gate 2586. The NOR gate 2586 receives at its other input a write enable signal WEN*, while the NAND gate 2584 receives the inverted WEM* signal, inverted by an inverter 2588.

A write driver enable circuit 2590 determines the type of write command to be performed by the memory device 200, and generates the appropriate write enable signal, such as the WEN* signal. A NAND gate 2592 receives the write per bit signal WPB and the WPBn signal, and outputs a high value to a NAND gate 2596 if either of these input signals are low. The NAND gate 2596 outputs a low WEN* signal only if either WPB and WPBn are low and the WRTIME* signal if low (which is inverted to a high input to the NAND gate 2596 by an inverter 2593). However, if the memory device 200 is in the write per bit mode, and that the particular DQ bit is to be masked, then both WPB and WPBn are high, which produces a low output from the NAND gate 2592 to the NAND gate 2596. As a result, the NAND gate 2596 outputs an inactive WEN* signal that prevents write driver amplifiers 2600 from writing a bit to a selected column (as explained below). Similarly, if the memory device 200 is masking the particular DQ, then a high value for the DQM signal applied to a disable terminal of the NAND gate 2592 forces the NAND gate to output a high (inactive) value for the WEN* signal. In essence, high values for both WPB and WPBn or for DQM override the WRTIME* signal and force WEN* high.

A NAND gate 2594 receives the global I/O pull up signal GIOPU from the clock circuitry 330 of FIG. 5, and the output of the NAND gate 2592 to provide a high signal when either of these signals are high. A NAND gate 2598 receives the outputs of the NAND gates 2594, 2596 and outputs in turn a low data pull up signal DPU* to three P-channel transistors 2602, 2604, 2606 in the write driver circuitry 2600 to pull up a selected column line to Vcc. The transistors 2602–2606 are coupled in a classic bit line equalization arrangement where the transistor 2604 is coupled between the single data line pair, while the transistors 2602 and 2606 are coupled between Vcc and one of the data line to pull the line up when a low DPU* is applied to their gates.

The NAND gate 2594 outputs a low value when both the NAND gate 2592 outputs a high value, and a high GIOPU signal, inverted by an inverter 2595, are input thereto. An inverter 2597 inverts the low output to a high I/O data enable signal IODEN. Even if the timing of the GIOPU signal is slightly off, the NAND gate 2596 will output a low value to the NAND gate 2598 to ensure that a high DPU* signal is output, which turns off the equalization transistors 2602–2606.

A pair of PMOS transistors 2610, 2614 in the write driver circuitry 2600 receive at their gates the output of the NAND gate 2584 and the output of the NOR gate 2586 that is inverted by an inverter 2617, respectively. The sources and drains of the transistors 2610, 2614 are coupled between Vcc and the data line pair 148, 148' for the particular DQ. A pair of NMOS transistors 2612, 2616 receive at their gates the output of the NOR gate 2586, and the output of the NAND gate 2584 that is inverted by an inverter 2618, respectively. The sources and drains of the transistors 2612, 2616 are coupled between the data line pair 148, 148' for the particular DQ and ground.

As a result, when WEN* is low and DWn is high, the NAND gate 2584 outputs a low signal to the transistor 2610, which turn it on and couples the data line 148 to Vcc, while simultaneously providing a high value to the transistor 2616, which turns it on and couples the data line 148' to ground. The high DWn signal causes the NOR gate 2586 to output a low signal that turns off transistors 2612, 2614. Conversely, when both WEN* and DWn are low, the NOR gate 2586 outputs a high signal to the transistor 2612, which turns it on and couples the data line 148 to ground, while simultaneously providing a low value to the transistor 2614, which turns it on and couples the data line 148' to Vcc. The low DWn signal causes the NAND gate 2584 to output a high signal that turns off transistors 2610, 2616.

Figures 21B, 21C:
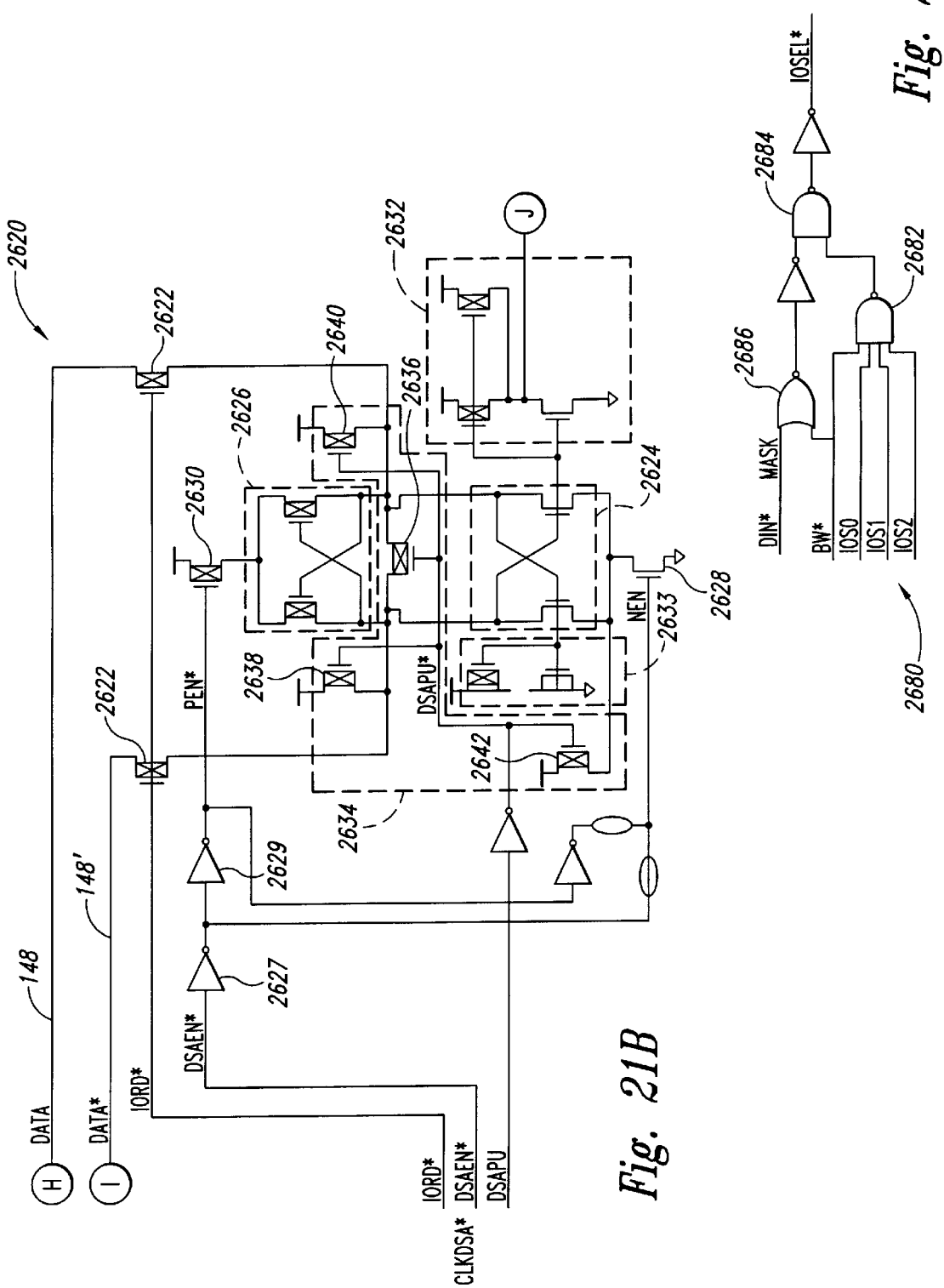
FIG. 21C is a schematic diagram of input/output select circuitry for the memory device of FIG. 3.

During a read operation, WRTIME* is high, which, when inverted by the inverter 2593 and applied to the NAND gate 2596, provides a high WEN* signal that turns off the transistors 2610–2616 in the write driver circuitry 2600. Also during a read operation, a pair of NMOS transistors 2622 in a data sense amp circuit 2620 receive a low value for the IORD* signal which couples the data lines 148, 148' to N- and P-sense amps 2624, 2626 (FIG. 21B). An inverter 2627 inverts the data sense amp enable signal DSAEN* to an N-sense amp enable signal NEN that is applied to the gate of an NMOS transistor 2628. When NEN is high, the transistor 2628 turns on, which in turn enables the N-sense amp 2624 by coupling it to ground. An inverter 2629 inverts the NEN signal to a P-sense amp enable signal PEN that is applied to the gate of a PMOS transistor 2630. When PEN is low, the transistor 2630 turns on, which in turn enables the P-sense amp 2626 by coupling it to Vcc.

A data output driver 2632, coupled through the N-sense amp 2624 to the data line 148', operates substantially similar to an inverter and amplifies the data sensed between the data line pairs 148, 148' as a data read signal DR. A model 2633 of the data output driver 2632 is coupled to the other data line 148 to balance the load on the sense amps 2624, 2626. An equalization or pull up circuit 2634 includes PMOS transistors 2636, 2638, 2640, 2642 that each receive the inverted data sense amp pull up signal DSAPU. The DSAPU is high, the transistor 2636 coupled the data lines 148, 148' together, while the transistors 2638, 2640, 2642 pull up the lines to Vcc. The read data signal DR can then be provided to comparison and test circuitry, and thereafter to data output registers 2646, as described in the inventors' copending U.S. patent application Ser. No. 08/779,036, filed Jan. 6, 1997, entitled "HIGH SPEED TEST SYSTEM FOR A MEMORY DEVICE."

Data Output Driver Circuitry

Figure 22A:
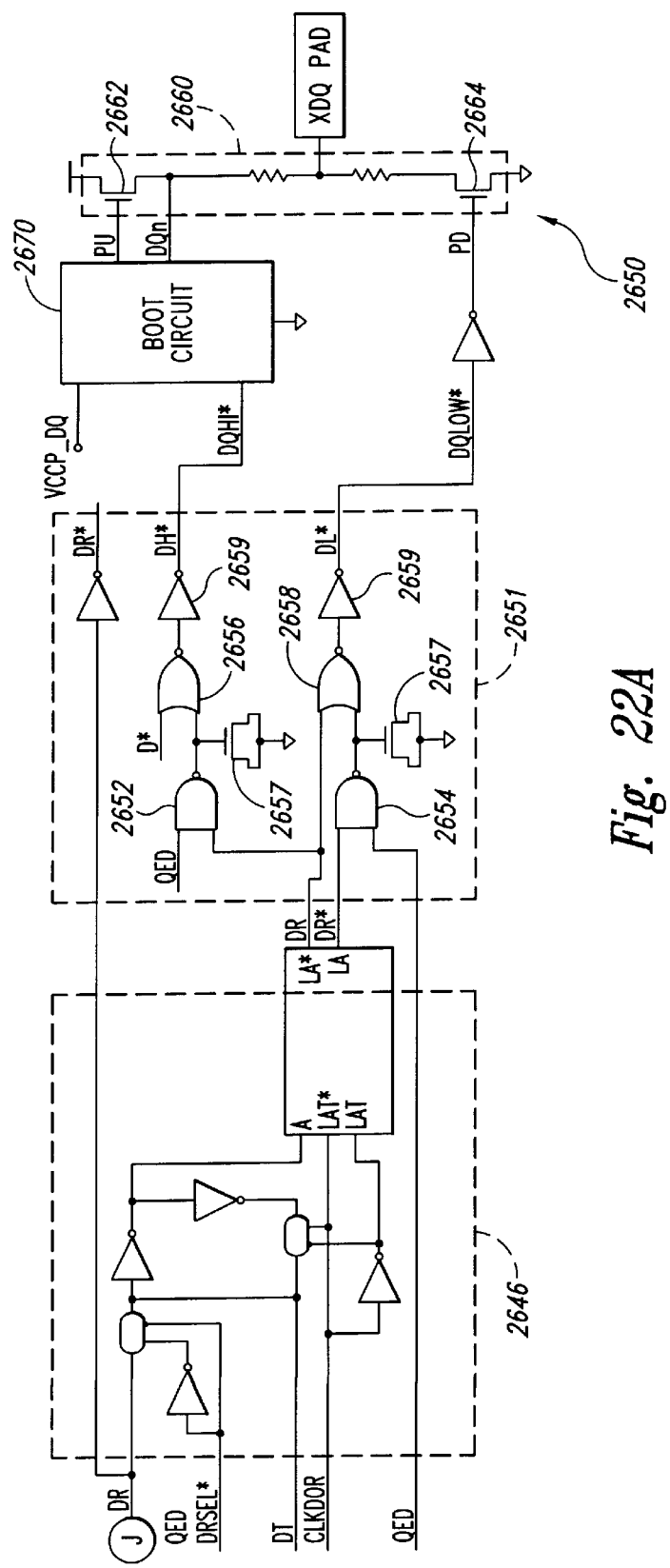
FIG. 22A is a partial schematic, partial block diagram of data output driver circuitry for the memory device of FIG. 3.

Referring to FIG. 22A, a data output driver circuit 2650 includes an output control circuit 2651 that receives the DR signal from the output registers 2646 and provides an output driver shut off signal to an output driver 2660. A NAND gate 2652 in the output control circuit 2651 receives the data signal DR from the non-inverting output of the output register 2646, while a NAND gate 2654 receives the inverted data signal DR* from the inverting output of the register. The NAND gates 2652, 2654 also each receive the data output enable signal QED. The outputs of the NAND gates 2652, 2654 are coupled to the input of NOR gates 2656, 2658 whose other inputs are coupled to receive the inverted and non-inverted data signals DR, DR* from the output register 146, all respectively.

As soon as the data signals DR and DR* are output from the register 2646, one of the NOR gates 2656 or 2658 in the output control circuit 2651 output a DQ high or DQ low signal DQHI* or DQLOW*, which switches off one of two output transistors 2662 or 2664 in the output driver 2660. For example, if the data signal DR is high, the NOR gate 2658 in response outputs a low value to an inverter 2659 that inverts the output to a high DQLOW* signal, which when inverted by an inverter 2666, provides a low value to the gate of the output driver transistor 2664 (a large N-channel device), turning it off. Soon thereafter, the high DR signal passes through the NAND gate 2652, which also receives a high QED, to output a low value to the NOR gate 2656. The NOR gate 2656 also receives the low DR signal and outputs a high value to the inverter 2659, which provides a low value to a boot circuit 2670. In response thereto, the boot circuit 2670 provides a high value to the gate of the transistor 2662, turning it on, which couples the DQ pad to Vcc, pulling it up. As a result, in response to the high data signal DR, a high value is applied to the DQ pad.

The data output driver circuit 2650 similarly operates with respect to a low DR signal. In response thereto, the NOR gate 2656 provides a high DQHI* signal to the boot circuit 2670, that turns off the transistor 2662 before the NOR gate 2658 provides a low DQLOW* signal to turn on the transistor 1064 to pull the DQ pad to a low value. The boot circuit 2670 can be of typical construction. Alternatively, the boot circuit 2670 can be a boot circuit shown and described in the assignee's copending U.S. application Ser. Nos. 08/494,718 and 08/468,105, filed Jun. 26, 1995 and Jun. 6, 1995, entitled "POWER-UP CIRCUIT RESPONSIVE TO SUPPLY VOLTAGE TRANSIENTS" and "SELF-TIMING POWER-UP CIRCUIT," now U.S. Pat. Nos. 5,557,579 and 5,555,166, all respectively.

Figure 22B:
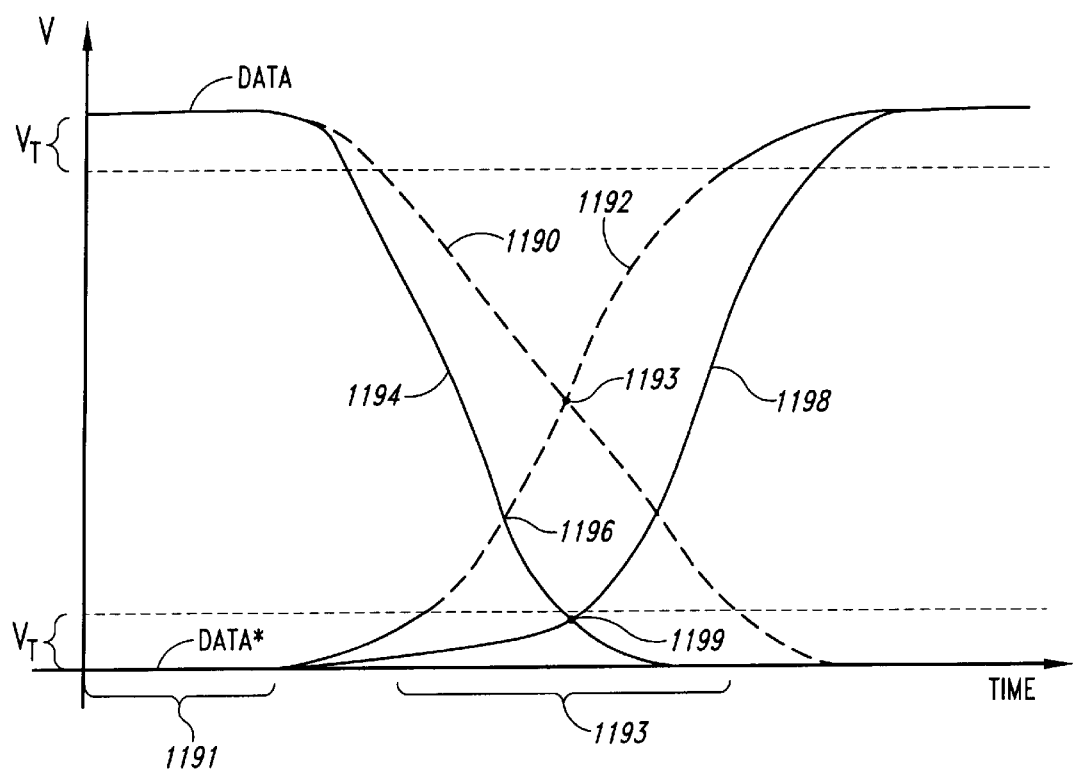
FIG. 22B is a voltage versus time diagram of data lines driven by the data output driver circuitry of FIG. 22A during a write command.

Referring to the voltage diagram of FIG. 22B, during a write operation, a given value applied to the DQ pad must be written to one of the two digit lines in a column over the data lines 148, 148'. As noted above, the voltages on the data lines 148, 148' must be brought to opposite "full rail" voltage values to effectively write the given bit from the DQ pad to the selected column. Prior to writing, the complementary bit lines, and thus the data lines 148, 148' to which they are coupled, have opposite voltage values during an initial interval 1191 (one at Vcc and the other at ground, shown as DATA and DATA*, respectively). Thereafter, when the transistors in output drivers of prior memory devices cause the data line DATA 2690 to fall and the DATA* line 2692 to rise (crossing at a point 1194). However, below the gate voltage drop of the transistors ($V_T$), the transistors, and thus the data lines DATA and DATA*, can be free-floating and possibly be pulled back to their original states (and thus not cross). Such an interval during which the DATA and DATA* lines 2690, 2692 can be free-floating as shown as an interval 2693.

The present invention, however, initially turns off one of the two output transistors 2660, 2662 before activating the appropriate output transistor to pull up or pull down the data line 148, 148' to which the output driver 2660 is coupled. As explained above, if the data signal DR is low, then the transistor 2662 is initially turned off, before the transistor 2664 is turned on. As a result, the data line 148 is more quickly pulled down to a low value, shown as the line 2694 in FIG. 22B. As a result, the data line DATA 2694 crosses the line 2692 at a point 2696 that has a voltage lower than the crossing point 2693. However, the point 2696 is still above the voltage threshold BT, and therefore, the data lines DATA, DATA*.

Therefore, the output control circuit 2651 includes a pair of capacitors 2657 coupled between the output of the NAND gates 2652, 2654, and the inputs of the NOR gates 2656, 2658. The free terminals of the capacitors 2657 are coupled to ground. As a result, the capacitors 2657 store charge output from the NAND gates 2652, 2654, to provide an RC time constant that slows the transitioning of the opposite data line, DATA*, shown as the line 2698 in FIG. 22B. As a result, the DATA and DATA* lines 2694, 2698 cross at a point 2699 that is below the voltage threshold $V_T$. Consequently, the data lines 148, 148' are never in a free-floating operation.

While the output control circuitry 2651 is shown coupled between the boot circuitry 2670 and the output register 2648, the output control circuit can be positioned before such output registers. Additionally, the value of the capacitance, and the number of capacitors, coupled to the output control circuit 2651 can be altered to provide the appropriate RC time constant, and ensure that the data lines 148, 148' are never in a free-floating condition.

Voltage Pump Circuitry

Figures 23A, 23B:
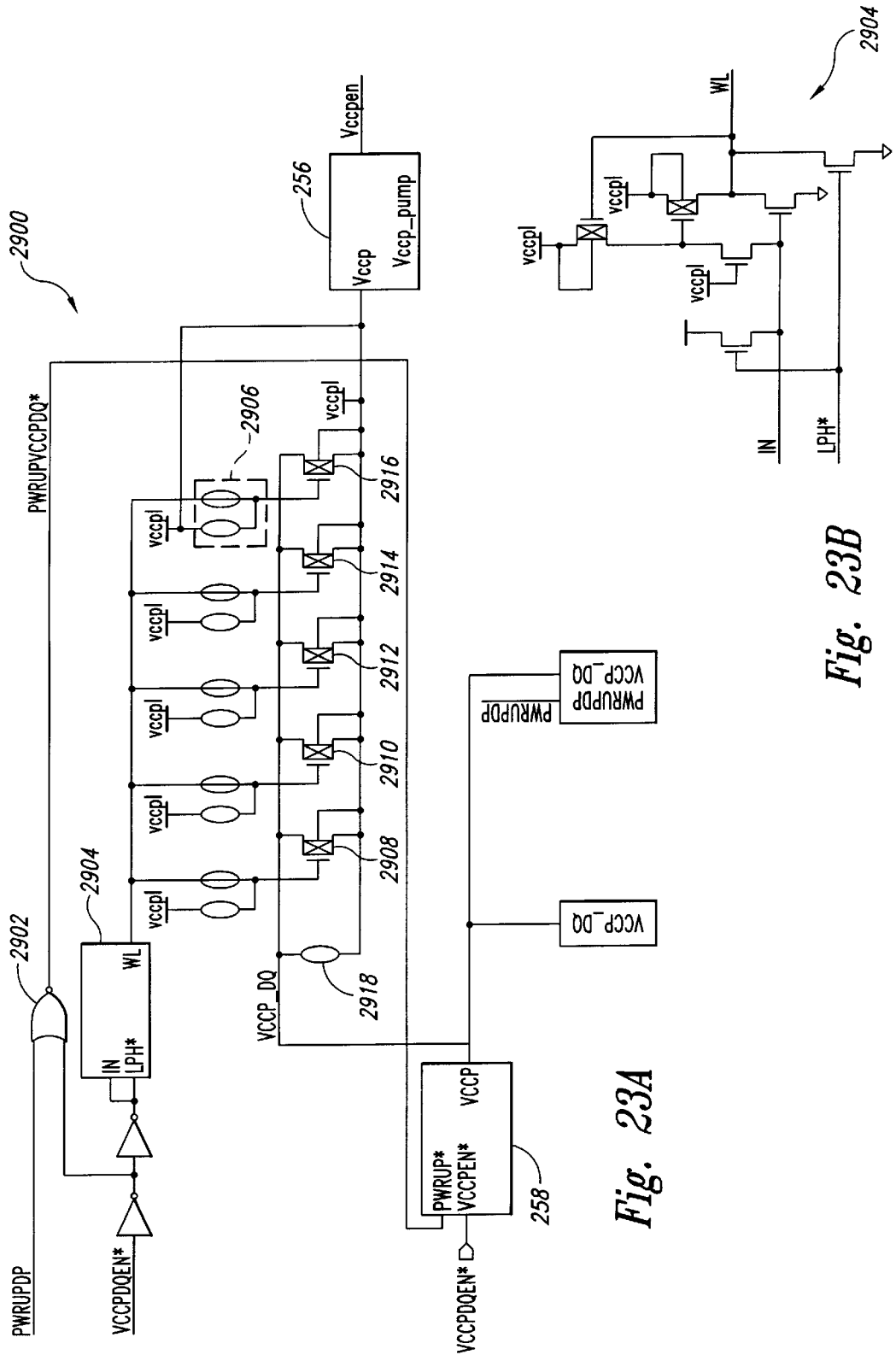
FIG. 23A is a partial schematic, partial block diagram of Vccp voltage pump circuitry for the memory device of FIG. 3.
FIG. 23B is a schematic diagram of an exemplary write line driver for use by the Vccp voltage pump circuitry of FIG. 23A.

Referring to FIG. 23A, an exemplary voltage pump circuitry 2900, which includes the first and second voltage pump circuits 256, 258, is shown. The first and second voltage pumps 256, 258 are of conventional design, and each generate a voltage greater than the Vcc voltage. For example, if Vcc is equal to about 3 volts, then Vccp equals about 4.5 volts. The first voltage pump 256 applies the boosted voltage Vccp to the row lines 239A, 239B in the memory arrays 211A, B through a Vccp bus (not shown) to memory cells along the row lines. As is known, to determine the difference between a stored high voltage value and a stored low voltage value in a memory cell (i.e., between a logical "1" value and a logical "0" value), the sense amplifiers in the I/O circuitry 242A, B typically sense a change in voltage from an equalized level (preferably Vcc/2). To maximize the voltage change, semiconductor memory devices boost the row lines above the supply voltage Vcc to a value of Vccp, to thereby allow a high voltage value equal to Vcc to be written into the memory cells. The second voltage pump 258 is coupled to the data block circuitry, described below, so as to provide a sufficiently high voltage to control the output lines DQ0–DQ31 and to provide a sufficient data output signal.

The first voltage pump 256 receives the power up signal PWRUP at its enable input VCCPEN. Thereafter, an enable signal VCCPDQEN* is generated by the startup circuitry. A NAND gate 2902 receives the power up signal PWRUP and the inverted enable signal VCCPDQEN*. When both of its inputs are high, the NAND gate 2902 provides a low power up VCCPDQ signal PWRUPVCCPDQ* to the power up input of the second voltage pump 258 to power up this pump. As a result, the first voltage pump 256 is initially enabled during power up of the memory device 200, and thereafter, the second voltage pump 258 is enabled, so that less current is drawn by the memory device 200. Otherwise, if both the first and second voltage pumps 256, 258 were simultaneously enabled, they would draw twice the current.

A write line driver 2904 provides a boosted high output through a series of five switches 2906 to disable PMOS transistors 2908, 2929, 2912, 2914. The write line driver boots the gates of the PMOS transistors to Vcc to turn them off. Any of known conventional write line drivers can be employed herein, such as an exemplary write line driver shown in FIG. 23B. The detailed description of the driver circuit of 23B is not described in detail herein, but its operation can be readily understood by one skilled in the art based on the circuitry shown in FIG. 23B.

The sources of the transistors 2908–2914 are coupled to the VCCP output terminal of the second voltage pump 258, while the drains of the transistors are coupled to the VCCP output terminal of the first voltage pump 256. Each of the transistors 2908–2914 have their drains coupled to the substrate. The write line driver 2904 must provide a boosted high voltage to the gates of the PMOS transistors 2908–2914 so as to hold these transistors off (since they are coupled to the VCCP voltage).

The switches 2906 are preferably metal options that can be selectively enabled during manufacture of the memory device 200, however, other switches could be employed, such as transistors. In their off position, the switches 2906 are coupled to a high voltage value, such as the VCCP signal from the first voltage pump 256, so that the transistor to which they are coupled, 2908–2914, is switched off. As shown in FIG. 23A, only the left-handmost switch 2906 is enabled so that when a low VCCPDQEN* signal is received, the write line driver 2904 applies a low voltage to the gate of the first transistor 2908, thereby intercoupling the first and second voltage pumps 256, 258 through the transistor. As a result, if the second voltage pump 258 is unable to provide sufficiently high boosted voltage VCCP to all of the DQ pads, then the first voltage pump 256, through the transistor 2908, can provide supplementary power. Likewise, if the first voltage pump 256 has pumped up a larger number of row lines than usual, the second voltage pump 258 can, through the transistor 2908, provide supplementary power thereto.

In general, the first and second voltage pump 256, 258 need only supply such a boosted voltage to the 32 output lines or several row lines simultaneously under normal operation. Under a testing mode of operation, where Vcc is equal to a maximum tolerant voltage, e.g., 5 volts, then the first voltage pump circuit 256 allows the memory circuit 112 to write a full 5 volts to memory cells. The first voltage boosting circuit 256, however, has the capacity to provide a boosted voltage Vccp to only several row lines simultaneously in the memory device 200. By providing two such voltage pump circuits 256, 258, twice as much current can be provided to over half of the row lines in at least one of the Banks 0 and 1. Test mode circuitry (not shown) formed on the die 102 and coupled to the memory device 200 and the voltage boosting circuits 256, 258 can allow the memory circuit to be tested under several test routines when a predetermined series of steps are initially performed.

Each of the transistors 2908–2914 preferably has a different channel width so that each can pass a different amount of current. As shown in FIG. 23A, the leftmost transistor 2908 has a channel width of 500 microns, while the transistors 2929, 2912, 2914, 2916 have channel widths of 400, 200, 100, 50, respectively. By selectively switching a combination of the transistors 2908–2916 by means of the switches 2906, a variable total channel width between the first and second VCC pumps 256, 258 can be created. For example, if a first voltage pump 256 frequently oscillates above and below the VCCP threshold, so that the second voltage pump 258 frequently supplies power thereto, the channel width can be restricted, so that oscillations of the first voltage pump do not affect the second pump. Alternatively, if a large amount of power is desired to be exchanged between the first and second voltage pumps 256, 258, then all of the switches 2906 can be enabled so that all of the transistors 2906–2918 intercouple the voltage pumps 256, 258.

In an alternate embodiment, a voltage monitoring circuit can be employed between the first and second voltage pumps 256, 258, where the voltage monitoring circuit (not shown) monitors the voltage applied to the row lines and/or the DQ paths. If the row lines and/or DQ paths drop below a given threshold (e.g., about VCCP), then the voltage monitoring circuit can activate or enable one or more of the gates of the transistors 2908–2916 to allow power from one pump to be provided to the other.

A switch 2918 can be positioned between the VCCP terminals of the first and second voltage pumps 256, 258 to permanently couple the pumps together. The switch 2918 is preferably a metal option, rather than a transistor, so as to avoid any threshold voltage loss that can occur in the transistors 2908–2916. As a result, the switch 2918 provides no voltage drops occur over itself.

Since the memory device 200 provides improved benefits from prior memory devices, applications employing the present memory device similarly benefit from the present invention. For example, referring to FIG. 24, a block diagram of a computer system 2930 that uses one or more memory devices 200 is shown. The computer system 2930 includes a processor 2932 for performing computer functions, such as executing software to perform desired calculations and tasks. The processor 2932 is connected to one or more of the memory devices 10 through a memory controller 2934 that provides the appropriate signals to the memory.

One or more input devices 2936, such as a keypad or a mouse, are coupled to the processor 2932 and allow an operator (not shown) to input data thereto. One or more output devices 2938 are coupled to the processor 2932 to provide the operator with data generated by the processor. Examples of output devices 2938 include a printer and a video display unit. One or more data storage devices 2940 are coupled to the processor 2932 to store data on or retrieve data from external storage media (not shown). Examples of storage devices 2940 and corresponding storage media include drives for hard and floppy disks, tape cassettes, and compact disk read-only memories (CD-ROMs). Typically, the processor 2940 generates the input clock signal CLK and the address signals A0–A8, control signals such as CAS, RAS, WE, etc., and the data DQ0–DQ31 that is written to the memory device 10, as shown by the address, data, control, and status buses, shown in FIG. 24.

Although specific embodiments of, and examples for, the present invention have been described for purposes of illustration, various modifications can be made without departing from the spirit and scope of the invention, as is known by those skilled in the relevant art. For example, while the memory device 200 is generally described above as being directed to a SGRAM device, the principles of the present invention can be readily adapted for use with other memory devices, such as synchronous DRAM devices. All U.S. patents and applications cited above are incorporated herein by reference as if set forth in their entirety. The teachings of the U.S. patents and applications can be modified and employed by aspects of the present invention, based on the detailed description provided herein, as will be recognizable to those skilled in the relevant art. These and other changes can be made to the invention in light of the above detailed description. Accordingly, the invention is not limited by the disclosure, but instead its scope is to be determined entirely by reference to the following claims.

In general, unless specifically set forth to the contrary herein, the terms in the claims should not be construed to limit the invention to the specific embodiments disclosed in the specification and claims, but instead should be construed to include all systems and methods for use in memory devices, logic devices, and other electrical circuits under the teachings disclosed herein. Terms such as "memory cell," "memory array," or "memory bank" should generally be construed to include any device or method of storing information.

What is claimed is:

1. In a memory device storing data in an array of rows and columns, the array including a plurality of I/O lines selectively coupled to either respective sense amps responsive to a global column signal or to a respective data write driver responsive to an I/O select signal, a method of biasing the I/O lines before the I/O lines are coupled to either the sense amps or the data write drivers, the method comprising:

prior to accessing the memory array, determining whether the access with be a read access or a write access;

if the access is determined to be a read access, biasing at least some of the I/O lines to a bias voltage for a first period of time; and if the access is determined to be a write access, biasing at least some of the I/O lines to a bias voltage for a second period of time that is shorter than the first period of time.

2. The memory device of claim 1 wherein the access to the memory array is to a selected column of the array, and wherein the step of biasing at least some of the I/O lines comprises biasing the I/O lines prior to connecting the I/O lines to the selected column.

3. A memory device, comprising:

an array of memory cells having a plurality of memory cells arranged in rows and columns, a plurality of sense amps selectively outputting data on a respective digit line for each column, a data path circuit coupled to a respective data bus line, each of the data path circuits including a data write driver adapted to receive data from its respective data bus line, and a plurality of I/O lines selectively coupled to either a respective digit line responsive to a global column signal or to a respective data write driver circuit responsive to an I/O select signal;

a row decoder receiving a row address, the row decoder selectively enabling a row of memory cells in the array corresponding to the row address;

a column decoder receiving a column address, the column decoder selectively enabling a column of memory cells in the array corresponding to the column address;

a controller circuit generating a plurality of control signals including the global column signals when data is to be transferred from respective digit lines to an I/O line, and an I/O select signal when data is to be transferred from respective data write driver to an I/O line; and an I/O pull-up circuit coupled to each of the I/O lines, the I/O pull-up circuit receiving read and write control signals, the I/O pull-up circuit applying a bias voltage to the I/O line prior to coupling the I/O line to one of the sense amps responsive to a global column signal or to one of the data write drivers responsive to an I/O select signal, the I/O pull-up circuit applying the bias voltage to the I/O line for a first period responsive to the read control signal and for a second period responsive to the write control signal, the first period being longer than the second period.

4. The memory device of claim 3 wherein said pull-up circuit comprises:

a first delay circuit adapted to generate a first delayed signal responsive to a clock signal, the first delay circuit generating the first delayed signal at the expiration of the first period after the clock signal;

a second delay circuit adapted to generate a second delayed signal responsive to a clock signal, the second delay circuit generating the second delayed signal at the expiration of the second period after the clock signal;

a logic circuit having at least two inputs one of which is coupled to the clock signal, the logic circuit having an output causing the I/O pull-up circuit to apply the bias voltage to the I/O line;

a multiplexer receiving the write and read signals, the multiplexer being coupled between the first and second delay circuits and the logic circuit to apply the first delayed signal to the other input of the logic circuit responsive to the read signal and to apply the second delayed signal to the other input of the logic circuit responsive to the write signal.

5. In a semiconductor memory device having an array of memory cells having multiple row and column lines and a plurality of output terminals, the row lines being coupled to the output terminals, the memory device capable of being coupled to receive a power supply signal, a power source comprising:

first and second power pump circuits coupled to receive the power supply signal and provide a power supply boosted above the power supply signal, the first power pump circuit being coupled to the multiple row lines and configured to provide the boosted power thereto, and the second power pump circuit being coupled to the plurality of output terminals and configured to provide the boosted power thereto; and an intercoupling circuit coupled to the power monitoring circuit and between the first and second power pump circuits, the intercoupling circuit permitting the boosted power provided by one of the first and second to be provided to the other of the first and second power pump circuits.

6. The power source of claim 5 wherein the first and second power pump circuits are voltage pump circuits, and wherein the intercoupling circuit is a transistor having first and second terminals coupled to the first and second voltage pump circuits, respectively, and having a control terminal coupled to receive a decoupling signal to decouple the first and second voltage pump circuits.

7. The power source of claim 5, further comprising:

a power monitoring circuit coupled to at least one of the row lines and output terminals to monitor the boosted power supplied thereto, and output a monitor signal if the boosted power supplied thereto falls below a predetermined value; and wherein the intercoupling circuit permits the boosted power provided by one of the first and second to be provided to the other of the first and second power pump circuits in response to the monitor signal.

8. The power source of claim 5 wherein the intercoupling circuit includes a plurality of switch elements and a plurality of transistors each having a control terminal coupled to receive an enable signal and having first and second terminals coupled to the first and second voltage pump circuits, wherein each transistor has a different maximum power throughput value, and wherein each of the plurality of switch elements are coupled between a one of the plurality of transistors and the power monitoring circuit to selectively permit each transistor to be coupled to the power monitoring circuit.

9. The power source of claim 5 wherein at least one of the first and second power pump circuits includes a disable terminal configured to disable the one first and second power pump circuit in response to a preselected signal provided thereto, the other of the first and second power pump circuits providing the boosted power to both the row lines and output terminals through the intercoupling circuit in response thereto.

10. The power source of claim 5 wherein the first and second power pump circuits are voltage pump circuits, and wherein the intercoupling circuit is a switch element capable of selectively coupling the first voltage pump circuit to the second voltage pump circuit.

11. The power source of claim 5 wherein the intercoupling circuit is a switch element capable of selectively coupling the first voltage pump circuit to the second voltage pump circuit, wherein at least one of the first and second power pump circuits includes a disable terminal configured to disable the one first and second power pump circuit in response to a preselected signal provided thereto, the other of the first and second power pump circuits providing the boosted power to both the row lines and output terminals through the switch element in response thereto.

* * * * *

UNITED STATES PATENT AND TRADEMARK OFFICE
CERTIFICATE OF CORRECTION

PATENT NO. : 6,215,709 B1  Page 1 of 1
DATED : April 10, 2001
INVENTOR(S) : Jeffrey P. Wright and Hua Zheng It is certified that error appears in the above-identified patent and that said Letters Patent is hereby corrected as shown below:

<u>Title page,</u>
Under References Cited, U.S. PATENT DOCUMENTS, please add the following reference:

-- 6,002,621   12/1999   Tanaka   365/200 --

Signed and Sealed this

Fourteenth Day of May, 2002

Attest:

Attesting Officer

JAMES E. ROGAN
Director of the United States Patent and Trademark Office